(12) United States Patent
Dokania et al.

(10) Patent No.: US 12,300,297 B1
(45) Date of Patent: May 13, 2025

(54) MEMORY ARRAY WITH BURIED OR BACKSIDE WORD-LINE

(71) Applicant: Kepler Computing Inc., San Francisco, CA (US)

(72) Inventors: Rajeev Kumar Dokania, Beaverton, OR (US); Mustansir Yunus Mukadam, Seattle, WA (US); Noriyuki Sato, Hillsboro, OR (US); Tanay Gosavi, Portland, OR (US); Niloy Mukherjee, San Ramon, CA (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 132 days.

(21) Appl. No.: 17/817,937

(22) Filed: Aug. 5, 2022

(51) Int. Cl.
*G11C 11/22* (2006.01)

(52) U.S. Cl.
CPC ........ *G11C 11/2255* (2013.01); *G11C 11/221* (2013.01); *G11C 11/2257* (2013.01)

(58) Field of Classification Search
CPC .............. G11C 11/2255; G11C 11/221; G11C 11/2257
See application file for complete search history.

(56) References Cited

U.S. PATENT DOCUMENTS

| | | | |
|---|---|---|---|
| 5,086,412 A | 2/1992 | Jaffe et al. | |
| 5,307,304 A | 4/1994 | Saito et al. | |
| 5,383,150 A | 1/1995 | Nakamura et al. | |
| 5,539,279 A | 7/1996 | Takeuchi et al. | |
| 5,739,563 A | 4/1998 | Kawakubo et al. | |
| 6,002,608 A | 12/1999 | Tanabe | |
| 6,043,526 A | 3/2000 | Ochiai | |
| 6,274,388 B1 | 8/2001 | Aggarwal et al. | |
| 6,346,741 B1 | 2/2002 | Buskirk et al. | |
| 6,368,910 B1 | 4/2002 | Sheu et al. | |

(Continued)

FOREIGN PATENT DOCUMENTS

| | | | |
|---|---|---|---|
| JP | H0982907 A | 3/1997 | |
| JP | H10242426 A | 9/1998 | |

(Continued)

OTHER PUBLICATIONS

Advisory Action notified Jul. 25, 2022 for U.S. Appl. No. 17/339,850.

(Continued)

*Primary Examiner* — Han Yang
(74) *Attorney, Agent, or Firm* — MUGHAL GAUDRY & FRANKLIN PC

(57) ABSTRACT

A memory is described having a plurality of bit-cells organized in a row or column. An individual bit-cell of the plurality of bit-cells includes an access transistor and a plurality of capacitors. A word-line is positioned under the access transistor, wherein the access transistor is controllable by the word-line, whereas the plurality of capacitors is positioned above the access transistor. The individual bit-cell has an individual boundary which substantially abuts a neighboring bit-cell in the row or column such that there is no dummy bit-cell between individual bit-cell and the neighboring bit-cell.

21 Claims, 30 Drawing Sheets

(56) References Cited

U.S. PATENT DOCUMENTS

| | | |
|---|---|---|
| 6,388,281 B1 | 5/2002 | Jung et al. |
| 6,448,911 B1 | 9/2002 | Somayajula |
| 6,500,678 B1 | 12/2002 | Aggarwal et al. |
| 6,587,367 B1 | 7/2003 | Nishimura et al. |
| 6,635,497 B2 | 10/2003 | Aggarwal et al. |
| 6,643,163 B2 | 11/2003 | Takashima |
| 6,656,301 B2 | 12/2003 | Kirby |
| 6,656,748 B2 | 12/2003 | Hall et al. |
| 6,713,342 B2 | 3/2004 | Celii et al. |
| 6,717,838 B2 | 4/2004 | Hosoi |
| 6,720,600 B2 | 4/2004 | Okita |
| 6,728,128 B2 | 4/2004 | Nishimura et al. |
| 6,798,686 B2 | 9/2004 | Takashima |
| 6,873,536 B2 | 3/2005 | Komatsuzaki |
| 6,906,944 B2 | 6/2005 | Takeuchi et al. |
| 7,029,925 B2 | 4/2006 | Celii et al. |
| 7,075,134 B2 | 7/2006 | Araujo et al. |
| 7,169,621 B2 | 1/2007 | Hasegawa et al. |
| 7,173,844 B2 | 2/2007 | Lee et al. |
| 7,405,959 B2 | 7/2008 | Koide et al. |
| 7,426,130 B2 | 9/2008 | Jeon |
| 7,791,922 B2 | 9/2010 | Doumae et al. |
| 8,300,446 B2 | 10/2012 | Qidwai |
| 8,441,833 B2 | 5/2013 | Summerfelt et al. |
| 8,665,628 B2 | 3/2014 | Kawashima |
| 8,865,628 B2 | 10/2014 | Manabe et al. |
| 9,472,560 B2 | 10/2016 | Ramaswamy et al. |
| 9,620,206 B2 | 4/2017 | Nazarian et al. |
| 9,786,348 B1 | 10/2017 | Kawamura et al. |
| 9,812,204 B1 | 11/2017 | Yan et al. |
| 9,899,085 B1 | 2/2018 | Yan |
| 10,847,201 B2 | 11/2020 | Manipatruni et al. |
| 10,998,025 B2 | 5/2021 | Manipatruni et al. |
| 11,107,516 B1 | 8/2021 | Rabkin et al. |
| 11,335,391 B1 | 5/2022 | Ocker et al. |
| 11,482,270 B1 | 10/2022 | Dokania et al. |
| 2002/0079520 A1 | 6/2002 | Nishihara et al. |
| 2002/0125517 A1 | 9/2002 | Nakamura |
| 2002/0153550 A1 | 10/2002 | An et al. |
| 2003/0012984 A1 | 1/2003 | Ueda |
| 2003/0129847 A1 | 7/2003 | Celii et al. |
| 2003/0137866 A1 | 7/2003 | Nishihara |
| 2003/0141528 A1 | 7/2003 | Ito |
| 2003/0174553 A1 | 9/2003 | Saito et al. |
| 2003/0119211 A1 | 10/2003 | Summerfelt et al. |
| 2004/0027873 A1 | 2/2004 | Nishihara |
| 2004/0047219 A1* | 3/2004 | Ito .................. H10B 53/30 |
| | | 257/E21.664 |
| 2004/0089854 A1 | 5/2004 | Chen et al. |
| 2004/0104754 A1 | 6/2004 | Bruchhaus et al. |
| 2004/0129961 A1 | 7/2004 | Araujo et al. |
| 2004/0233696 A1 | 11/2004 | Kang |
| 2004/0245547 A1 | 12/2004 | Stipe |
| 2005/0012126 A1 | 1/2005 | Udayakumar et al. |
| 2005/0214954 A1 | 9/2005 | Maruyama et al. |
| 2005/0230725 A1 | 10/2005 | Aggarwal et al. |
| 2005/0244988 A1 | 11/2005 | Wang et al. |
| 2006/0001070 A1 | 1/2006 | Park et al. |
| 2006/0002170 A1 | 1/2006 | Kumura et al. |
| 2006/0006447 A1 | 1/2006 | Kim et al. |
| 2006/0073613 A1 | 4/2006 | Aggarwal et al. |
| 2006/0073614 A1 | 4/2006 | Hara |
| 2006/0134808 A1 | 6/2006 | Summerfelt et al. |
| 2006/0138507 A1 | 6/2006 | Kijima et al. |
| 2006/0258113 A1 | 11/2006 | Sandhu et al. |
| 2007/0275484 A1 | 11/2007 | Mitsui |
| 2007/0298521 A1 | 12/2007 | Obeng et al. |
| 2008/0025063 A1 | 1/2008 | Kang |
| 2008/0073680 A1 | 3/2008 | Wang |
| 2008/0081380 A1 | 4/2008 | Celii et al. |
| 2008/0101107 A1 | 5/2008 | Shiga et al. |
| 2008/0107885 A1 | 5/2008 | Alpay et al. |
| 2008/0191252 A1 | 8/2008 | Nakamura et al. |
| 2009/0003042 A1 | 1/2009 | Lee et al. |
| 2009/0251950 A1 | 10/2009 | Klostermann |
| 2012/0127776 A1 | 5/2012 | Kawashima |
| 2012/0134196 A1 | 5/2012 | Evans, Jr. et al. |
| 2012/0313218 A1 | 12/2012 | Fujimori et al. |
| 2014/0063924 A1 | 3/2014 | Nakai et al. |
| 2014/0208041 A1 | 7/2014 | Hyde et al. |
| 2014/0247642 A1 | 9/2014 | Madhan et al. |
| 2015/0069481 A1 | 3/2015 | Sun et al. |
| 2015/0069555 A1* | 3/2015 | Sakai ................ G11C 13/0033 |
| | | 257/421 |
| 2015/0294702 A1 | 10/2015 | Lee et al. |
| 2016/0071905 A1* | 3/2016 | Park .................... G06F 12/0802 |
| | | 711/104 |
| 2017/0069735 A1 | 3/2017 | Oh et al. |
| 2017/0277459 A1 | 9/2017 | Rodriguez et al. |
| 2018/0166453 A1 | 6/2018 | Müller |
| 2018/0226418 A1 | 8/2018 | Morandi et al. |
| 2018/0286987 A1 | 10/2018 | Lee et al. |
| 2018/0323309 A1 | 11/2018 | Ando et al. |
| 2018/0331113 A1 | 11/2018 | Liao et al. |
| 2019/0051642 A1 | 2/2019 | Hyde et al. |
| 2019/0051815 A1 | 2/2019 | Kakinuma et al. |
| 2019/0115353 A1 | 4/2019 | O'Brien et al. |
| 2019/0138893 A1 | 5/2019 | Sharma et al. |
| 2020/0004583 A1 | 1/2020 | Kelly et al. |
| 2020/0051607 A1 | 2/2020 | Pan et al. |
| 2020/0273865 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0357453 A1 | 11/2020 | Slesazeck et al. |
| 2021/0090662 A1 | 3/2021 | Mennenga et al. |
| 2021/0111179 A1 | 4/2021 | Shivaraman et al. |
| 2021/0142837 A1 | 5/2021 | Yu et al. |
| 2021/0193209 A1 | 6/2021 | Swami et al. |
| 2021/0202507 A1 | 7/2021 | Thareja et al. |
| 2021/0398580 A1 | 12/2021 | Yuh |
| 2022/0069131 A1 | 3/2022 | Pesic |
| 2023/0232609 A1* | 7/2023 | Hsu ....................... H10B 12/053 |
| | | 438/589 |

FOREIGN PATENT DOCUMENTS

| | | |
|---|---|---|
| JP | H10255484 A | 9/1998 |
| JP | H1174488 A | 3/1999 |
| JP | 2000174224 A | 6/2000 |
| JP | 2001237393 A | 8/2001 |
| JP | 2002026256 A | 1/2002 |
| JP | 2002158339 A | 5/2002 |
| JP | 2003123465 A | 4/2003 |
| JP | 2005057103 A | 3/2005 |
| JP | 2005142322 A | 6/2005 |
| JP | 2005322925 A | 11/2005 |
| JP | 2008210955 A | 9/2008 |
| JP | 2010021544 A | 1/2010 |
| JP | 2011151370 A | 8/2011 |
| JP | 2017518632 A | 7/2017 |
| KR | 100481867 B1 | 4/2005 |
| KR | 20050105695 A | 11/2005 |
| KR | 100895740 B1 | 4/2009 |
| TW | 200718237 A | 5/2007 |
| TW | 200935151 A | 8/2009 |
| TW | 201725736 A | 7/2017 |
| WO | 20130147295 | 10/2013 |
| WO | 2015167887 A1 | 11/2015 |
| WO | 2018125024 A1 | 7/2018 |
| WO | 2021112247 A1 | 6/2021 |

OTHER PUBLICATIONS

Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.
Final Office Action notified Apr. 25, 2022 for U.S. Appl. No. 16/287,953.

(56) References Cited

OTHER PUBLICATIONS

Final Office Action notified Jun. 13, 2022 for U.S. Appl. No. 17/339,850.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Gupta et al., "Buried Power Rail Integration with Si FinFETs for CMOS Scaling beyond the 5 nm Node," 2020 IEEE Symposium on VLSI Technology, Jun. 16-19, 2020, Honolulu, HI, US. 2 pages. DOI: 10.1109/VLSITechnology18217.2020.9265113.
Gupta et al., "Buried Power Rail Scaling and Metal Assessment for the 3 nm Node and Beyond," 2020 IEEE International Electron Devices Meeting (IEDM), Dec. 12-18, 2020, San Francisco, CA, US. 4 pages. DOI: 10.1109/IEDM13553.2020.9371970.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme, International Electron Devices Meeting 1999. Technical Digest (Cat. No.99CH36318), Washington, DC, USA, 1999, pp. 279-282.", International Electron Devices Meeting 1999. Technical Digest (Cat. No.99CH36318), Washington, DC, USA, 1999, pp. 279-282.
Mathur et al., "Buried Bitline for sub-5nm SRAM Design," 2020 IEEE International Electron Devices Meeting (IEDM), San Francisco, CA, US. 4 pages. DOI: 10.1109/IEDM13553.2020.9372042.
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Dec. 20, 2021 for U.S. Appl. No. 16/288,004.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jun. 13, 2022 for U.S. Appl. No. 17/346,083.
Non-Final Office Action notified Jun. 15, 2022 for U.S. Appl. No. 17/367,101.
Non-Final Office Action notified Jun. 26, 2020 for U.S. Appl. No. 16/287,876.
Non-Final Office Action notified Jun. 27, 2022 for U.S. Appl. No. 17/315,143.
Non-Final Office Action notified Mar. 7, 2022 for U.S. Appl. No. 17/339,850.
Non-Final Office Action notified Mar. 30, 2022 for U.S. Appl. No. 17/346,083.
Non-Final Office Action notified Mar. 31, 2022 for U.S. Appl. No. 17/346,087.
Notice of Allowance notified Apr. 20, 2022 for U.S. Appl. No. 17/359,311.
Notice of Allowance notified Jan. 12, 2021 for U.S. Appl. No. 16/287,876.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Jun. 15, 2022 for U.S. Appl. No. 17/367,083.
Notice of Allowance notified Jun. 23, 2022 for U.S. Appl. No. 17/367,172.
Notice of Allowance notified Jun. 23, 2022 for U.S. Appl. No. 17/367,210.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement notified Apr. 15, 2022 for U.S. Appl. No. 17/315,111.
Restriction Requirement notified Apr. 15, 2022 for U.S. Appl. No. 17/315,139.
Restriction Requirement notified Mar. 23, 2022 for U.S. Appl. No. 17/315,143.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Ryckaert et al., "Extending the Roadmap Beyond 3nm Through System Scaling Boosters: A Case Study on Buried Power Rail and Backside Power Delivery," 2019 Electron Devices Technology and Manufacturing Conferences (EDTM), IEEE. pp. 50-52 (3 pages).
Salahuddin et al., "Buried Power SRAM DTCO and System-Level Benchmarking in N3," 2020 Symposium on VLSI Technology Digest of Technical Papers—JFS3.3 IEEE. 2 pages.
Decision of Rejection notified Feb. 1, 2024 for Taiwan Patent Application No. 111150380.
Examination Report notified Jun. 21, 2023 for German Patent Application No. 112020000955.6.
Final Office Action notified Aug. 15, 2022 for U.S. Appl. No. 17/346,083.
Final Office Action notified Feb. 5, 2024 for U.S. Appl. No. 17/654,564.
Final Office Action notified Feb. 5, 2024 for U.S. Appl. No. 17/654,905.
Final Office Action notified Sep. 12, 2022 for U.S. Appl. No. 17/367,217.
First Office Action notified Jul. 5, 2023 for Taiwan Patent Application No. 111150380.
Non-Final Office Action notified Aug. 16, 2022 for U.S. Appl. No. 17/367,217.
Non-Final Office Action notified Dec. 28, 2023 for U.S. Appl. No. 17/805,665.
Non-Final Office Action notified Dec. 29, 2023 for U.S. Appl. No. 17/805,664.
Non-Final Office Action notified Feb. 12, 2024 for U.S. Appl. No. 17/805,438.
Non-Final Office Action notified Jan. 2, 2024 for U.S. Appl. No. 17/653,811.
Non-Final Office Action notified May 9, 2023 for U.S. Appl. No. 18/061,270.
Non-Final Office Action notified May 16, 2023 for U.S. Appl. No. 17/532,647.
Non-Final Office Action notified Nov. 4, 2022 for U.S. Appl. No. 17/530,362.
Non-Final Office Action notified Nov. 21, 2022 for U.S. Patent Application No. 7/532,657.
Non-Final Office Action notified Nov. 28, 2022 for U.S. Appl. No. 17/532,552.
Non-Final Office Action notified Oct. 4, 2023 for U.S. Appl. No. 17/654,905.

(56) References Cited

OTHER PUBLICATIONS

Non-Final Office Action notified Oct. 12, 2022 for U.S. Appl. No. 17/530,365.
Non-Final Office Action notified Oct. 12, 2023 for U.S. Appl. No. 17/654,564.
Non-Final Office Action notified Oct. 26, 2022 for U.S. Appl. No. 17/531,577.
Non-Final Office Action notified Oct. 31, 2023 for U.S. Appl. No. 17/654,764.
Non-Final Office Action notified Sep. 1, 2022 for U.S. Appl. No. 17/339,850.
Non-Final Office Action notified Sep. 2, 2022 for U.S. Appl. No. 17/315,139.
Non-Final Office Action notified Sep. 7, 2022 for U.S. Appl. No. 17/530,360.
Non-Final Office Action notified Sep. 14, 2023 for U.S. Appl. No. 17/654,379.
Non-Final Office Action notified Sep. 15, 2022 for U.S. Appl. No. 17/315,111.
Notice of Allowance notified Apr. 4, 2023 for U.S. Appl. No. 17/532,552.
Notice of Allowance notified Apr. 28, 2023 for U.S. Appl. No. 17/315,139.
Notice of Allowance notified Aug. 8, 2022 for U.S. Appl. No. 17/529,258.
Notice of Allowance notified Aug. 17, 2022 for U.S. Appl. No. 17/346,087.
Notice of Allowance notified Aug. 22, 2022 for U.S. Patent Application No. 7/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jan. 5, 2024 for Korean Patent Application No. 10-2021-7027261.
Notice of Allowance notified Jan. 18, 2024 for U.S. Appl. No. 17/654,383.
Notice of Allowance notified Jan. 20, 2023 for U.S. Appl. No. 17/532,657.
Notice of Allowance notified Jan. 23, 2023 for U.S. Appl. No. 17/315,111.
Notice of Allowance notified Jan. 30, 2023 for U.S. Appl. No. 17/531,535.
Notice of Allowance notified Jul. 3, 2023 for U.S. Appl. No. 17/532,647.
Notice of Allowance notified Jun. 16, 2023 for U.S. Appl. No. 17/532,652.
Notice of Allowance notified Jun. 26, 2023 for U.S. Appl. No. 18/061,270.
Notice of Allowance notified Mar. 13, 2023 for U.S. Appl. No. 17/516,577.
Notice of Allowance notified Mar. 15, 2023 for U.S. Appl. No. 17/516,293.
Notice of Allowance notified Mar. 17, 2023 for U.S. Appl. No. 17/532,545.
Notice of Allowance notified May 2, 2023 for U.S. Appl. No. 17/532,556.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Nov. 27, 2023 for U.S. Appl. No. 17/654,802.
Notice of Allowance notified Nov. 29, 2023 for U.S. Appl. No. 17/654,908.
Notice of Allowance notified Oct. 20, 2022 for Taiwan Patent Application No. 110129115.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Notice of Preliminary Rejection notified Jul. 18, 2023 for Korean Patent Application No. 10-2021-7027261.
Notice of Preliminary Rejection notified Oct. 28, 2022 for Korean Patent Application No. 10-2021-7027303.
Notice of Reasons for Rejection notified Dec. 6, 2022 for Japanese Patent Application no. 2021-546823.
Notice of Reasons for Rejection notified Jun. 20, 2023 for Japanese Patent Application No. 2021-546823.
Notice of Reasons for Rejection notified Nov. 22, 2022 for Japanese Patent Application No. 2021-546864.
Office Action notified May 16, 2023 for Japanese Patent Application No. 2021-546864.
Official Communication notified Jun. 22, 2023 for German Patent Application No. 112020000956.4.
Restriction Requirement notified Aug. 5, 2022 for U.S. Appl. No. 17/359,325.
Restriction Requirement notified Aug. 26, 2022 for U.S. Appl. No. 17/390,796.
Salahuddin et al., "SRAM with Buried Power Distribution to Improve Write Margin and Performance in Advanced Technology Nodes," IEEE Electron Device Letters, vol. 40, Issue: 8, Aug. 2019. 4 pages. DOI: 10.1109/LED.2019.2921209.
Second Office Action notified Jul. 26, 2022 for Taiwan Patent Application No. 110129115.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Yeh et al. "Fabrication and Investigation of Three-Dimensional Ferroelectric Capacitors for the Application of FeRAM," AIP Advances 6, 035128 (2016); https://doi.org/10.1063/1.4945405, Published Online: Mar. 30, 2016, 13 pages.

* cited by examiner

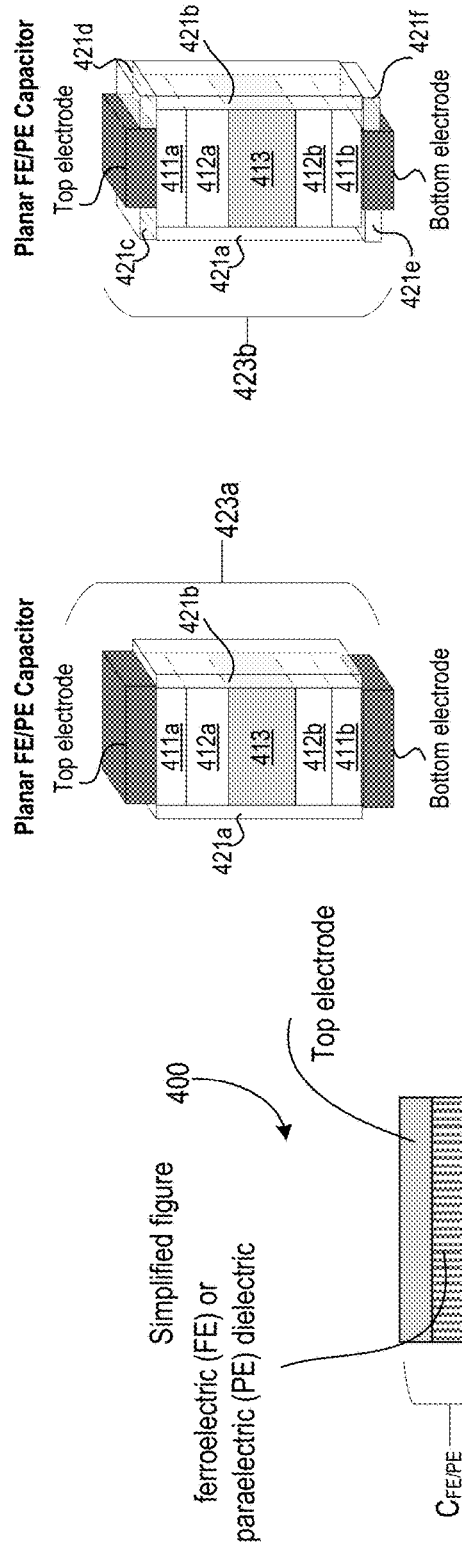
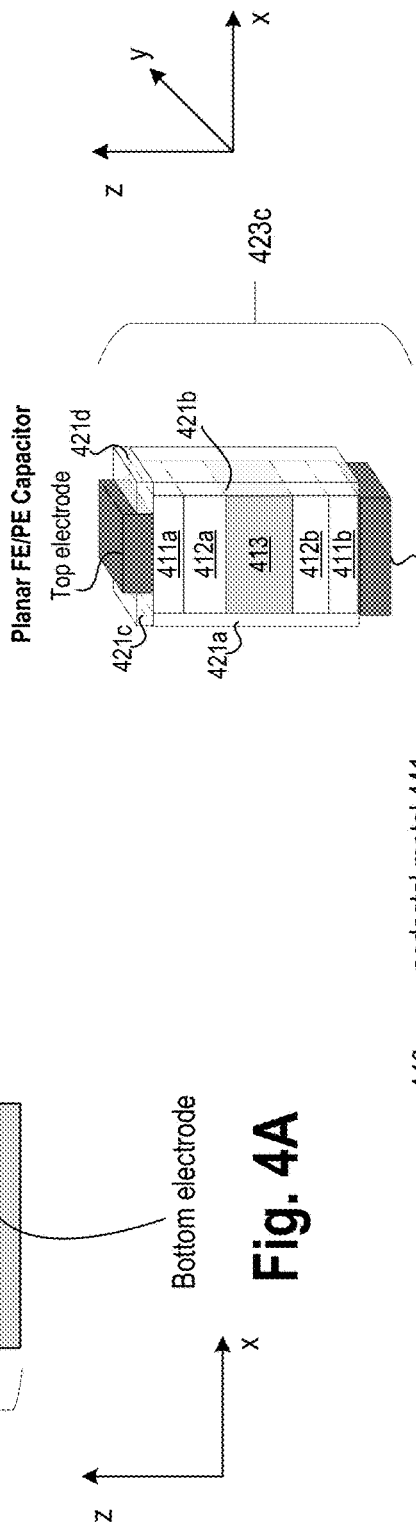
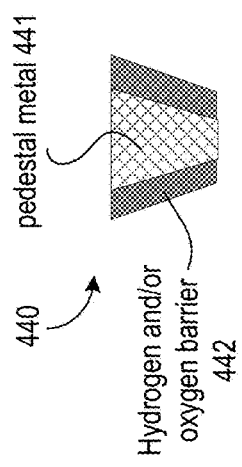
Fig. 4A
Fig. 4B
Fig. 4C

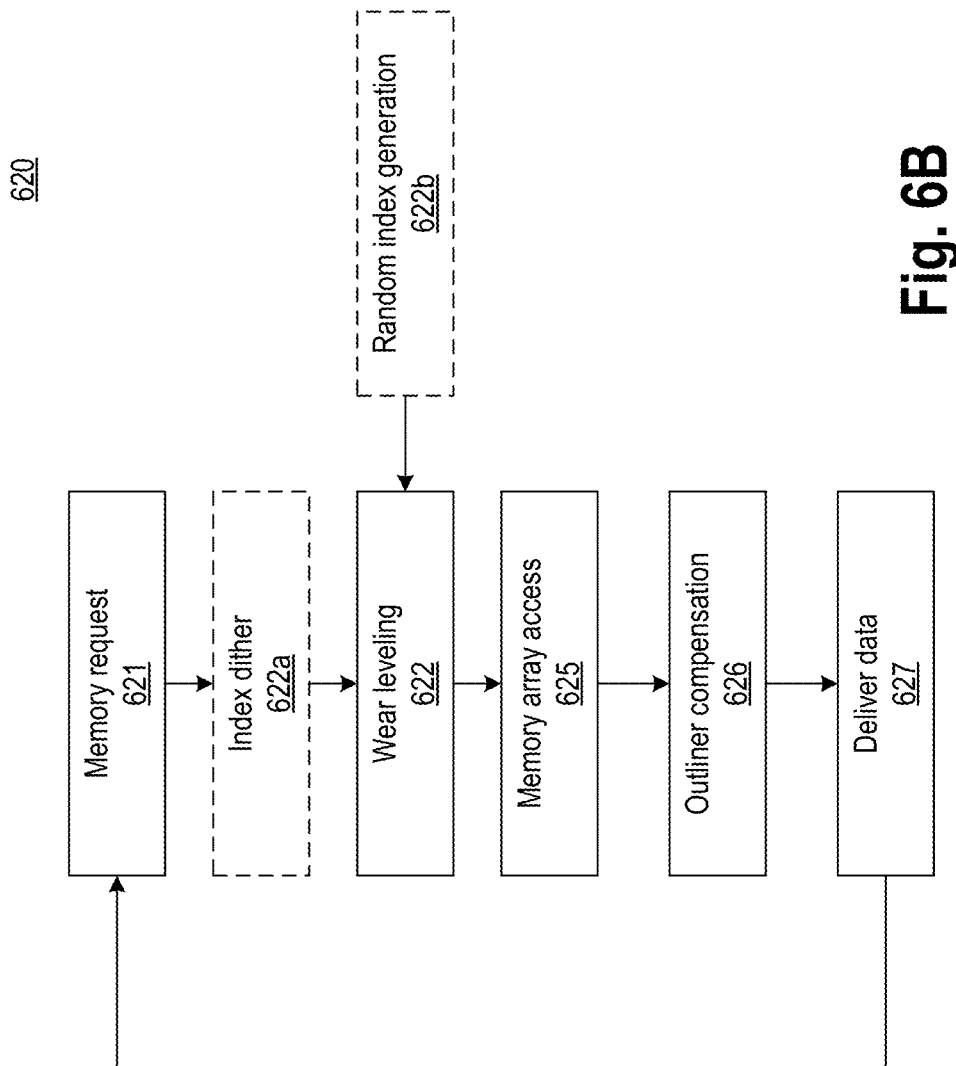

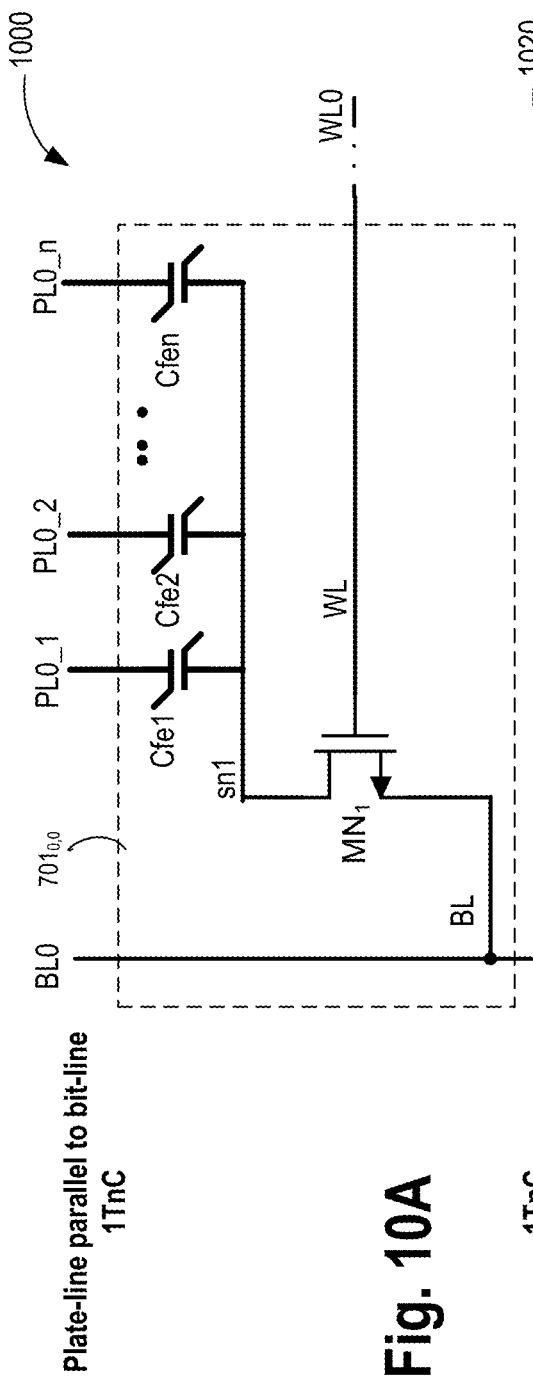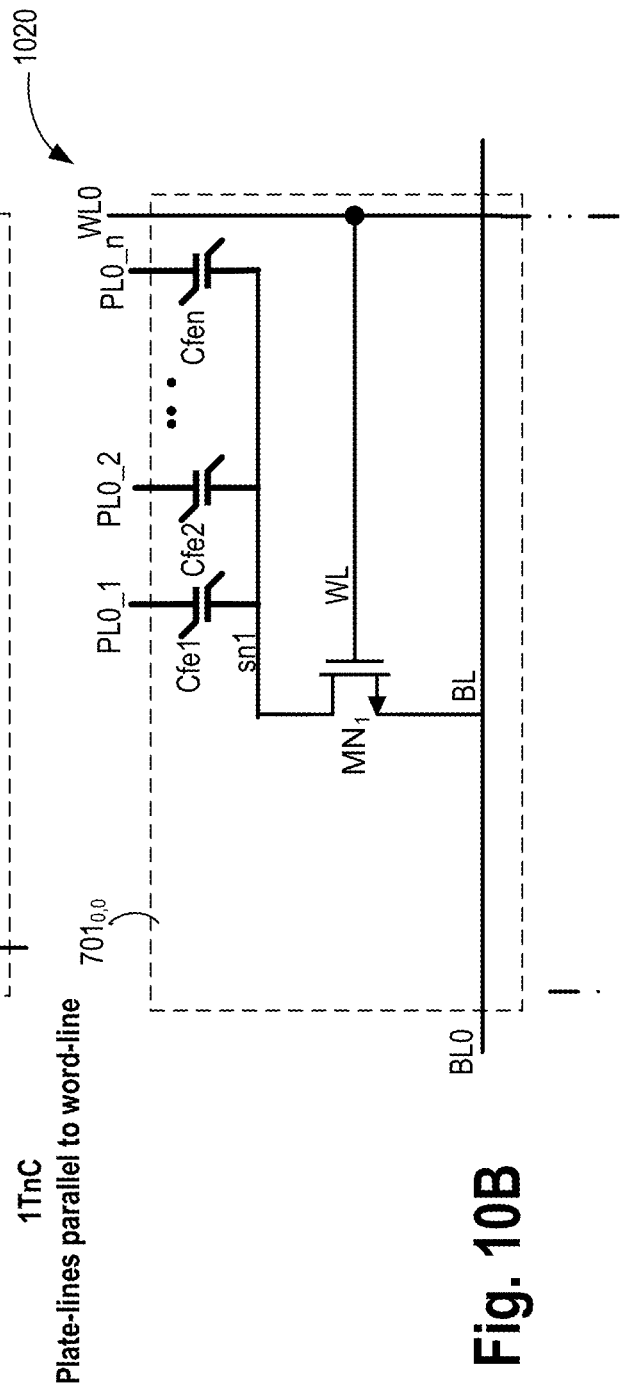
Fig. 10A  Plate-line parallel to bit-line 1TnC
Fig. 10B  Plate-lines parallel to word-line 1TnC

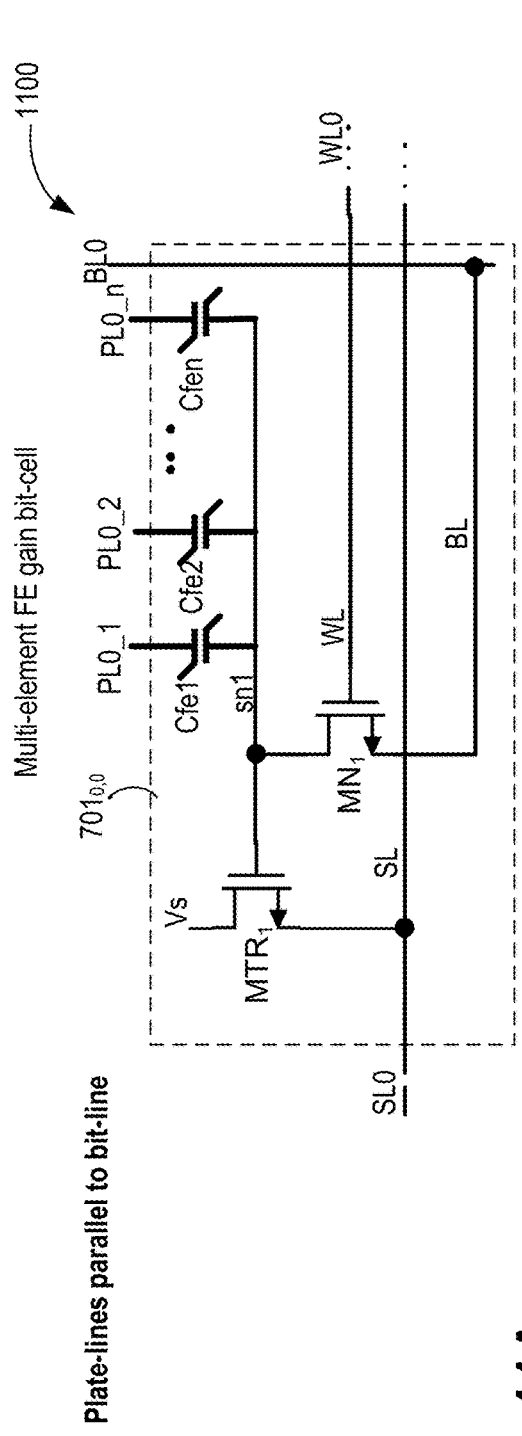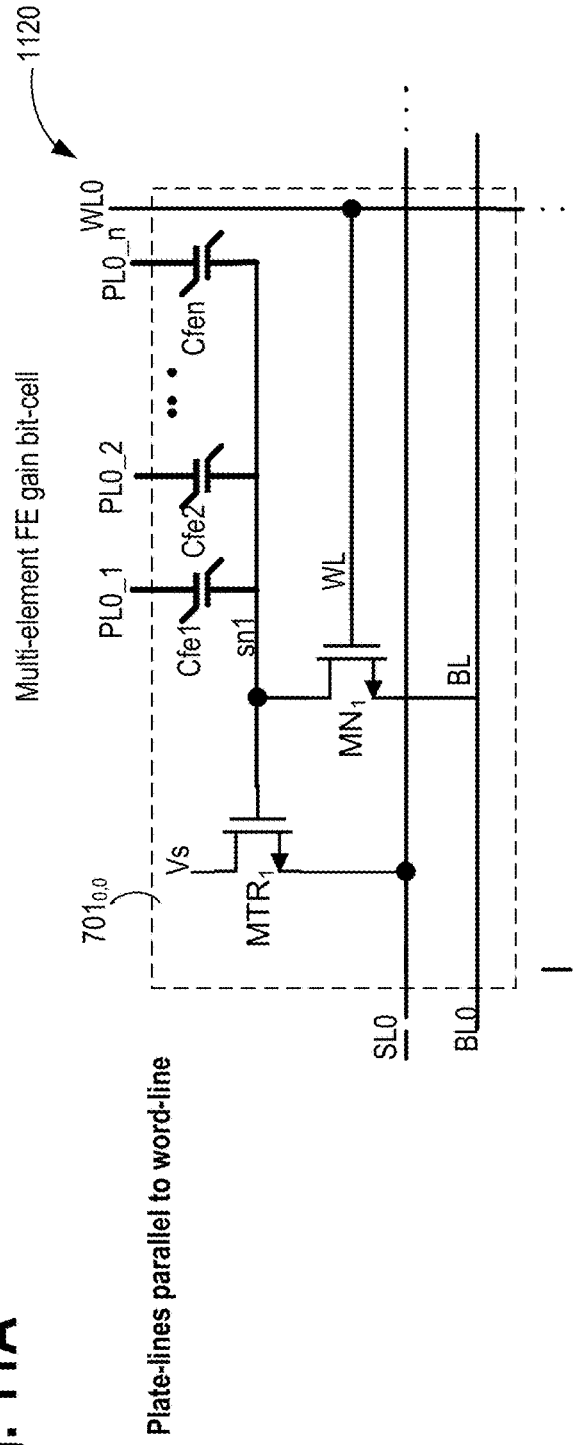
Fig. 11A
Fig. 11B

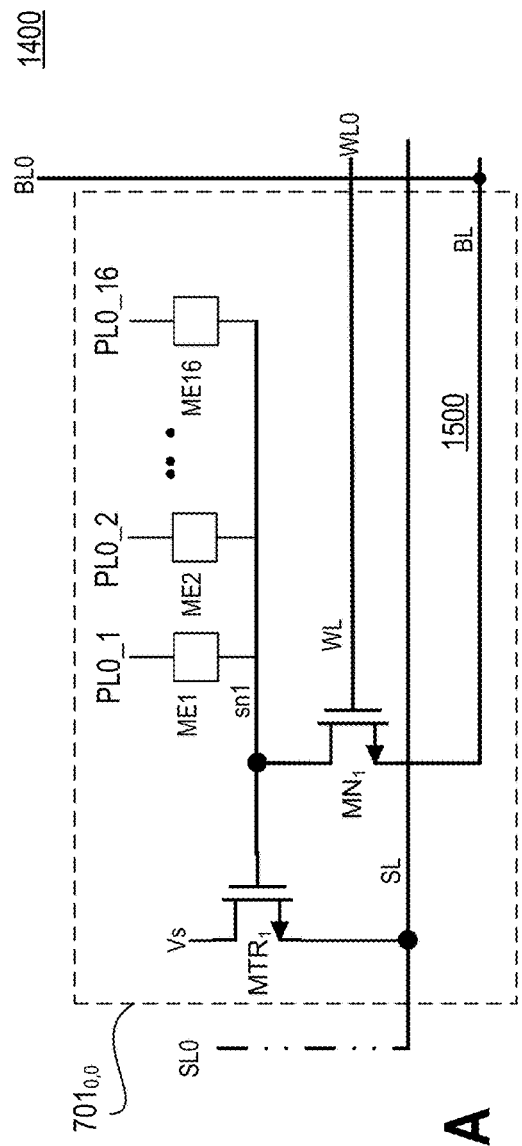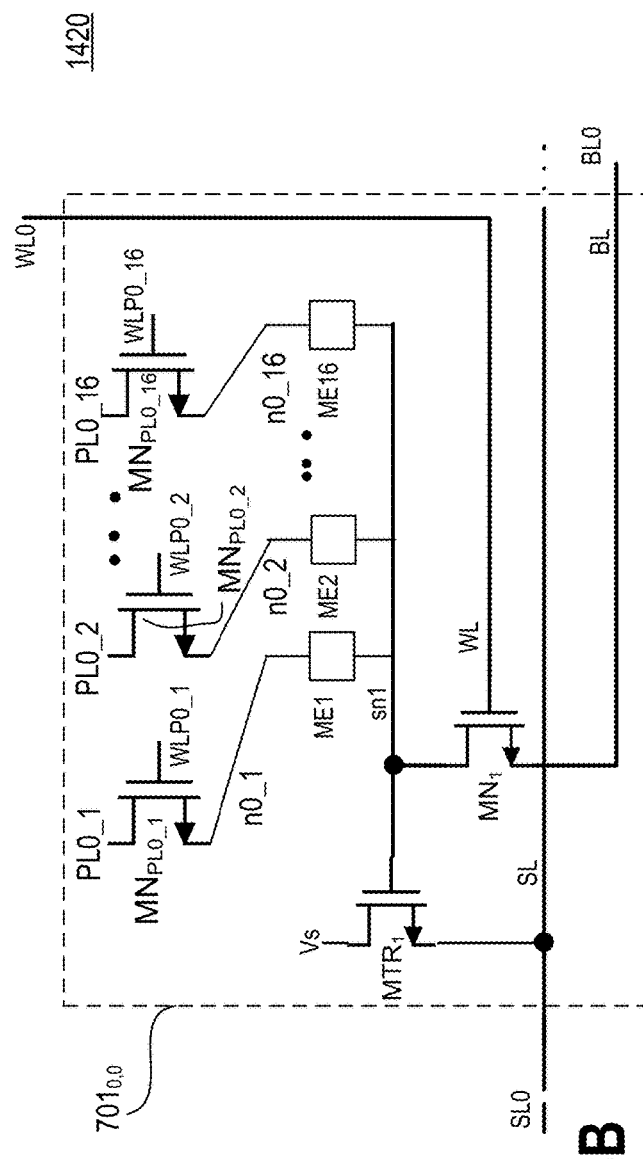
Fig. 14A
Fig. 14B

MEMORY ARRAY WITH BURIED OR BACKSIDE WORD-LINE

BACKGROUND

Memory bit-cells are arranged in rows and columns that form segments, arrays, or banks. An individual memory bit-cell is connected to a word-line (WL). Word-line is usually routed on a higher metal layer above the memory bit-cell as it traverses a row of a memory array. At a bit-cell level, the word-line may be routed on a lower metal layer or poly layer, that eventually is connected to a gate of an access transistor of the bit-cell. This routing on either lower local interconnect layer or poly layer has high resistance, and thereby limits speed for the memory operations. The current method usually brings this connection to higher metal layer every few bit-cells (e.g., 16, 32, 64, etc.). The connections to higher metal in that case presents a process integration challenge, for example, for backend-of-line (BEOL) integrated memories such as ferroelectric random-access memory (FRAM), magnetic random-access memory (MRAM), etc. The connections to higher metal may use via processing inside the memory array that needs to bypass the memory device layer. This via processing adds to the complexity of process integration. Via processing may also result in an area overhead leading to array efficiency degradation. The connections to higher metal and associated via processing may also presents itself as a trade-off between area efficiency and memory performance. For example, better memory performance may desire moving to higher metal layer every few bit-cells, but that may mean more area loss in printing those vias that go up, and losing the space for potential memory element population in that area. Further, dummy memory element requirement, every time such breaks in the memory area occurs for populating such vias to hit higher metal layer strapping to lower resistance, may further increase memory area without increasing memory capacity.

The background description provided here is for the purpose of generally presenting the context of the disclosure. Unless otherwise indicated here, the material described in this section is not prior art to the claims in this application and is not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a planar ferroelectric or paraelectric capacitor structure, in accordance with some embodiments.

FIG. 4B illustrates three planar ferroelectric or paraelectric capacitor structures, respectively, in accordance with some embodiments.

FIG. 4C illustrates a pedestal that connects to the top and/or bottom electrodes of the planar ferroelectric or paraelectric capacitor.

FIG. 6B illustrates a flowchart of memory endurance for the PE and FE memory, in accordance with some embodiments.

FIG. 10A illustrates a 1TnC bit-cell with plate-lines parallel to the bit-line, and with buried word-line, in accordance with some embodiments of the disclosure.

FIG. 10B illustrates a 1TnC bit-cell with plate-lines parallel to the word-line, and with buried word-line, in accordance with some embodiments of the disclosure.

FIG. 11A illustrates a multi-element FE gain bit-cell with plate-lines parallel to the bit-line, and with buried word-line, in accordance with some embodiments of the disclosure.

FIG. 11B illustrates a multi-element FE gain bit-cell with plate-lines parallel to the word-line, and with buried word-line, in accordance with some embodiments of the disclosure.

FIG. 14A illustrates a multi-element gain bit-cell with plate-lines parallel to the bit-line, and with buried word-line, in accordance with some embodiments.

FIG. 14B illustrates a multi-element bit-cell with plate-lines parallel to the word-line, and with buried word-line, in accordance with some embodiments.

DETAILED DESCRIPTION

Figure 1:
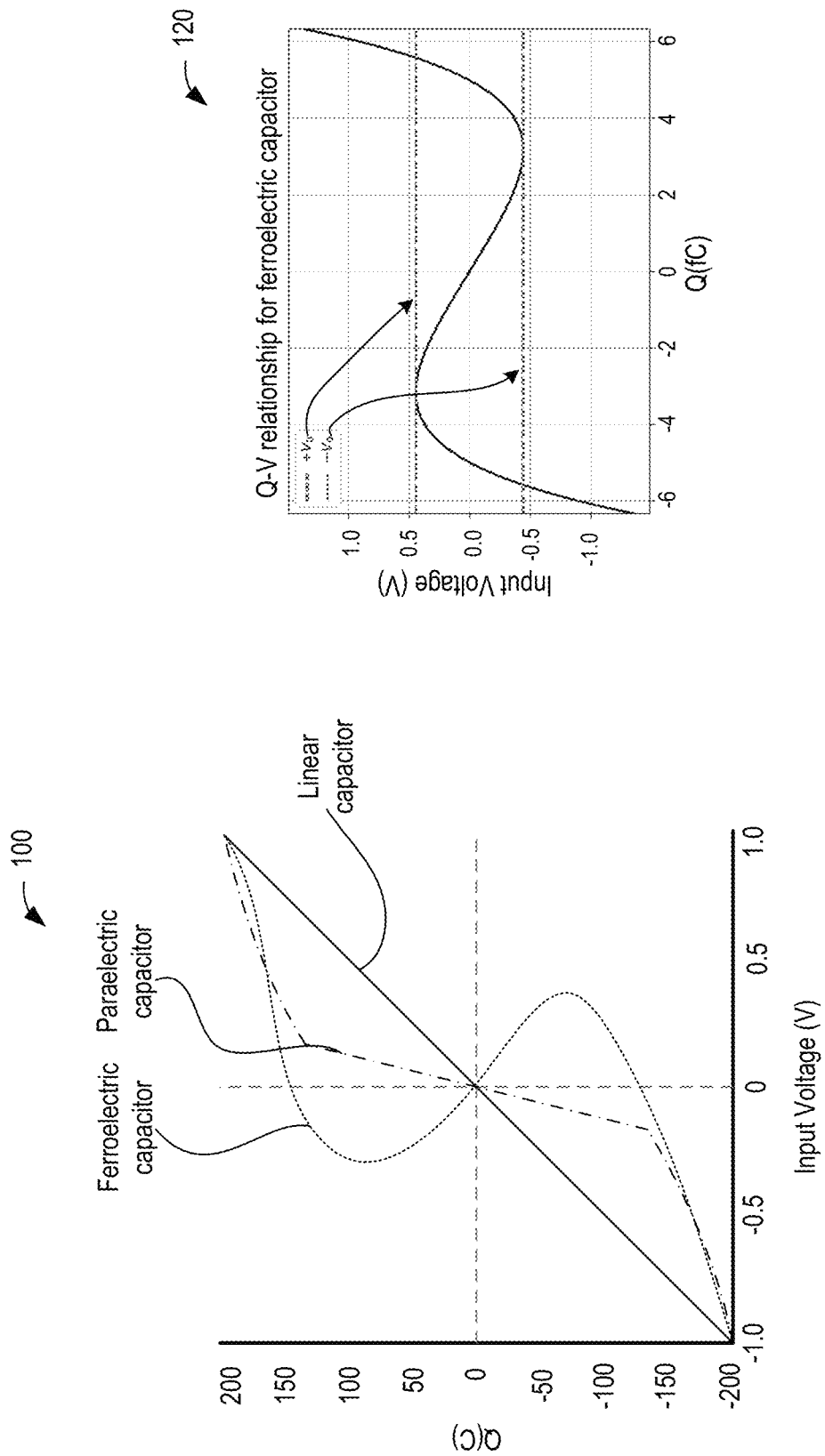
FIG. 1 illustrates a set of plots that show behavior of a ferroelectric capacitor, a paraelectric capacitor, and a linear capacitor.

Various embodiments describe a memory with buried word-line. Here, the term "buried word-line" or buried WL generally refers to a metal route which is positioned in a layer below an active layer of a process node. An active layer of a process node comprises one or more layers that include areas where a transistor is formed. The buried WL is in layers below the frontend-of-line (also simply referred to as frontend) of a process node. In various embodiments, the buried WL couples to one or more access transistors of a memory array (e.g., a row of memory bit-cells or a column of memory bit-cells) through one or more buried vias. Here, the term "buried vias" generally refers to a via formed below the active layer of a process node and is capable of connecting to a source, drain, gate, and/or bulk regions of a transistor. The buried via is also capable of connecting to a regular via formed above an active region of a process technology node.

As discussed herein, typical word-line routing to the bit-cells presents a process integration challenge, an area overhead, and thus a challenge to memory performance. Existing WL to a row or column of bit-cells is coupled to a gate of an access transistor of the bit-cell. Such coupling of the WL is done using word-line strapping. Here, the term "word-line strapping" generally refers to a mechanism of connecting a main word-line with a local word-line, which is local to a row or column of bit-cells. Word-line strapping typically occurs in a region, also referred to as word-line strapping cell, of a memory row or column where the local word-line is connected through one or more contacts, vias, and/or poly or metal stubs to the main word-line. The word-line strapping cell may also include one or more dummy bit-cells or one or more non-functional bit-cells. This is because when a continuous row or column of bit-cells is discontinued to insert a word-line strapping cell, one or more dummy bit-cells may also be added for process integrity. The dummy bit-cell or non-functional bit-cell are typically added to meet process design rules. For example, to make identical or near identical memory bit-cells, dummy bit-cells are added to make sure that bit-cells near the edges of a row or column or at points of memory discontinuities have the same structure and process characteristics as other neighboring functional bit-cells. The frequent use of the word-line strapping cell and dummy bit-cells take up valuable silicon area. Further, inclusion of dummy bit-cells and word-line strapping cells increase complexity of design rule checkers that may verify proper insertion of these cells to make a functional memory.

Various embodiments use buried WLs that eliminate the space for word-line strapping cells. The buried WLs also reduce the number of dummy bit-cells that are added because of the word-line strapping cells. Some embodiments disclose a memory comprising a plurality of bit-cells organized in a row or column. In some embodiments, an individual bit-cell of the plurality of bit-cells includes an access transistor and a plurality of capacitors. These capacitors may include non-linear polar material (e.g., ferroelectric, paraelectric, and/or non-linear dielectric). In some embodiments, the capacitors are planar capacitors. In some embodiments, the capacitors are non-planar capacitors. In some embodiments, the memory comprises a word-line positioned under the access transistor, wherein the access transistor is controllable by the word-line. In various embodiments, the plurality of capacitors is positioned above the access transistor. In some embodiments, the individual bit-cell has an individual boundary which substantially abuts a neighboring bit-cell in the row or column such that there are no dummy bit-cells between individual bit-cell and the neighboring bit-cell. For example, there are no dummy bit-cells between individual bit-cells of the plurality of bit-cells in a row or column. In some embodiments, the individual bit-cell has an individual boundary which substantially abuts a neighboring bit-cell in the row or column such that there is no gap area between individual bit-cells and the neighboring bit-cell to strap the word-line. For example, there are no word-line strapping cell(s) between individual bit-cells of the plurality of bit-cells in a row or column.

In various embodiments, the buried word-line is routed from under the access transistor to a word-line driver. When the buried word-line reaches a memory periphery area where the word-line driver is located, the buried word-line is then connected to the word-line driver using buried vias, in accordance with some embodiments. In some embodiments, the buried word-line is coupled to a metal layer above an active device (e.g., transistors of the word-line driver) to connect to the word-line driver.

There are several technical effects of various embodiments. For example, the use of buried word-lines allows for a smaller memory area, relaxed design rules for layout, and higher performance for the memory because more memory can be packed in the same area than when word-line strapping cells and/or dummy cells were used in between functional bit-cells. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a paralectric capacitor, a ferroelectric capacitor, and a linear capacitor. Plot 100 compares the transfer function for a linear capacitor, a paralectric (PE) capacitor (a nonlinear capacitor), and a ferroelectric (FE) capacitor (a nonlinear capacitor). Here, the x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization vs. voltage response. The threshold is related to: a) nonlinearity of switching transfer function; and b) the squareness of the FE switching. The nonlinearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a nonlinear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). In some embodiments, the FE material is perovskite, which includes one or more of: La, Sr, Co, Sr, Ru, Y, Ba, Cu, Bi, Ca, or Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for the FE material. Perovskites can be suitably doped to achieve a spontaneous distortion in a range of 0.3 to 2%. For example, for chemically substituted lead titanate such as Zr in Ti site; La or Nb in Ti site, the concentration of these substitutes is such that it achieves the spontaneous distortion in the range of 0.3% to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements, especially Sc, Ti, V, Cr, Mn, Fe, Co, Ni, Cu, or Zn. A' may have the same valency as site A, with a different ferroelectric polarizability. In various embodiments, when metallic perovskite is used for the FE material, conductive oxides can include one or more of: $IrO_2$, $RuO_2$, $PdO_2$, $OSO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, and PtO2, which have a non-perovskite structure but higher conductivity to provide a seed or template for the growth of pure perovskite ferroelectric at low temperatures, are used as conductive oxides. In some embodiments, the conductive oxides include one or more of: Ir, In, Fe, Ru, Pd, Os, or Re.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paralectric material. Examples of room temperature paralectric materials include: SrTiO3, Ba(x)Sr(y)TiO3 (where x may be −0.05 or 0.5, and y may be 0.95), HfZrO2, Hf—Si—O, La-substituted PbTiO3, or PMN-PT based relaxor ferroelectrics.

In some embodiments, the FE material comprises one or more of: hafnium (Hf), zirconium (Zr), aluminum (Al), silicon (Si), their oxides, or their alloyed oxides. In some embodiments, the FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: bismuth ferrite (BFO), lead zirconate titanate (PZT), BFO with a first doping material, or PZT with a second doping material, wherein the doping material is one of Nb or La; and relaxor ferroelectrics such as PMN-PT.

In some embodiments, the FE material includes bismuth ferrite (BFO) with a first doping material where in the first doping material is one of lanthanum, or any element from the lanthanide series of the periodic table. In some embodiments, the FE material includes lead zirconium titanate (PZT), or PZT with a second doping material, wherein the second doping material is one of La or Nb. In some embodiments, the FE material includes a relaxor ferroelectric including one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In some embodiments, the FE material includes hafnium oxides of the form, $Hf(1-x)E_xO_y$ where E can be Al, Ca, Ce, Dy, Er, Gd, Ge, La, Sc, Si, Sr, Sn, or Y. In some embodiments, the FE material includes niobate type compounds $LiNbO_3$, $LiTaO_3$, lithium iron tantalum oxy-fluoride, barium strontium niobate, sodium barium niobate, or potassium strontium niobate.

In some embodiments, the FE material comprises multiple layers. For example, alternating layers of $[Bi_2O_2]2+$, and pseudo-perovskite blocks ($Bi_4Ti_3O_{12}$ and related Aurivillius phases), with perovskite layers that are 'n' octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type $h-RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. For example, a super lattice of [PTO/STO]n or [LAO/STO]n, where 'n' is between 1 and 100. In some embodiments, the paraelectric material includes one of: $SrTiO_3$, $Ba(x)Sr(y)TiO_3$ (where x is −0.5, and y is 0.95), $BaTiO_3$, $HfZrO_2$, Hf—Si—O, La-substituted $PbTiO_3$, or PMN-PT based relaxor ferroelectrics.

Figure 2:
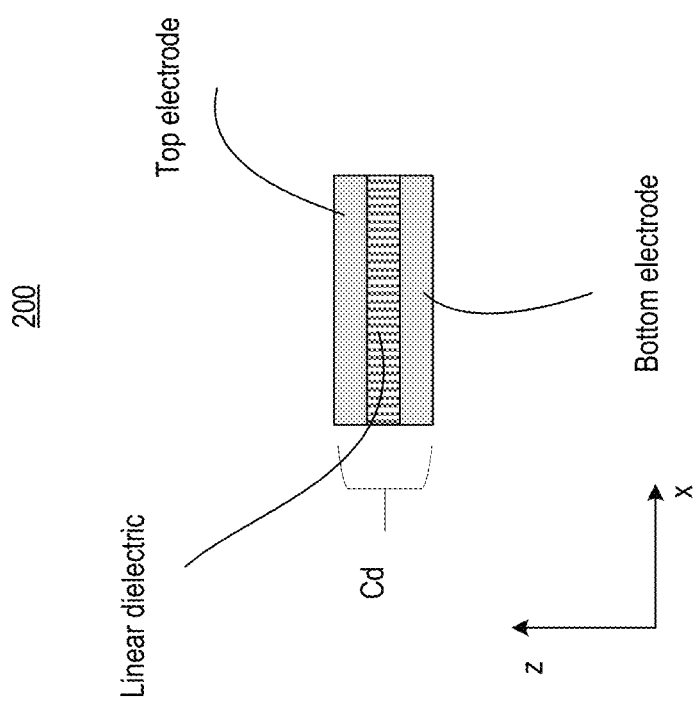
FIG. 2 illustrates a planar linear capacitor structure, in accordance with some embodiments.

FIG. 2 illustrates planar linear capacitor structure 200, in accordance with some embodiments. In some embodiments, capacitors for the multi-input capacitive structures are linear capacitors. These capacitors can take any planar form. One such form is illustrated in FIG. 2. Here, planar linear capacitor structure 200 is a metal-insulator-metal (MIM) capacitor comprising a bottom electrode, a top electrode, and a linear dielectric between the top electrode and the bottom electrode as shown. In some embodiments, conductive oxide layer(s) are formed between the bottom electrode and the linear dielectric. In some embodiments, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and 'B' is Mn.

In some embodiments, the dielectric layer includes one or more of: $SiO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$. Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 3A:
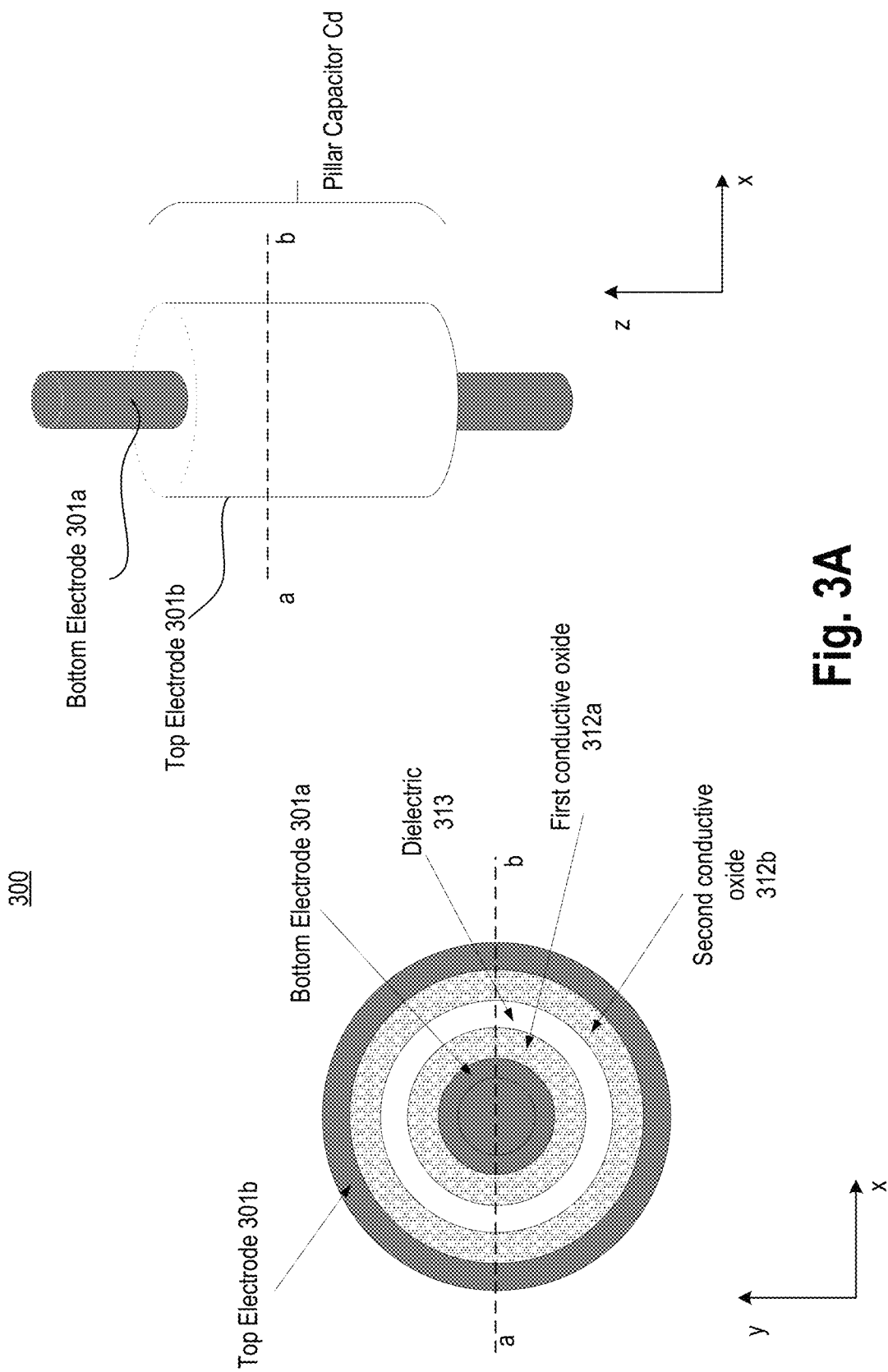
FIG. 3A illustrates a non-planar linear capacitor structure, in accordance with some embodiments.

FIG. 3A illustrates non-planar capacitor structure 300, in accordance with some embodiments. In some embodiments, non-planar capacitor structure 300 is rectangular in shape. Taking the cylindrical shaped case for example, in some embodiments, the layers of non-planar capacitor structure 300 from the center going outwards include bottom electrode 301a, first conductive oxide 312a, dielectric material 313, second conductive oxide 312b, and top electrode 301b. A cross-sectional view along the "ab" dashed line is illustrated in the middle of FIG. 3A. In some embodiments, conducting oxides are removed and the dielectric is directly connected to top electrode 301b and bottom electrodes 301a. In some embodiments, dielectric material 313 can include any suitable dielectric, where the thickness of dielectric film is a range of 1 nm to 20 nm. In some embodiments, dielectric material 313 comprises a higher-K dielectric material. In some embodiments, dielectrics include one of: $SIO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In some embodiments, first conductive oxide 312a is conformally deposited over bottom electrode 301a. In some embodiments, dielectric material 313 is conformally deposited over first conductive oxide 312a. In some embodiments, second conductive oxide 312b is conformally deposited over dielectric material 313. In some embodiments, top electrode 301b is conformally deposited over second conductive oxide 312b. In some embodiments, bottom electrode 301a is in the center while top electrode 301b is on an outer circumference of non-planar capacitor structure 300.

In some embodiments, material for bottom electrode 301a may include one or more of: Cu, Al, Ag, Au, W, or Co, or their alloys. In some embodiments, material for first conductive oxide 312a include: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and 'B' is Mn. In some embodiments, material for second conductive oxide 312b may be the same as the material for first conductive oxide 312a. In some embodiments, material for top electrode 301b may include one or more of: Cu, Al, Ag, Au, W, Co, or their alloys.

In some embodiments, a first refractive inter-metallic layer (not shown) is formed between dielectric material 313 and first conductive oxide 312a. In some embodiments, a second refractive inter-metallic layer (not shown) is formed between dielectric material 313 and second conductive oxide 312b. In these cases, the first and second refractive inter-metallic layers are directly adjacent to their respective conductive oxide layers and to dielectric material 313. In some embodiments, refractive inter-metallic maintains the capacitive properties of the dielectric material 313. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta), or combined properties. Additions such as Si, B, and Mg can markedly enhance other properties. The thicknesses of the layers of non-planar capacitor structure 300 in the x-axis are in the range of 1 nm to 30 nm. In some embodiments, refractive inter-metallic layers are not used for non-planar capacitor structure 300.

Figure 3B:
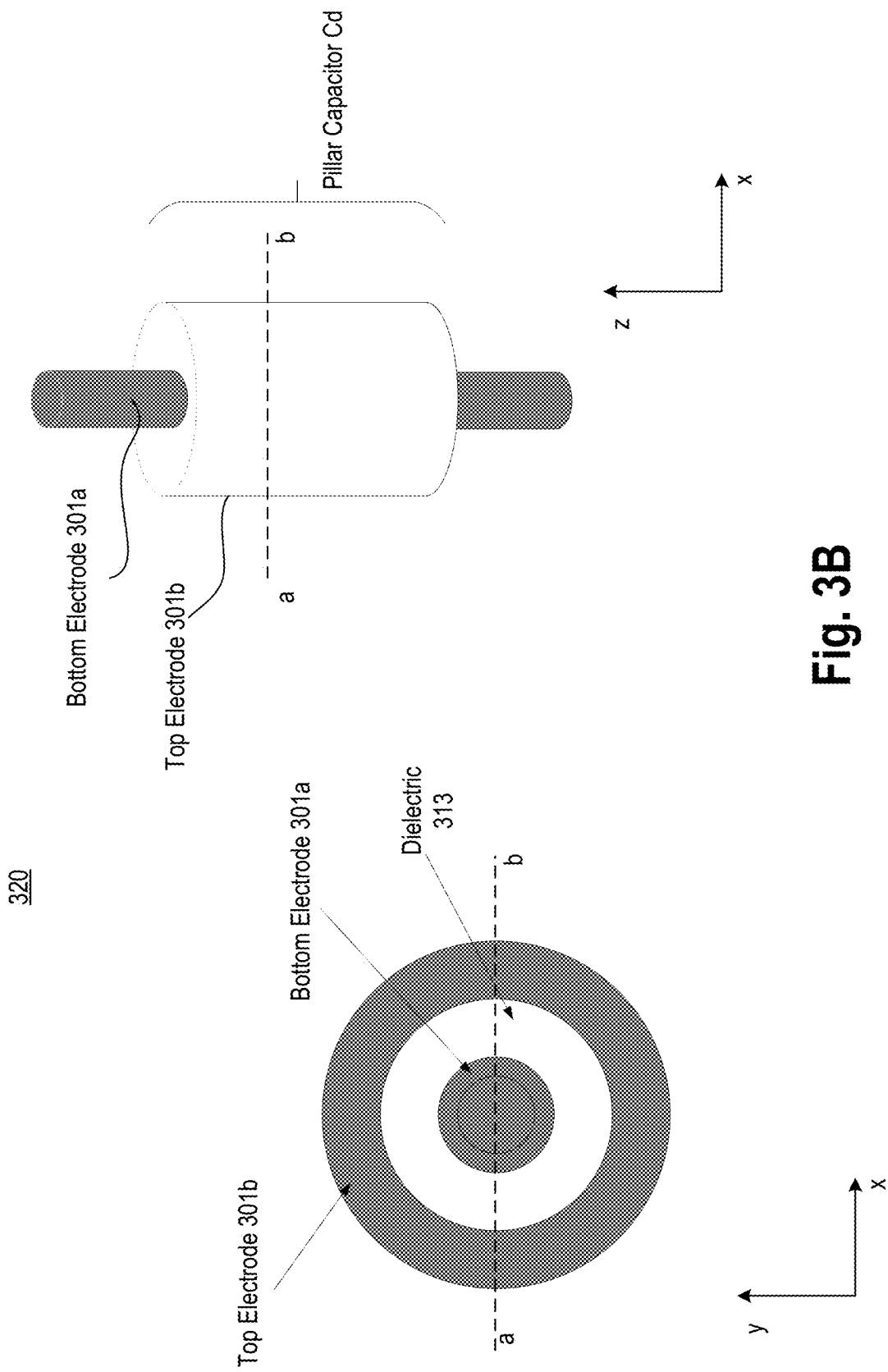
FIG. 3B illustrates a non-planar linear capacitor structure without conductive oxides, in accordance with some embodiments.

FIG. 3B illustrates a non-planar linear capacitor structure 320 without conductive oxides, in accordance with some embodiments. Compared to FIG. 3A, here the linear dielectric is adjacent to the top electrode and the bottom electrode.

FIG. 4A illustrates a planar ferroelectric or paraelectric capacitor structure, in accordance with some embodiments. FIG. 4B illustrates three planar ferroelectric or paraelectric capacitor structures, respectively, in accordance with some embodiments.

In some embodiments, capacitors are ferroelectric or paraelectric capacitors. These capacitors can take any planar form. One such simplified form is illustrated in FIG. 4A. Here, planar capacitor structure 400 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

In some embodiments, planar capacitor 423a includes encapsulation portions 421a and 421b (also referred to as sidewall barrier seal) that are adjacent to the side walls of the plurality of layers of the planar capacitor. In some embodiments, planar capacitor 423b includes encapsulation portions 421c and 421d that are partially adjacent to encapsulation portions 421a and 421b, and a layer of refractive inter-metallic material 411a. In some embodiments, encapsulation portions 421a and 421b extend in the z-plane. In various embodiments, encapsulation portions 421c and 421d terminate into a via (not shown). The material for encapsulation portions 421c and 421d is the same as those for encapsulation portions 421a and 421b. In some embodiments, the encapsulation portions include one or more of an oxide of: Ti, Al, or Mg.

In some embodiments, planar capacitor 423c includes encapsulation portions 421e and 421f that are partially adjacent to encapsulation portions 421a and 421b, and refractive inter-metallic material 411b. In various embodiments, encapsulation portions 421e and 421f terminate into a via (not shown). In some embodiments, encapsulation portions 421e and 421f extend in an x-plane. The material for encapsulation portions 421e and 421f is the same as those for encapsulation portions 421a and 421b. Material for encapsulation portions 421a and 421b includes one or more of: Ti—Al—O, $Al_2O_3$, MgO, or nitride. Material for encapsulation portions 421a and 421b is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the encapsulation portions 421a/b (insulating material) is in a range of 0.1 nm to 20 nm. In some embodiments, sidewall barriers are in direct contact with ILD.

In some embodiments, planar capacitors 423a, 423b, and 423c comprise a number of layers stacked together to form a planar capacitor. These layers may extend in an x-plane when the capacitor is a planar capacitor. In some embodiments, the stack of layers includes refractive inter-metallic material 411a/b as a barrier material; conductive oxides 412a/b, and ferroelectric material 413. Ferroelectric material 413 can be any of the FE materials discussed herein. In some embodiments, refractive inter-metallic material 411a/b are removed, and electrodes are in direct contact with conductive oxides 412a/b.

In some embodiments, refractive inter-metallic material 411a/b maintains the FE properties of the FE capacitor. In the absence of refractive inter-metallic material 411a/b, the ferroelectric material 413 of the capacitor may lose its potency. In some embodiments, refractive inter-metallic 411a/b comprises Ti and Al (e.g., TiAl compound). In some embodiments, refractive inter-metallic material 411a/b comprises one or more of Ta, W, and/or Co. For example, refractive inter-metallic material 411a/b includes a lattice of Ta, W, and Co.

In some embodiments, refractive inter-metallic material 411a/b is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or ferroelectric material 413.

In some embodiments, refractive inter-metallic material 411a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties.

Additions such as Si, B, and Mg can markedly enhance other properties. In some embodiments, refractive inter-metallic material 411a, which may behave as a barrier layer, is coupled to a top electrode. In some embodiments, encapsulation portions 421a/b(insulating material) is placed around refractive inter-metallic material 411a, conductive oxide 412a, ferroelectric material 413, conductive oxide 412b, and refractive inter-metallic material 411b along while the top and bottom surfaces of refractive inter-metallic material 411a and refractive inter-metallic material 411b are exposed for coupling to metal layers, vias, or a metallic pedestal.

In some embodiments, conductive oxide layer(s) are formed between the top electrode and the ferroelectric dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and $ABO_3$ type, where 'A' is a rare earth element and 'B' is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

FIG. 4C illustrates pedestal 440 that connects to the top and/or bottom electrodes of the planar ferroelectric or paraelectric capacitor, in accordance with some embodiments. In some embodiments, pedestal 440 comprises pedestal metal 441 and sidewall barrier 442. In some embodiments, sidewall barrier 442 includes materials to protect hydrogen and/or oxygen from interacting with pedestal metal 441. In some embodiments, sidewall barrier 442 comprises Ti—Al—O, $Al_2O_3$, MgO, or nitride. In some embodiments, pedestal metal 441 includes one of Cu, Al, Ag, Au, W, or Co.

Figure 5A:
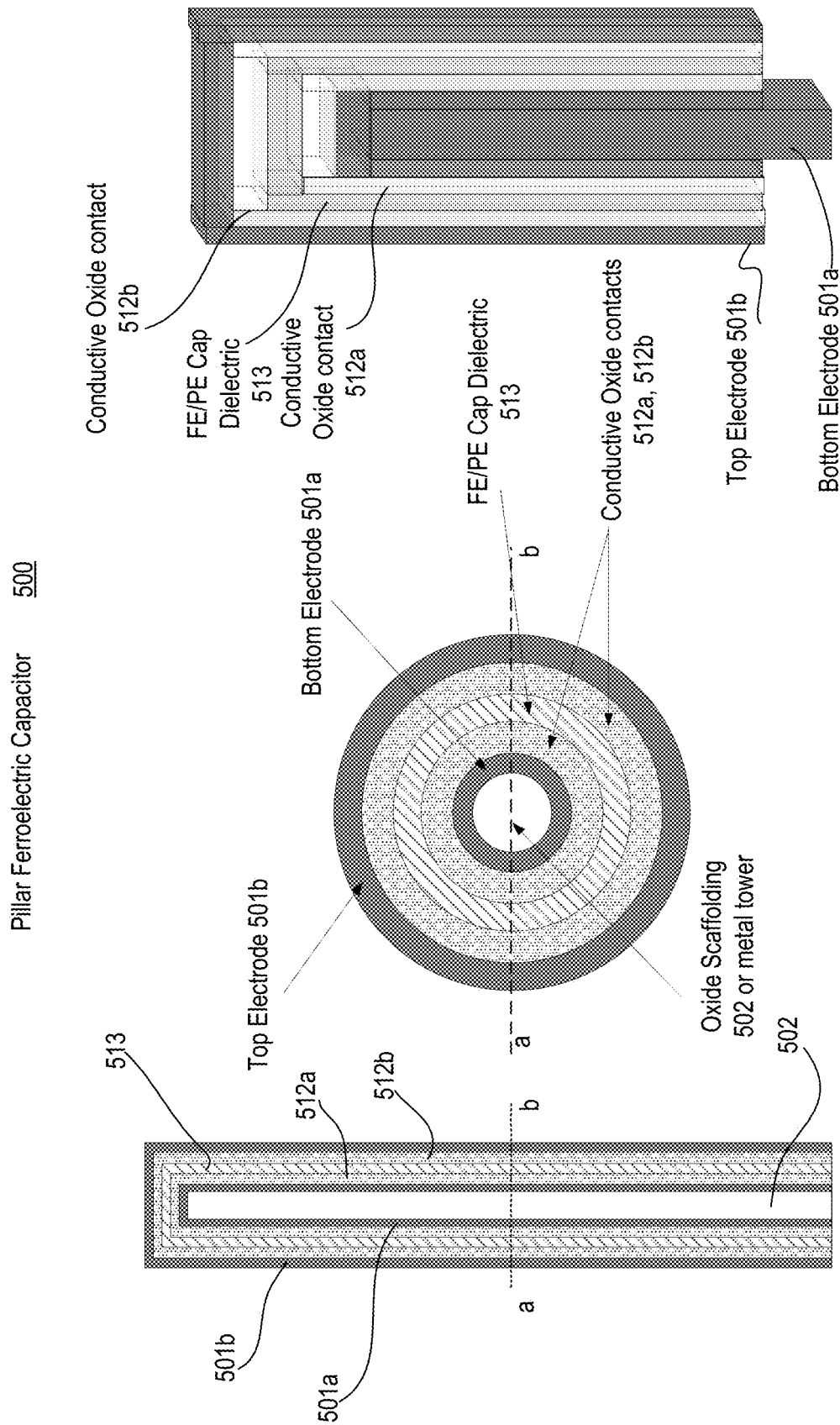
FIG. 5A illustrates a non-planar ferroelectric or paraelectric capacitor structure, in accordance with some embodiments.

FIG. 5A illustrates a non-planar ferroelectric (FE) or paraelectric (PE) capacitor structure, in accordance with some embodiments. In some embodiments, non-planar capacitor structure 500 is rectangular in shape. Taking the cylindrical shaped case for example, in some embodiments, the layers of non-planar capacitor structure 500 from the center going outwards include bottom electrode 501a, first conductive oxide 512a, ferroelectric (FE) or paraelectric (PE) dielectric material 513, second conductive oxide 512b, and top electrode 501b. In some embodiments, conducting oxides are removed and the dielectric material is directly connected to top electrode 501b and bottom electrode 501a. In some embodiments, dielectric material 513 can include any suitable ferroelectric or paraelectric dielectric, where the thickness of a film of dielectric material 513 is a range of 1 nm to 20 nm. In some embodiments, dielectric material 513 includes any one of the materials discussed herein for ferroelectrics or paraelectric. In some embodiments, central region 502 of non-planar capacitor structure 500 is filled with oxide or an insulative material. In some embodiments, central region 502 is filled with metal that abuts with bottom electrode 501a to form a thicker bottom electrode.

In some embodiments, first conductive oxide 512a is conformally deposited over bottom electrode 501a. In some embodiments, dielectric material 513 is conformally deposited over first conductive oxide 512a. In some embodiments, second conductive oxide 512b is conformally deposited over dielectric material 513. In some embodiments, top electrode 501b is conformally deposited over second conductive oxide 512b. In some embodiments, bottom electrode 501a is in the center while top electrode 501b is on an outer circumference of non-planar capacitor structure 500.

In some embodiments, material for bottom electrode 501a may include one or more of: Cu, Al, Ag, Au, W, or Co, or their alloys. In some embodiments, material for first conductive oxide 512a include: $IrO_2$, $RuO_2$, $PdO_2$, $OsO_2$, or $ReO_3$. In some examples, conductive oxides are of the form A2O3 (e.g., In2O3, Fe2O3) and $ABO_3$ type, where 'A' is a rare earth element and 'B' is Mn. In some embodiments, material for second conductive oxide 512b may be the same as the material for first conductive oxide 512a. In some embodiments, material for top electrode 501b may include one or more of: Cu, Al, Ag, Au, W, or Co, or their alloys.

In some embodiments, a first refractive inter-metallic layer (not shown) is formed between dielectric material 513 and first conductive oxide 512a. In some embodiments, a second refractive inter-metallic layer (not shown) is formed between dielectric material 513 and second conductive oxide 512b. In these cases, the first and second refractive inter-metallic layers are directly adjacent to their respective conductive oxide layers and to dielectric material 513. In some embodiments, refractive inter-metallic maintains the capacitive properties of the dielectric material 513. In some embodiments, refractive inter-metallic comprises Ti and Al (e.g., TiAl compound). In some embodiments, refractive inter-metallic comprises one or more of Ta, W, and/or Co.

For example, refractive inter-metallic material includes a lattice of Ta, W, and Co. In some embodiments, refractive inter-metallic material includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of non-planar capacitor structure 500 in the x-axis are in the range of 1 nm to 30 nm. In some embodiments, refractive inter-metallic layers are not used for non-planar capacitor structure 500.

Figure 5B:
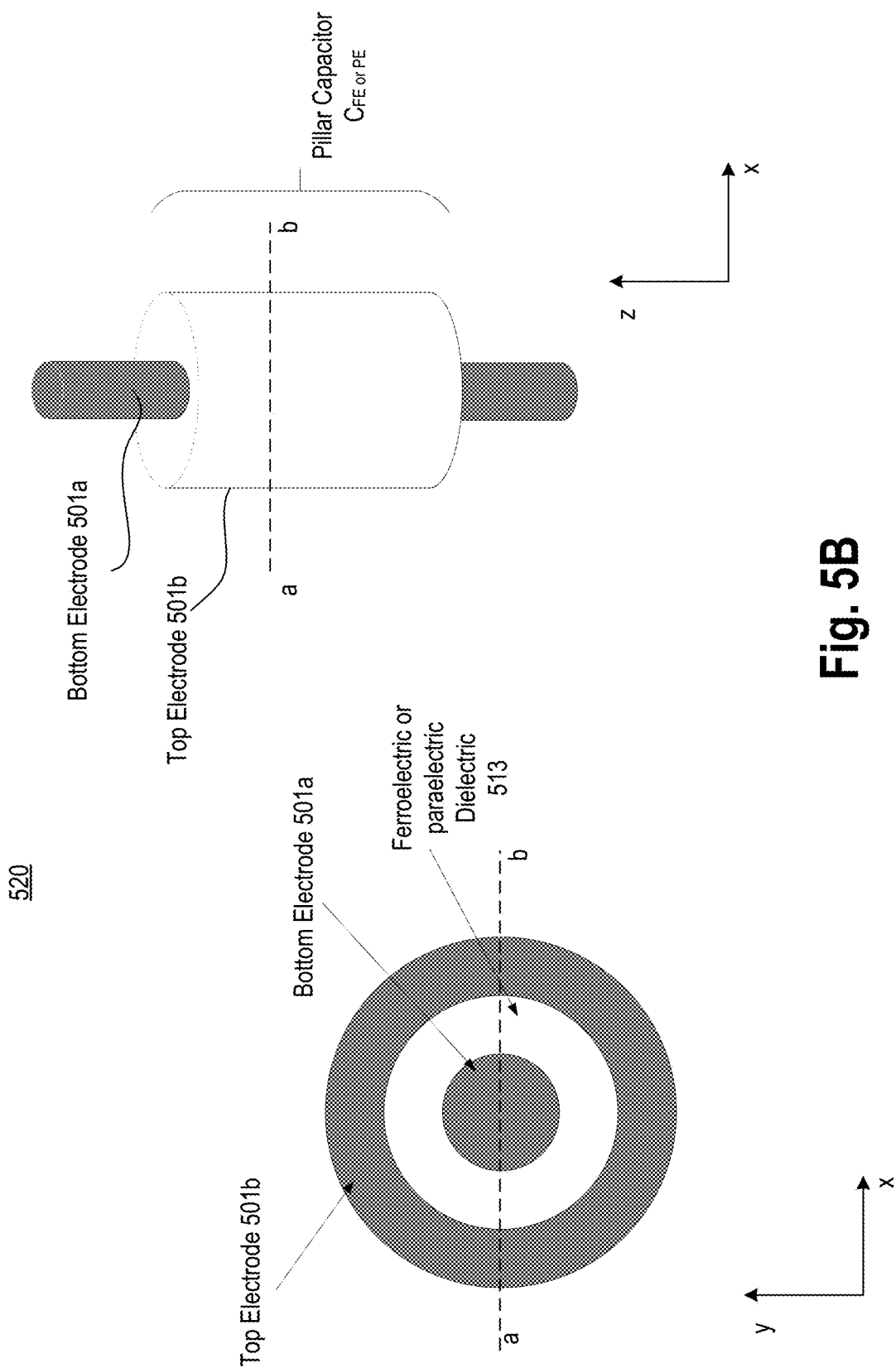
FIG. 5B illustrates a non-planar ferroelectric or paraelectric capacitor structure without conductive oxides, in accordance with some embodiments.

FIG. 5B illustrates a non-planar ferroelectric or paraelectric capacitor structure 520 without conductive oxides, in accordance with some embodiments. Compared to non-planar capacitor structure 500, here first conductive oxide 512a and second conductive oxide 512b are removed and dielectric material 513 is adjacent to top electrode 501b and bottom electrode 501a as shown.

The various embodiments illustrated here for ferroelectric material can replace ferroelectric material with anti-ferroelectric material. Examples of anti-ferroelectric (AFE) material include lead zirconate titanate (PZT) with high Zr doping, La-doped PZT with high Zr doping, HfSiO2 with high Si doping, HfZrO2 (HZO) with high Zr doping, ZrO2, PbZrO3 (lead zirconate), NH4H2PO4 (ammonium dihydrogen phosphate (ADP)), NaNbO3 (sodium niobate), and K doped NaNbO3, etc. Table 1 also describes some bulk anti-ferroelectric materials, with various physical/chemical modifications for enhancing energy storage density.

TABLE 1

| Material name | Physical/Chemical Modifications | Energy Density (J/cm$^3$) | Electric Field (kV/cm) |
|---|---|---|---|
| (Pb0.97La0.02)(Zr0.97Ti0.03)O3 | 3 wt % glass (PbO-B2O3-SiO2-ZnO) | 3.1 | 581 |
| (Pb0.97La0.02)(Zr0.97Ti0.03)O3 | without glass | 1.4 | 581 |
| Pb0.99Nb0.02[(Zr0.57Sn0.43)1-yTiy]0.98O3 | with half electrode | 1.30 | 70 |
| Pb0.99Nb0.02[(Zr0.57Sn0.43)1-yTiy]0.98O3 | with full electrode | 1.19 | 70 |
| (Pb0.94-xLa0.04Bax)[(Zr0.60Sn0.40)0.841Ti0.16]O3 | x = 0 (0 MPa) | 0.35 | 30 |
| (Pb0.94-xLa0.04Bax)[(Zr0.60Sn0.40)0.841Ti0.16]O3 | x = 0.02 (20 MPa) | 0.38 | 30 |
| Pb0.99Nb0.02[(Zr0.60Sn0.40)0.95Ti0.05]O3 | — | 0.62 | 56 |
| Pb0.97La0.02(Zr0.56Sn0.35Ti0.09)O3 | 4 wt % glass (CdO-Bi2O3-PbO-ZnO-Al2O3-B2O3-SiO2) | 3.3 | 150 |
| Pb0.97La0.02(Zr0.56Sn0.35Ti0.09)O3 | Without glass | 1.9 | 110 |
| (Pb0:97La0:02)(Zr0:92Sn0:05Ti0:03)O3 | 3% glass (0.8PbO-0.2B2O3) | 7.4 | 475 |
| (Pb0:97La0:02)(Zr0:92Sn0:05Ti0:03)O3 | Without glass | 4.5 | 320 |
| Pb0.97La0.02(Zr0.95Ti0.05)O3 | — | 12.4 | 1120 |
| (Pb0.85Ba0.08Sr0.03La0.03)(Zr0.74Sn0.22Ti0.04) | — | 1.2 | 100 |
| (Bi1/2Na1/2)0.94Ba0.06]La0.8Zr0.2TiO3 | — | 1.58 | 85 |
| (Ba0.1La0.02)(Zr0.675Sn0.275Ti0.05)O3 | — | 2.05 | 70 |
| 0.75(0.80Bi1/2Na1/2TiO3-0.20Bi1/2K1/2TiO3)-0.25SrTiO3 | — | 0.84 | 100 |
| Pb0.97La0.02(Zr0.50Sn0.45Ti0.05)O3 | — | 5.6 | 400 |
| (Pb0.858Ba0.1La0.02Y0.008)(Zr0.65Sn0.3Ti0.05)O3-(Pb0.97La0.02)(Zr0.9Sn0.05Ti0.05)O3 | | 4.65 | 200 |
| 0.89Bi0.5Na0.5TiO3-0.06BaTiO3-0.05K0.5Na0.5NbO3 | double stage sintering | 0.90 | 100 |
| (Pb0.858Ba0.1La0.02Y0.008)(Zr0.65Sn0.3Ti0.05)O3-(Pb0.97La0.02)(Zr0.9Sn0.05Ti0.05)O3 | spark plasma sintering | 6.40 | 275 |
| (Pb0.858Ba0.1La0.02Y0.008)(Zr0.65Sn0.3Ti0.05)O3-(Pb0.97La0.02)(Zr0.9Sn0.05Ti0.05)O3 | conventional sintering | 4.65 | 200 |
| (Na1 xCax)(Nb1 xZrx)O3 x = 0.04 | conventional sintering | 0.91 | 130 |
| (Pb0.92La0.04Ba0.02)[(Zr0.60Sn0.40)0.84Ti0.16]O3 | at 90 MPa | 0.91 | 60 |
| 0.91(Bi0.5Na0.5)TiO3-0.07BaTiO3-0.02(K0.5Na0.5)NbO3 | at 100 MPa | 0.387 | 60 |
| (Pb0.96La0.04)(Zr0.90Ti0.10)O3 | at 100 MPa | 0.698 | 60 |

Figure 6A:
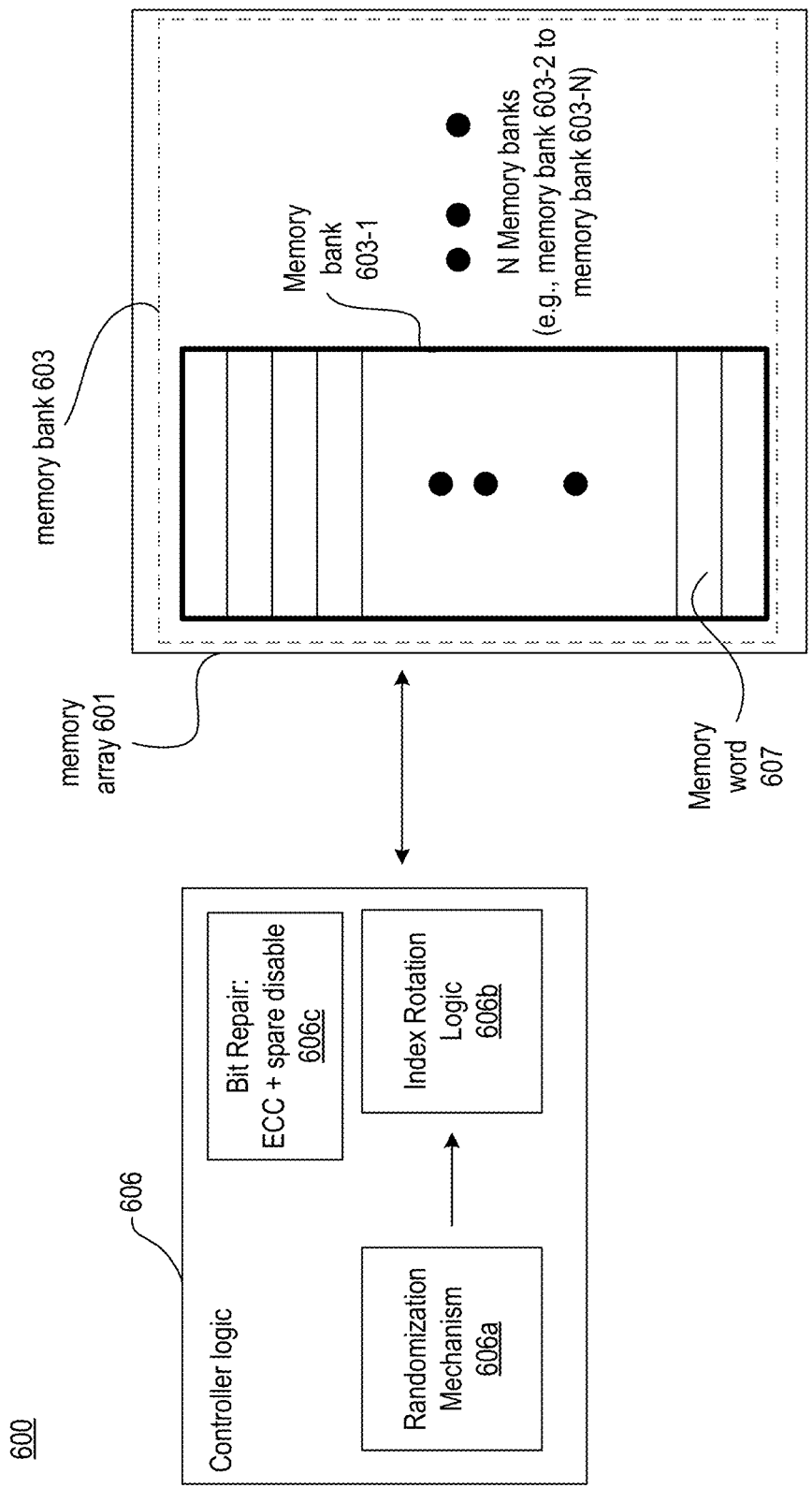
FIG. 6A illustrates a high-level endurance enhancement architecture for a paraelectric (PE) or ferroelectric (FE) memory, in accordance with some embodiments.

FIG. 6A illustrates a high-level endurance enhancement architecture for a paraelectric (PE) or ferroelectric (FE) memory, in accordance with some embodiments. Architecture 600 comprises memory array 601 and controller logic 606. In various embodiments, memory array 601 is memory with non-linear polar material. For example, memory array 601 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In some embodiments, memory array 601 includes a plurality of memory banks (e.g., memory bank 603-1 through memory bank 603-N, where 'N' is a number). Each memory bank (e.g., memory bank 603-1) includes a plurality of memory words (e.g., memory word 607). Each memory word includes a plurality of memory bit-cells. For the sake of simplicity, other memory components are not shown such as write drivers, column multiplexers, sense-amplifiers, etc.

In various embodiments, controller logic 606 comprises endurance hardware and/or software to provide memory endurance to memory array 601. In general, memory endurance is needed to ensure write and/or read operations from memory array 601 are reliable. Write endurance is a number of programs and erase cycles that, when applied to a memory block, bank, or word before the memory block, bank, or word, becomes unreliable. The endurance mechanisms of some embodiments include a wear leveling scheme that uses index rotation, outlier compensation to handle weak bits, and random swap injection to mitigate wear out attacks. For the sake of simplicity, memory banks are generally referred to by their reference "603" instead of a particular memory bank reference (e.g., memory bank 603-1, memory bank 603-2, etc.). Embodiments described to the general reference are applicable to an individual reference. For example, the description of memory bank 603 is applicable for memory bank 603-1, memory bank 603-2, through memory bank 603-N.

In some embodiments, controller logic 606 (also referred to as refresh logic) comprises random invertible bit matrix 606a, index rotation logic 606b, and bit repair logic 606c. In some embodiments, index rotation logic 606b enables random swap injection which randomizes index rotation to obfuscate the mapping from addresses to rotated indexes. In some embodiments, index rotation logic 606b randomizes the rotation of gap words in memory bank 603. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult.

In some embodiments, index rotation logic 606b is used for implementing the wear leveling scheme. In some embodiments, index rotation logic 606b rotates the addresses throughout memory bank 603 to perform a wear leveling function. In various embodiments, index rotation logic 606b ensures that memory requests are spread across memory locations rather than a single memory location.

In some embodiments, bit repair logic 606c includes double error correcting, or triple error detecting error correction code (ECC) to discover new bit errors and spare disable which eliminate memory words with particularly high error rates. Spare disable involves having a buffer of spare cache lines. When cache lines are particularly unreliable, spare disable can swap out unreliable cache lines for the reliable spares. In some embodiments, the spares may be implemented with a memory technology other than FE memory such as static random-access memory (SRAM). In various embodiments, bit repair logic 606c addresses the problem of weak memory bits. In some embodiments, each memory word 607 (or cache line) in memory bank 603 includes a valid bit. The valid bit indicates whether the data associated with that line/word is stored in the memory or the redundant word array. The redundant word array comprises spares that can be used to compensate for defective words in memory. When accessing memory, controller logic 606 checks the valid bit, if the valid bit is set then the data is stored in the redundant memory rather than the memory array or memory bank 603. In various embodiments, ECC is used to identify and/or correct bit errors in both the memory array and the redundant memory. As the ECC discovers bit errors, additional lines may be marked valid and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for memory array 601. These endurance mechanisms are applied to memory array 601 to maximize usage of such memory.

FIG. 6B illustrates flowchart 620 of memory endurance for the PE and FE memory, in accordance with some embodiments. While the blocks in flowchart 620 are illustrated in a particular order, the order can be modified. For example, some blocks may be performed before others based on whether read or write operations are being performed. As described herein, the various blocks can be implemented in hardware, software, or a combination of them.

At block 621, controller logic 606 sends a memory request to memory array 601. This request may be a read request or a write request. If it is a write request, controller logic 606 applies the wear leveling scheme at block 622. In some embodiments, the wear leveling scheme is linear in that a gap word or gap cache line is swapped with an adjacent word or cache line. In some embodiments, wear leveling is dithered as indicated by block 622a. In one such embodiment, the index or pointer to gap word or gap cache line is used to swap the gap word or gap cache line with either an adjacent cell with one higher index or address or with an adjacent cell with one lower index or address. As such, wear leveling is dithered.

In some embodiments, wear leveling is randomized. In one such embodiment, a random index is generated at block 622b. This random index is then used to swap the gap word or gap cache line with an adjacent or a non-adjacent word or cache line. In some embodiments, the random index is dithered. This dithered random index is then used for wear leveling.

In some embodiments, if the memory request is a read access (as indicated by block 625), outlier compensation is applied as indicated by block 626. At block 626, controller logic 606 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, controller logic 606 checks the valid bit, if the valid bit is set then the data is stored in the redundant memory rather than the memory array or memory bank 603. In various embodiments, ECC is used to identify and/or correct bit errors in both the memory array and the redundant memory. As the ECC discovers bit errors, additional lines may be marked valid and the data stored in the redundant memory location rather than the memory. After ECC is applied, the requested data is provided to controller logic 606 as indicated by block 627. The memory endurance for non-linear polar material based memory is enhanced by the endurance mechanisms of various embodiments. This allows more read and write operations to memory before any memory block, bank, or word becomes unreliable. In various embodiments, the capacitors for each bit-cell in memory array 601 (which can also be a PE memory) are arranged in a stack and fold manner.

Figure 7:
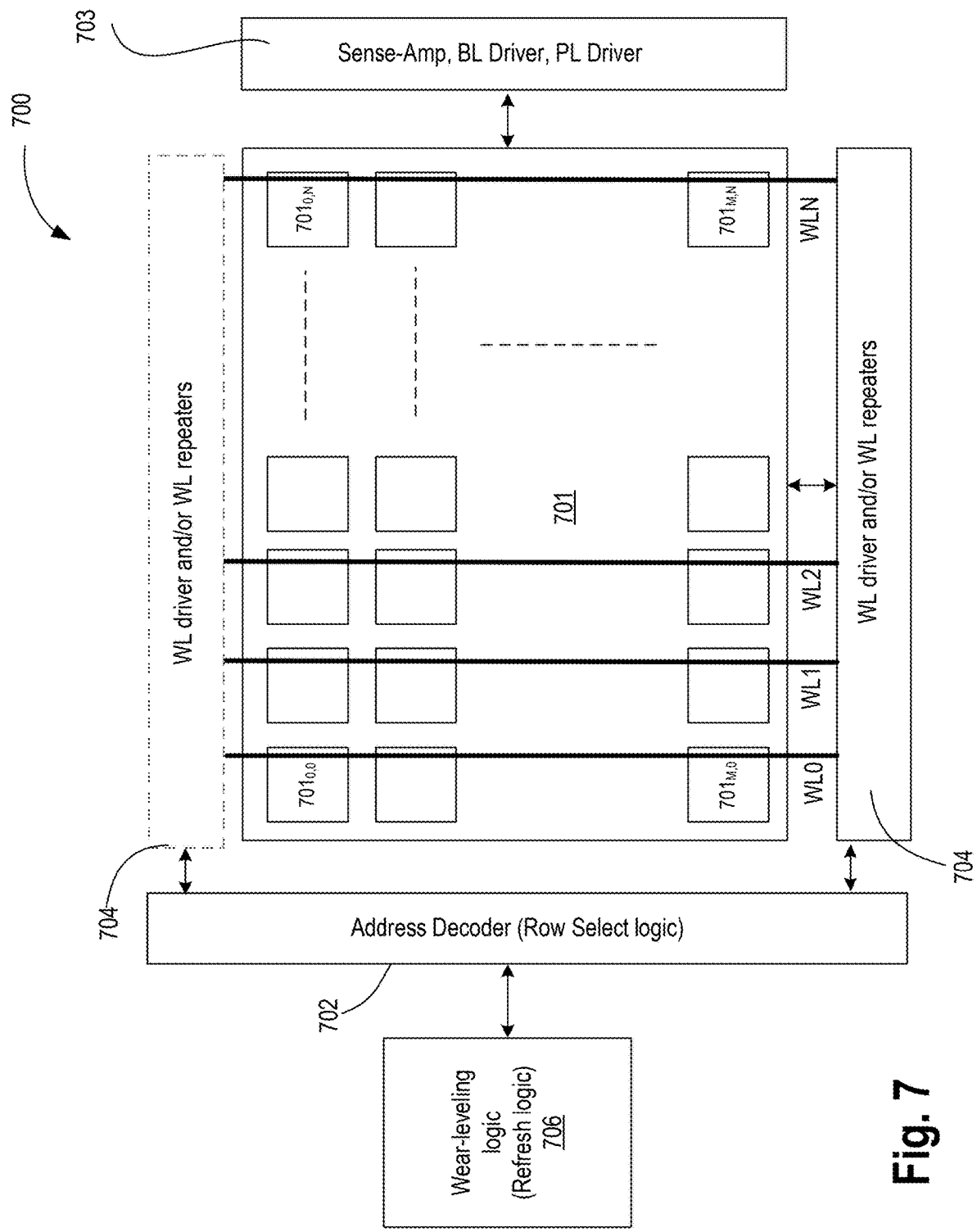
FIG. 7 illustrates an M×N memory array of bit-cells and corresponding periphery circuitry, and with buried word-lines, in accordance with some embodiments.

FIG. 7 illustrates apparatus 700 with an M×N memory array of bit-cells and corresponding periphery circuitry, and with buried word-lines, in accordance with some embodiments. Apparatus 700 comprises memory array 701 of bit-cells (e.g., M×N memory array), logic circuitry 702 for address decoding, and logic circuitry 703 for sense amplifier, write drivers, and plate-line (PL) drivers. In some embodiments, plate-lines PL0, PL1 through PLN are parallel to word-lines WL0, WL1, through WLM while bit-lines BL0, BL1 through BLN are orthogonal to the plate-lines and the word-lines, where 'N' is a number greater than 1. In some embodiments, plate-lines PL0, PL1 through PLN are parallel to bit-lines BL0, BL1 through BLN, while word-lines WL0, WL1, through WLM are orthogonal to the plate-lines and the bit-lines, where 'N' is a number greater than 1. In the example embodiments, plate-lines run parallel to the bit-lines (i.e., PL∥BL). In some embodiments, individual memory bit-cells in memory array 701 are organized in rows and columns. For example, memory bit-cells $701_{0,0}$ through $701_{M,N}$ are organized in an array.

In some embodiments, an individual memory bit-cell (e.g., $701_{0,0}$) is a 1TnC bit-cell where an access transistor is controlled by a word-line. An example of a 1TnC bit-cell is described with reference to FIGS. 10A-B. In some embodiments, an individual memory bit-cell (e.g., $701_{0,0}$) is a multi-element FE gain bit-cell. An example of a 1TnC bit-cell is described with reference to FIGS. 11A-B. In some embodiments, an individual memory bit-cell (e.g., $701_{0,0}$) is a multi-element FE gain bit-cell, where an individual capacitor of the bit-cell is connected to a transistor switch. An example of such a memory bit-cell is described with reference to FIG. 12. In some embodiments, an individual memory bit-cell (e.g., $701_{0,0}$) is a multi-element gain bit-cell where the capacitor is replaced with a memory element. An example of such a memory bit-cell is described with reference to FIG. 14A. In some embodiments, an individual memory bit-cell (e.g., $701_{0,0}$) is a multi-element gain bit-cell where the capacitor is replaced with a memory element (ME), and an individual capacitor is connected to a switch. An example of such a memory bit-cell is described with reference to FIG. 14B.

In some embodiments, memory array 701 uses buried WLs that eliminate the space for word-line strapping cells between bit-cells. The buried WLs also reduce the number of dummy bit-cells that were added because of the word-line strapping cells. In some embodiments, memory array 701 comprises word-line(s) positioned under the access transistor, wherein the access transistor is controllable by the word-line. For example, word-line is buried under bit-cells $701_{0,0}$ through $701_{M,0}$. This buried word-line is then coupled to a word-line driver. In various embodiments, the buried word-line is routed from under the access transistor to a word-line driver. When the buried word-line reaches a memory periphery area where the word-line driver is located, the buried word-line is then connected to the word-line driver using buried vias, in accordance with some embodiments. In some embodiments, the buried word-line is coupled to a metal layer above an active device (e.g., transistors of the word-line driver) to connect to the word-line driver. The word-line driver may reside in the periphery such as the word-line driver in logic area 704. In various embodiments, the plurality of capacitors of each bit-cell is positioned above the access transistor. In some embodiments, the buried word-line is routed from under the access transistor to a word-line repeater. When the buried word-line reaches the area where the word-line repeater is located, the buried word-line is then connected to the word-line repeater using buried vias, in accordance with some embodiments. In some embodiments, the buried word-line is coupled to a metal layer above an active device (e.g., transistors of the word-line driver) to connect to the word-line repeater. As such, word-line remains buried for most of its routing, but comes up to connect with active devices of the word-line repeater or drivers. In some embodiments, the word-line remains buried and is connected to active devices of the word-line repeater or drivers by buried vias that directly connect to source, drain, or gate of an active device.

In some embodiments, the individual bit-cell has an individual boundary which substantially abuts a neighboring bit-cell in the row or column such that there is no dummy bit-cell between individual bit-cell and the neighboring bit-cell. For example, there are no dummy bit-cells between individual bit-cells $701_{0,0}$ through $701_{M,0}$ of the plurality of bit-cells in a row or column. In some embodiments, the individual bit-cell has an individual boundary which substantially abuts a neighboring bit-cell in the row or column such that there is no gap area between individual bit-cells and the neighboring bit-cell to strap the word-line. For example, there are no word-line strapping cell(s) between individual bit-cells $701_{0,0}$ through $701_{M,0}$ of the plurality of bit-cells in a row or column. In various embodiments, the word-line is routed from under the access transistor to a word-line driver or repeater.

Figure 8:
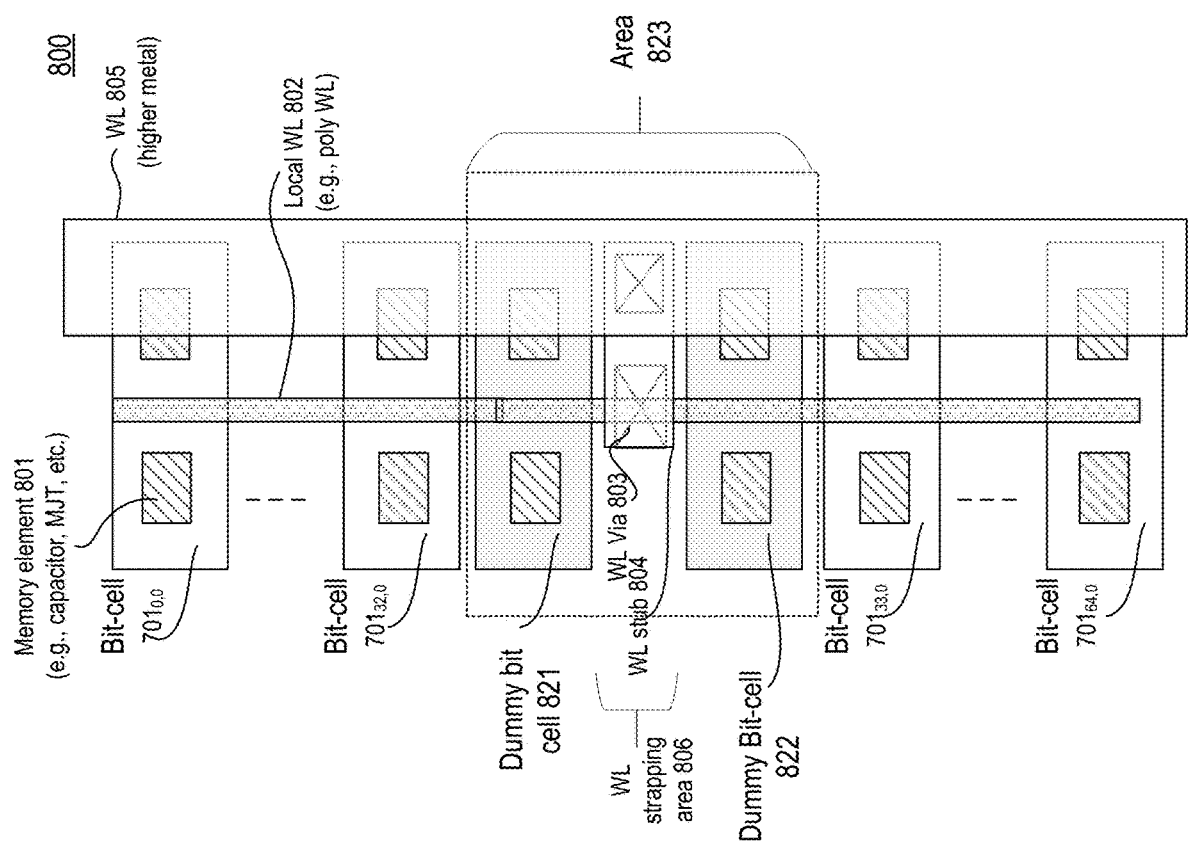
FIG. 8 illustrates apparatus comprising a memory row or column with unburied word-line.

FIG. 8 illustrates apparatus 800 comprising a memory row or column with a word-line. In some embodiments, each bit-cell (e.g., $701_{0,0}$) includes a plurality of capacitors or memory elements (MEs) indicated by memory element 801. In a stacked and folded configuration there may be multiple memory elements along a point of fold. In this example, the top view shows two memory elements that are shaded within a memory bit-cell. In some embodiments, a memory bit-cell may be a 1T1C bit-cell or a 1T1ME bit cell. In that case, the bit-cell may have a memory element. In some embodiments, for a 1TnC configuration or when multiple capacitors are used per bit-cell, those capacitors can be vertically stacked. In one such case, the top view of the bit-cells may show on memory element 801 (because other memory elements are vertically stacked over it). These capacitors may include non-linear polar material, in accordance with some embodiments. In some embodiments, an individual bit-cell includes a route for local WL 802. Local WL 802 may be drawn on a lower-level metal or even poly. Generally, lower-level metal layers and poly follow design rules that allow for compact bit-cell design. Local WL 802 may be connected to a gate node of an access transistor. This connection to the gate may be made using poly.

Apparatus 800 illustrates part of a memory row where every 32 bit-cells, an area is dedicated for word-line strapping. As discussed herein, word-line strapping is used to couple local WL 802 with WL 805 on higher-level metal through one or more vias 803 and/or WL stub 804. WL stub 804 is used to connect one or more vias 803 to WL 805 though one or more additional vias, for example. This local word-line coupling to main or high-level WL 805 occurs in WL strapping area 806. In some cases, WL strapping area 806 is also referred to as a word-line strapping cell. Because of the discontinuity in the placement of bit-cells in a row or column caused by WL strapping area 806, a process technology node may recommend inserting dummy or non-functional bit-cells 821 and/or 822 at locations that neighbor a functional bit-cell. In this example, dummy or non-functional bit-cell 821 is added adjacent to bit-cell $701_{32,0}$ and dummy or non-functional bit-cell 822 is added adjacent to bit-cell $701_{33,0}$. While the example is illustrated with reference to inserting WL strapping cells every 32 bit-cells, a process technology node or other design constraints may dictate insertion of WL strapping cells at other intervals. The frequent use of the word-line strapping cell and dummy bit-cells take up valuable silicon area. Here, this area is indicated as area 823. Word-line strapping may also occur adjacent to end bit-cells. Here $701_{0,0}$ and $701_{64,0}$ are examples of end bit-cells. Area 823 is a significant space dedicated for WL strapping and dummy bit-cells.

FIGS. 9A-G illustrate various embodiments of using buried word-lines to improve parasitic and area of a memory. The memory bit-cells here can be any bit-cell such as magnetic random-access memory (MRAM) based bit-cell, resistive RAM (ReRAM) based bit-cell, 1T1C based bit-cell, 1T1ME based bit-cell, where ME is a memory element, 1TnC based bit-cell, 1TnME based bit-cell, 2TnC based bit-cell, 2TnME based bit-cell, a DRAM based bit-cell, etc. The capacitor can be any suitable capacitor such as metal-insulation-metal (MIM) based capacitor, ferroelectric based capacitor, paraelectric based capacitor, transistor-based capacitor, etc. The capacitor or memory element can be fabricated in a backend-of-line (BEOL) of a die. When multiple capacitors or memory elements are used per bit-cell, those capacitors or memory elements can be stacked vertically or positioned in a stacked and folded configuration. The use of buried word-line as described herein can be used with any or all such memory bit-cell configurations. In some embodiments, the buried word-line is coupled to a local word-line (e.g., unburied word-line) through a buried via. This buried via can be located within a boundary of a memory bit-cell, in accordance with some embodiments. In some embodiments, this buried via may be positioned in a strap cell area. In some embodiments, there may be more than one buried vias within a column of memory bit-cells that are controlled by the same word-line. In some embodiments, the buried vias may be staggered diagonally in a memory array. In some embodiments, the buried vias may be aligned in a memory array. For example, the buried vias are along a same line on an axis in a memory array. In some embodiments, the buried word-lines extend towards the word-line drivers. Upon reaching the word-line drivers, one or more buried vias may couple the buried word-lines to their respective word-line drivers. The various such embodiments are described herein.

Figure 9A:
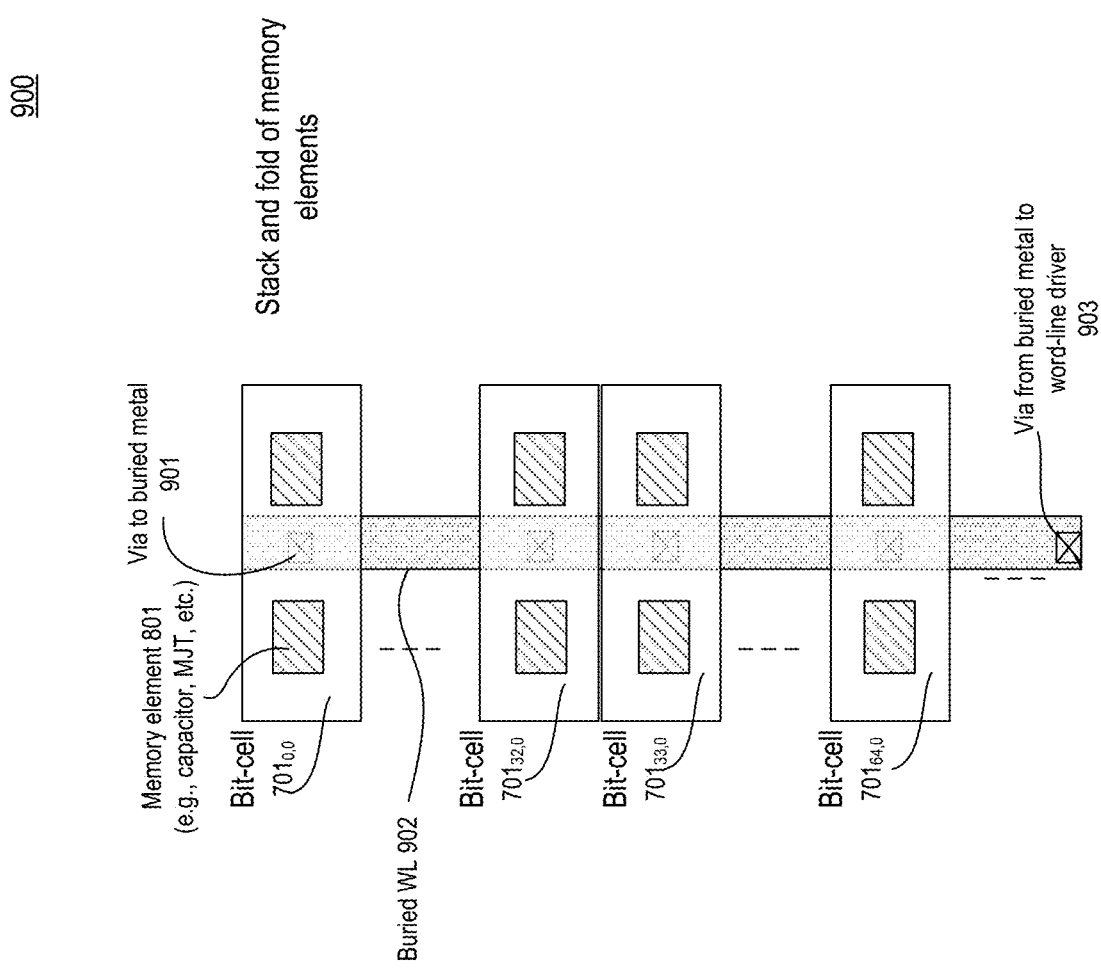
FIG. 9A illustrates apparatus comprising a memory row or column with buried word-line connected to bit-cells through buried vias, in accordance with some embodiments.

FIG. 9A illustrates apparatus 900 comprising a memory row or column with buried word-lines, in accordance with some embodiments. In some embodiments, buried via 901 is coupled to buried WL 902 to couple to a gate of an access transistor. Any suitable technology may be used to coupling via 901 the gate of the access transistor. Compared to apparatus 800, most or all local WL 802 is buried under the bit-cells as shown by buried WL 902. In some embodiments, buried WL 902 comprises metal (e.g., Cu, Ag, Al, Au, W, Co, Pt, or a combination of them) which allow a process technology node to use silicon area under the transistor or active area. In some embodiments, buried WL 902 is connected to local metal (e.g., metal above active devices) or poly above transistor region through buried via 901. In some embodiments, a buried via (e.g., buried via 901) is connected to buried WL 902 for each memory bit-cell in the row or column along the direction of buried WL 902. In some embodiments, buried WL 902 is connected by buried via 901 to a source or drain of a transistor, which is part of a word-line driver. In some embodiments, buried via 901 is not connected to buried WL for each memory bit-cell. Instead, one or more (but not all) memory bit-cells have an associated buried via 901 that couples to buried WL 902 so that a local word-line (e.g., metal or poly) above the active devices can couple to the gate of a device (e.g., access transistor) of the memory bit-cell(s). In various embodiments, buried word-lines extend towards word-line drivers that may be towards one or the other end of the word-lines. Upon reaching the word-line driver, buried WL 902 is then coupled to the word-line driver through buried via 903.

In some embodiments, buried via 901 and/or buried via 903 comprise Cu, Ag, Al, Au, W, Co, Pt, or a combination of them. In some embodiments, buried WL 902 is at a metal layer level which is equivalent to Metal 0 (M0) or Metal 1 (M1) of a traditional frontend-of-line metal layers, but under the transistor active region. In some embodiments, buried WL 902 is at a metal layer level which is equivalent to higher metal layers in traditional frontend-of-line metal layers, but under the transistor active region.

By using buried WL 902, connection to word-line driver, a memory array can be made without WL strapping cells. Since WL strapping cells may not be inserted, there may be no discontinuity or break in the placement of bit-cells in a row or column. For similar reasons, insertion of dummy bit-cells is also avoided. As such, bit-cells can be packed closer to one another in a row or column such that their boundaries are substantially abutting each other. For instance, bit-cells abut each other. The use of buried WL 902 allows for smaller memory area, avoids implementing process steps that require populating via in the memory array region that needs to then escape vertically up (effectively occupying the real-estate where memory element should have resided), allows for relaxed design rules for layout, and provides higher performance for the memory because more memory can be packed in the same area than when word-line strapping cells and/or dummy cells were used in between functional bit-cells. In some embodiments, buried metal lines may be placed every few bit-cells to optimize (i.e., reduce) parasitics of routes going to every bit-cell.

Figure 9B:
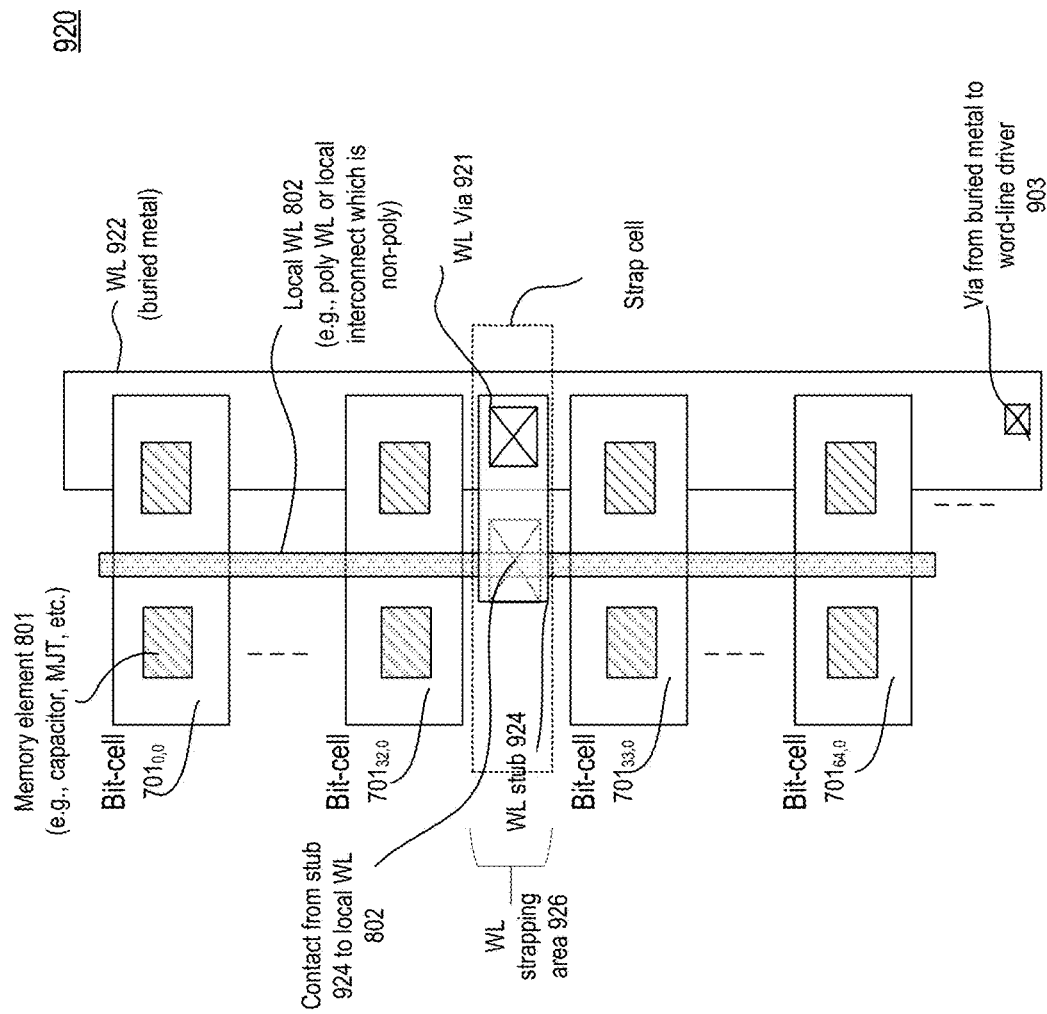
FIG. 9B illustrates apparatus comprising a memory row or column with buried word-line connected to a local word-line through a strap cell and stub, in accordance with some embodiments.

FIG. 9B illustrates apparatus 920 comprising a memory row or column with buried word-line connected to a local word-line through a strap cell and stub, in accordance with some embodiments. Compared to FIG. 9A, here buried WL 922 extends under the bit-cells such that one or more strap cells are placed along the column or row of the bit-cells. In this example, there is strap cell 926 every 32 bit-cells in the row. In various embodiments, strap cell 926 occupies WL strapping area 806, where buried via 921 couples to buried WL 922 at one end and to a local WL 802 at another end through WL stub 924. WL stub 924 may be poly or a local metal above the active devices. Apparatus 920 uses less area than apparatus 800 because there are no dummy bit-cells. One reason for not using dummy bit-cells even though there is a break or gap between a set of bit-cells (e.g., every 32 bit-cells) is that the strap cell is much smaller. Like in FIG. 9A, buried WL 922 extends towards word-line drivers that may be towards one or the other end of the word-lines. Upon reaching the word-line driver, buried WL 922 is then coupled to the word-line driver through buried via 903.

In some embodiments, buried via 921 and/or 903 comprise Cu, Ag, Al, Au, W, Co, Pt, or a combination of them. In some embodiments, buried WL 922 is at a metal layer level which is equivalent to Metal 0 (M0) or Metal 1 (M1) of a traditional frontend-of-line metal layers, but under the transistor active region. In some embodiments, buried WL 922 is at a metal layer level which is equivalent to higher metal layers in traditional frontend-of-line metal layers, but under the transistor active region.

Figure 9C:
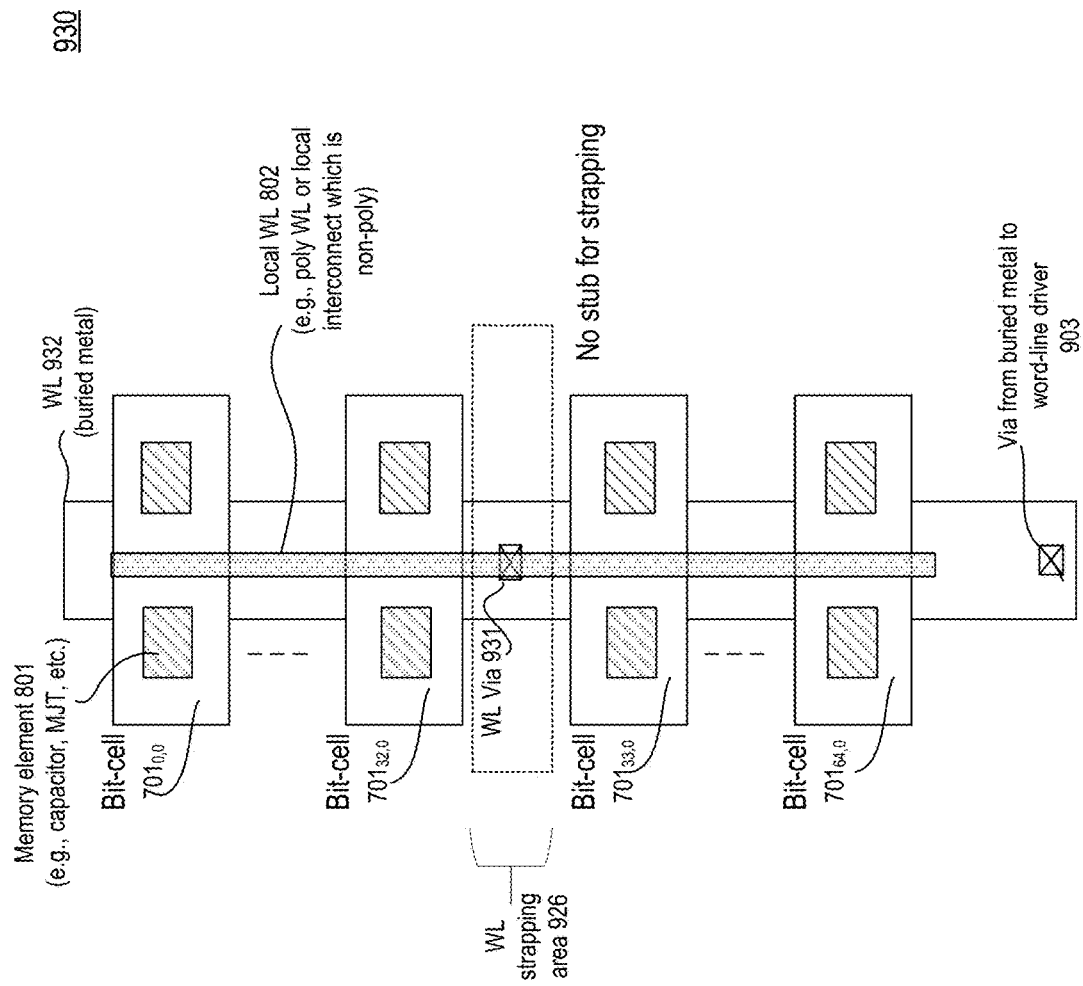
FIG. 9C illustrates apparatus comprising a memory row or column with buried word-line connected to a local word-line through a strap cell and without a stub, in accordance with some embodiments.

FIG. 9C illustrates apparatus 930 comprising a memory row or column with buried word-line connected to a local word-line through a strap cell and without a stub, in accordance with some embodiments. FIG. 9C is similar to FIG. 9B. Here, there is no WL stub which further reduces the area of strap cell 926. In some embodiments, buried WL 932 is under local WL 802. As such, WL via 931 is used to connect local WL 802 to buried WL 932. Like in FIG. 9B, buried WL 932 extends towards word-line drivers that may be towards one or the other end of the word-lines. Upon reaching the word-line driver, buried WL 932 is then coupled to the word-line driver through buried via 903.

In some embodiments, buried via 931 comprises Cu, Ag, Al, Au, W, Co, Pt, or a combination of them. In some embodiments, buried WL 932 is at a metal layer level which is equivalent to Metal 0 (M0) or Metal 1 (M1) of a traditional frontend-of-line metal layers, but under the transistor active region. In some embodiments, buried WL 932 is at a metal layer level which is equivalent to higher metal layers in traditional frontend-of-line metal layers, but under the transistor active region.

Figure 9D:
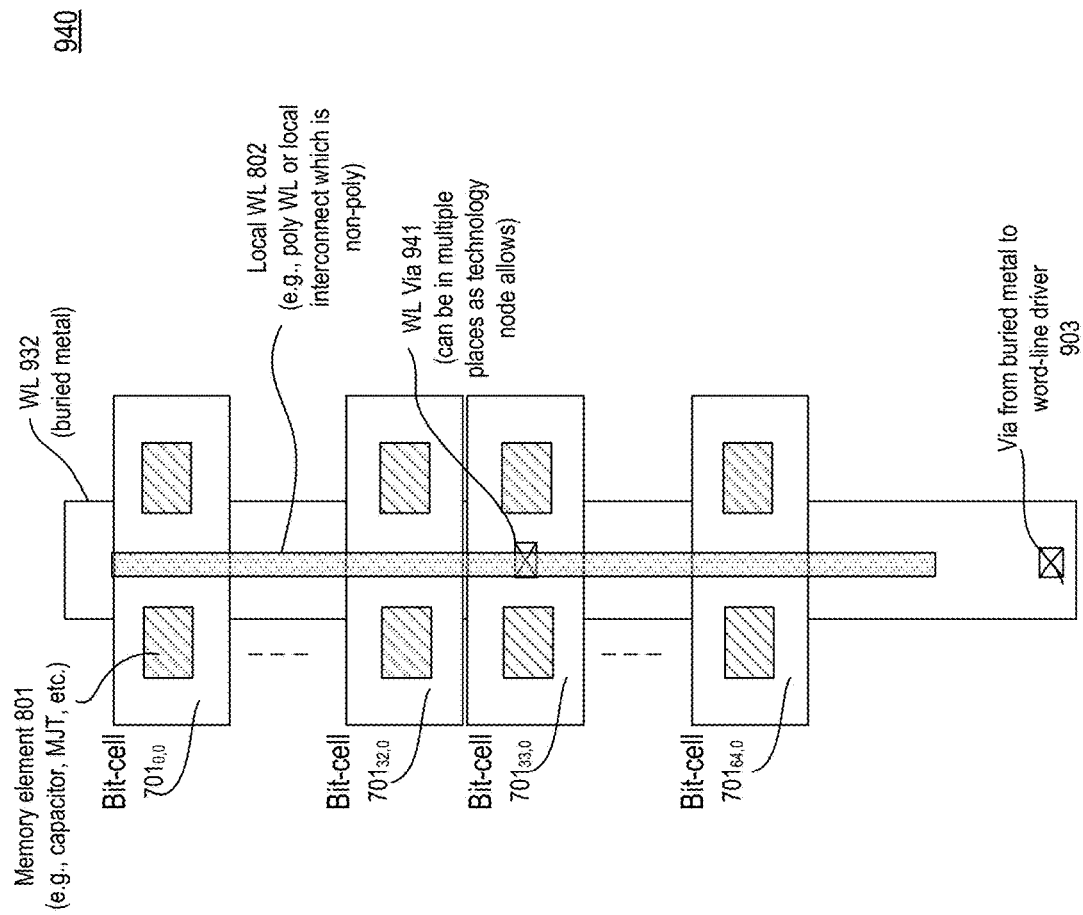
FIG. 9D illustrates apparatus comprising a memory row or column with buried word-line connected to a local word-line through a buried via without strap cell, in accordance with some embodiments.

FIG. 9D illustrates apparatus 940 comprising a memory row or column with buried word-line connected to a local word-line through a buried via without strap cell, in accordance with some embodiments. FIG. 9D is similar to FIG.

9C. Here, there are no strap cell and bit-cells abut each other along a column or row. In some embodiments, one or more buried vias 941 connect to buried WL 932. One or more buried vias 941 connect to local WL 802 at its other end. Like in FIG. 9C, buried WL 932 extends towards word-line drivers that may be towards one or the other end of the word-lines. Upon reaching the word-line driver, buried WL 932 is then coupled to the word-line driver through buried via 903.

In some embodiments, one or more buried vias 941 comprises Cu, Ag, Al, Au, W, Co, Pt, or a combination of them. In some embodiments, buried WL 932 is at a metal layer level which is equivalent to Metal 0 (M0) or Metal 1 (M1) of a traditional frontend-of-line metal layers, but under the transistor active region. In some embodiments, buried WL 932 is at a metal layer level which is equivalent to higher metal layers in traditional frontend-of-line metal layers, but under the transistor active region.

Figure 9E:
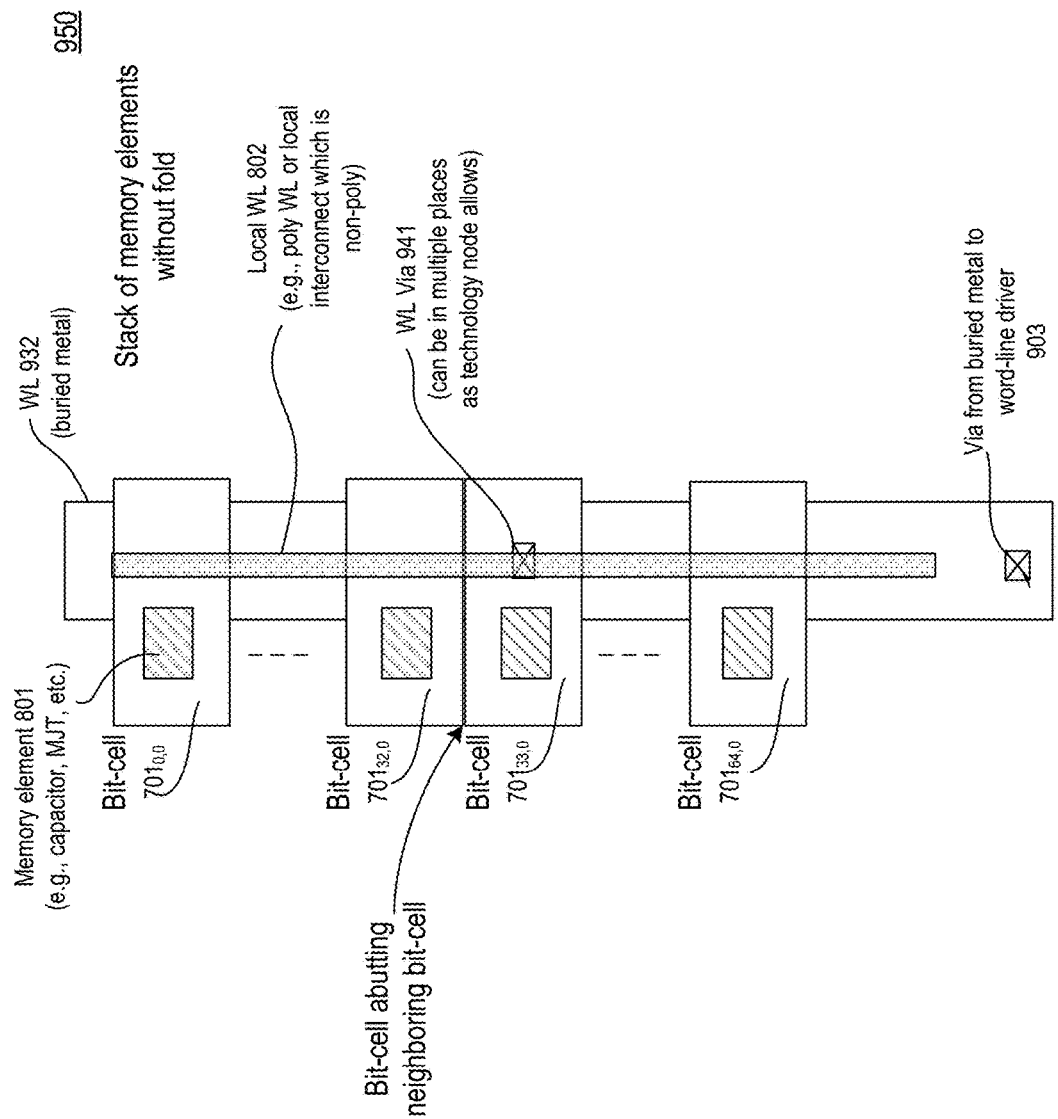
FIG. 9E illustrates apparatus comprising a memory row or column with buried word-line connected to a local word-line through a buried via without strap cell, in accordance with some embodiments.

FIG. 9E illustrates apparatus 950 comprising a memory row or column with buried word-line connected to a local word-line through a buried via without strap cell, in accordance with some embodiments. FIG. 9E is similar FIG. 9D. Here, an individual memory bit-cell is illustrated having one memory element 801. For example, the memory bit-cell may be a 1T1C or a 1T1ME bit-cell. In some embodiments, an individual bit-cell is a 1TnC or a 2TnC bit-cell with the memory elements being vertically stacked. For instance, individual memory elements are a stack of memory elements without folding configuration.

Figure 9F:
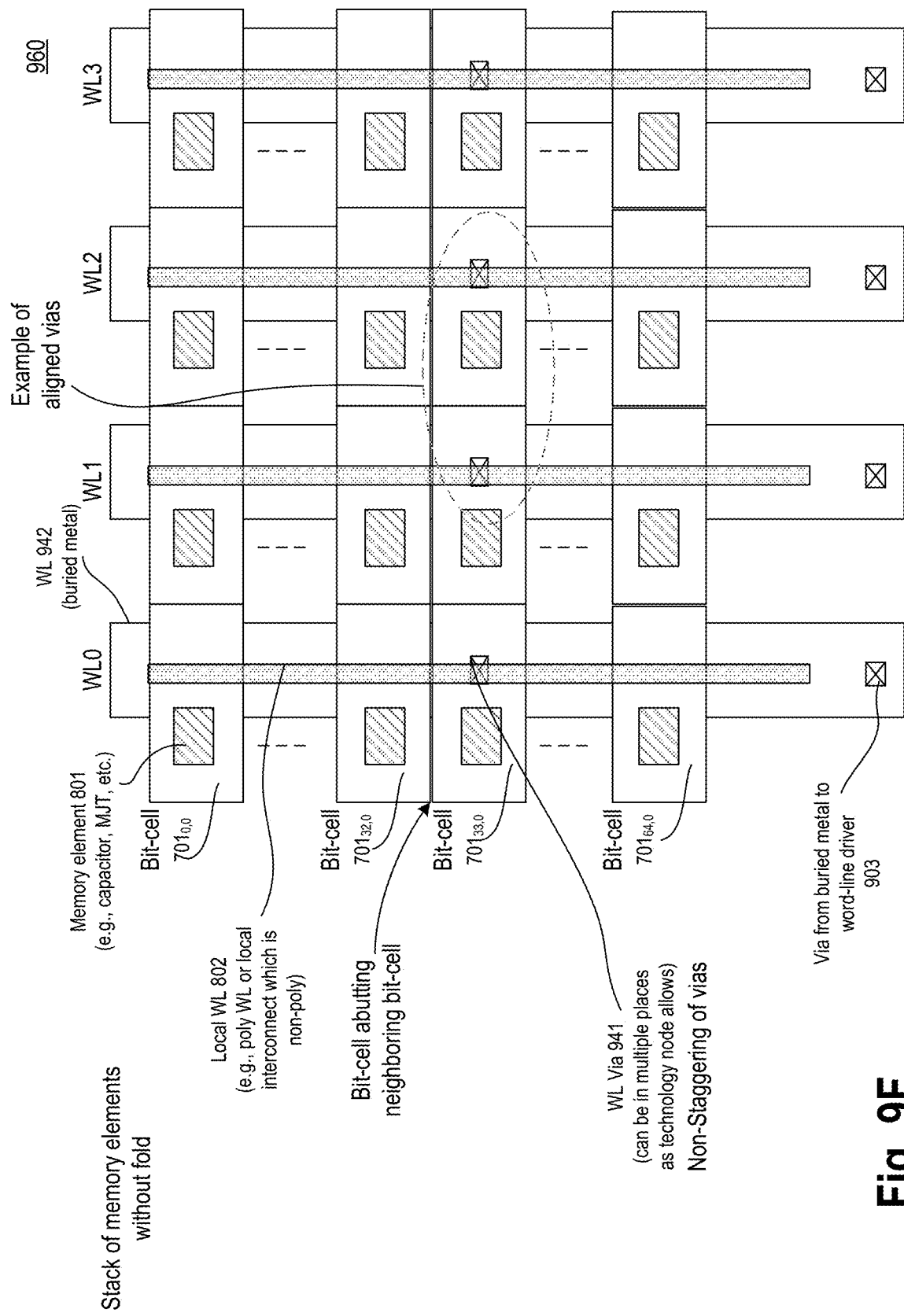
FIG. 9F illustrates an apparatus comprising an array of memory bit-cells where local word-lines are coupled to the respective buried word-lines through non-staggered buried vias, in accordance with some embodiments.

FIG. 9F illustrates apparatus 960 comprising an array of memory bit-cells where local word-lines are coupled to the respective buried word-lines through non-staggered buried vias, in accordance with some embodiments. In this example, a 4×4 memory array is illustrated. Each column of bit-cells has an associated buried word-line 942 which is coupled to a local WL 802 by one or more buried vias 941. In some embodiments, the buried one or more buried vias are non-staggered. For example, one or more buried vias 941 are aligned across the array. In some embodiments, one or more buried vias 903 are also non-staggered or are aligned across the buried word-lines near the respective word-line drivers. In some embodiments, even word-lines (e.g., WL0, WL2, etc.,) have corresponding WL drivers at one end (e.g., the south end), while old word-lines (e.g., WL1, WL3, etc.,) have corresponding WL drivers at the other end of the WLs. In one such example, the one or more buried vias 903 for even word-lines are aligned relative to one another while the one or more buried vias 903 for odd word-lines are aligned relative to one another.

Figure 9G:
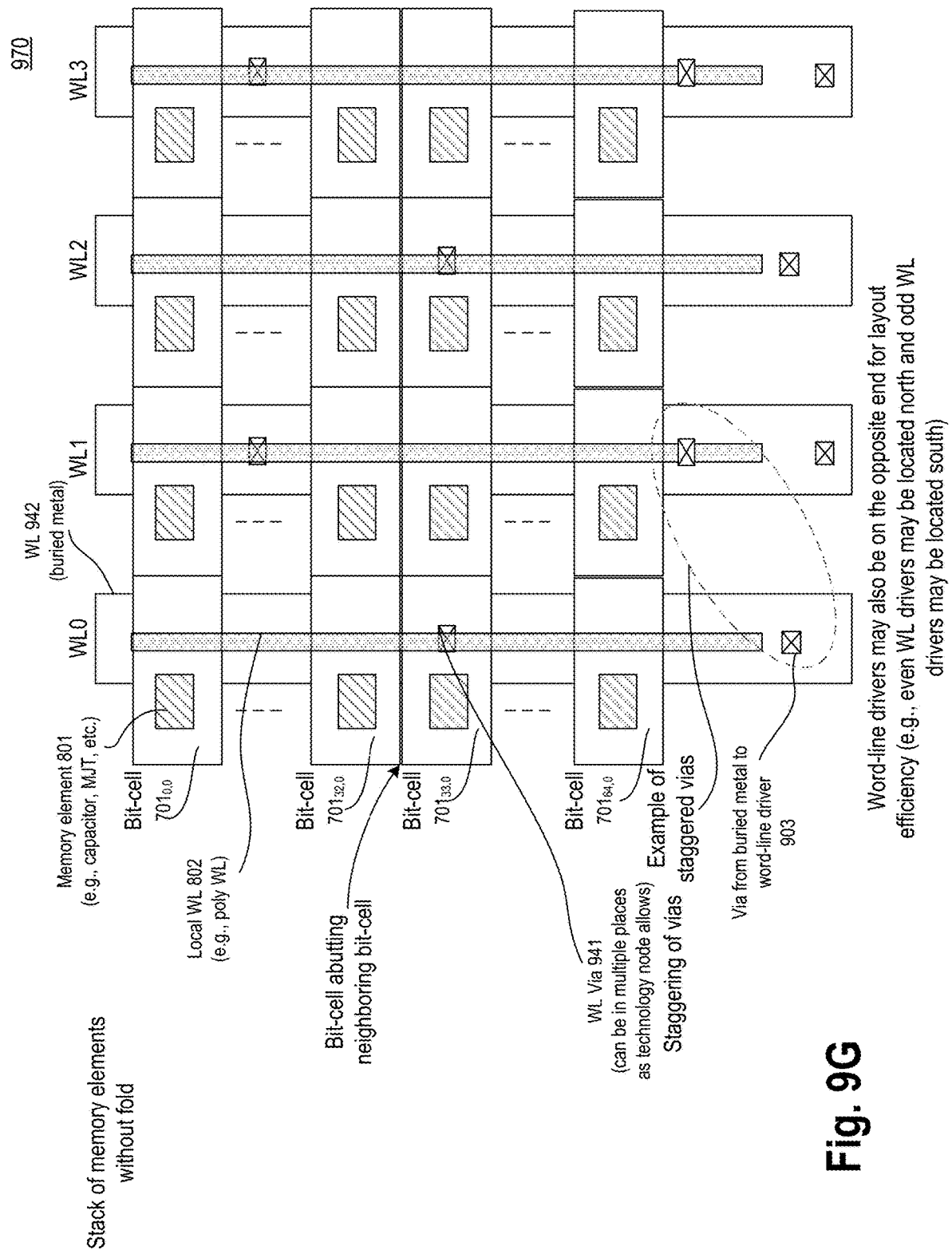
FIG. 9G illustrates an apparatus comprising an array of memory bit-cells where local word-lines are coupled to the respective buried word-lines through staggered buried vias, in accordance with some embodiments.

FIG. 9G illustrates apparatus 970 comprising an array of memory bit-cells where local word-lines are coupled to the respective buried word-lines through staggered buried vias, in accordance with some embodiments. Apparatus 970 is similar to apparatus 960 but with staggered buried vias. In some embodiments, process technology nodes may have rules that may restrict aligned vias for neighboring bit-cells across a memory array. In that case, one or more buried vias 941 are staggered or misaligned relative to one another. For example, one or more buried vias 941 for even WLs are not aligned relative to one or more buried vias 941 for odd WLs. In some embodiments, one or more buried vias 903 for even word-lines are aligned relative to one another while the one or more buried vias 903 for odd word-lines are aligned relative to one another.

FIG. 10A illustrates 1TnC bit-cell 1000 comprising non-linear polar material for its capacitors, where plate-lines are parallel to the bit-line, in accordance with some embodiments. In some embodiments, 1TnC bit-cell 1000 (e.g., 701$_{0,0}$) comprises one select transistor MN$_1$ and a plurality of capacitors Cfe1, Cfe2, through Cfen (where 'n' is a number greater than 1) comprising non-linear polar material (e.g., ferroelectric, paraelectric, or non-linear dielectric). The capacitors can be a planar or non-planar capacitor as described with reference to various embodiments. In some embodiments, the plurality of capacitors Cfe1, Cfe2, . . . Cfen are stacked and folded capacitors.

The gate terminal of transistors MN$_1$ is controllable by WL. In some embodiments, BL is coupled to a source or drain terminal of transistor MN1. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_$n$. In some embodiments, the plurality of capacitors is coupled to storage node sn1, which is coupled to a drain or source terminal of transistor MN1. For example, a first terminal of capacitor Cfe1 is coupled to PL0_1 and a second terminal of capacitor Cfe1 is coupled to storage node sn1. In some embodiments, apparatus 700 has an n-number of PLs (e.g., PL0_1 through PL0_$n$) per column which are parallel to a BL for that column.

While the various embodiments are illustrated with reference to an n-type transistor, the embodiments are also applicable to a p-type transistor or a combination of n-type or p-type transistors. A person skilled in the art would appreciate that when a transistor of a different conductivity type is used than what is shown in FIG. 10A, then driving logic for BL, PLs, and/or WL may also change for proper read and/or write operations. In various embodiments, PLs are parallel to BL. For example, PL0_1, PL0_2, through PL0_$n$are parallel to BL. In some embodiments, transistor MN$_1$ is fabricated on the frontend of the die and capacitors are stacked over the transistor. For example, the capacitors are stacked along the z-direction and folded along the x-axis. The capacitors can be planar or non-planar capacitors. As such, a taller and wider bit-cell is formed with a footprint comparable to the footprint of the transistor MN1. In some embodiments, the x-y footprint is determined by the size of transistor MN$_1$ and its connections to BL, WL, and storage node sn1.

In some embodiments, PL (e.g., PL0_1, PL0_2, . . . PL0_$n$) controls which capacitor of the bit-cell is programmed, and the value of programming. In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In some embodiments, in standby mode (e.g., low power mode), the 1TnC bit-cell is not refreshed as there is no disturb mechanism during standby. In some embodiments, wear-leveling logic 706 provides one or more endurance mechanisms for the 1TnC memory bit-cells. One of the endurance mechanisms involves refreshing of the data content in the capacitor(s).

FIG. 10B illustrates 1TnC bit-cell 1020 comprising non-linear polar material for its capacitors, where plate-lines are parallel to the word-line, in accordance with some embodiments. 1TnC bit-cell 1020 is similar to 1TnC bit-cell 1000 but plate-lines are parallel to the word line.

FIG. 11A illustrates a multi-element FE gain bit-cell 1100 with plate-lines parallel to the bit-line, in accordance with some embodiments of the disclosure. In some embodiments, bit-cell 1100 (e.g., $701_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In various embodiments, the gate terminal of the n-type transistor $MN_1$ is coupled to WL (e.g., WL1). In some embodiments, the drain or source terminal of the n-type transistor $MN_1$ is coupled to BL. In various embodiments, first terminals of each of the capacitors Cfe1 through Cfen are coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at the sn1 node. In some embodiments, the source or drain terminal of transistor $MTR_1$ is coupled to SL (e.g., SL1). In some embodiments, a p-type transistor can be used as well for gain.

In some embodiments, second terminal of each of the capacitors Cfe1 through Cfen is coupled to a corresponding plate-line (PL). For example, the second terminal of Cfe1 is coupled to PL0_1, the second terminal of Cfe2 is coupled to PL0_2, and so on. Bit-cell 1100 has n-number of PLs (e.g., PL0_1 through PL0_n) per column which are parallel to a BL for that column, in accordance with some embodiments. In some embodiments, the SL is parallel to the PL. In some embodiments, the SL is parallel to the WL.

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen are pillar capacitors such as those discussed with reference to various embodiments herein. In some embodiments, the ferroelectric (or paraelectric) capacitors Cfe1 through Cfen are vertically stacked and horizontally folded allowing for tall bit-cells (e.g., higher in the z-direction) but with x-y footprint of two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cells compared to 1TnC bit-cells.

In this example, the x-y footprint is determined by the size of transistor $MN_1$ and its connections to BL, WL, and storage node sn1. In some embodiments, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In some embodiments, PL (e.g., PL0_1, PL0_2, . . . PL_n) controls which cell within the same access transistor gets programmed, and the value of programming. In some embodiments, BL acts as a sense-line. The voltage on BL (e.g., sense voltage) can create disturbance on other bit-lines during read operation. To mitigate such disturbances, in some embodiments, multi-element FE gain bit-cell (e.g., $701_{0,0}$) is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell (e.g., $701_{0,0}$) is not refreshed as there is no disturb mechanism during standby. In some embodiments, multi-element FE gain bit-cell (e.g., $701_{0,0}$) relies on isolating the read mode from BL or SL capacitance by isolating through access transistor MN1, where $MN_1$ transistor facilitates pre-charging the sn1 node, prior to read operation.

In some embodiments, there is a possibility of disturbance at the storage node sn1 during read operation. In some embodiments, PL is toggled for other capacitors to the average value of the disturbance that will be seen on the sn1 node, i.e., when a read pulse of some polarity is applied at PL of the capacitor to be read, a non-zero voltage is applied on other PLs of multi-element FE gain bit-cell (e.g., $701_{0,0}$), that matches the expected disturbance seen on the shared node. In one such example, the PL driver is configured to support driving different voltage levels on different PLs. In some embodiments, wear-leveling logic 706 provides one or more endurance mechanisms for the multi-element FE gain bit-cells. One of the endurance mechanisms involves refreshing of the data content in the capacitor(s).

FIG. 11B illustrates a multi-element FE gain bit-cell 1120 with plate-lines parallel to the word-line, in accordance with some embodiments of the disclosure. Multi-element FE gain bit-cell 1120 is similar to multi-element FE gain bit-cell 1100 but plate-lines are parallel to the word line.

Figure 12:
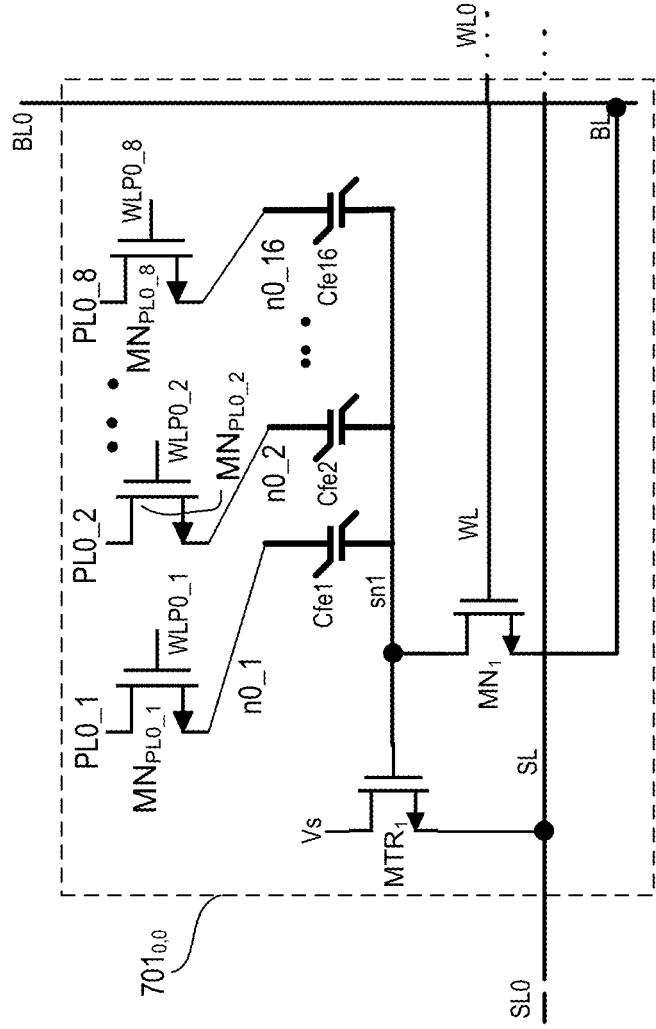
FIG. 12 illustrates a multi-element FE gain bit-cell with plate-line switches, in accordance with some embodiments of the disclosure.

FIG. 12 illustrates multi-element FE gain bit-cell 1200 with plate-line switches, in accordance with some embodiments of the disclosure. Bit-cell 1200 is like bit-cell 1100, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell in the memory array is organized in rows and columns. In this example, bit-lines run parallel to the plate-lines. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PL0}\_n$ is coupled to Cfen and plate-line PL0_n. Each transistor (or switch) is controlled separately, in accordance with some embodiments. In some embodiments, transistor $MN_{PLO\_1}$ is controllable by WLP0_1, transistor $MN_{PLO\_2}$ is controllable by WLP0_2, and so on. Likewise, transistor $MN_{PL0}\_n$ is controllable by WLP0_n. Here, WLP0_1 . . . . WLP0_nare the extensions of an address space. In this case, depending upon which storage element is being programmed or read, the corresponding WLP0_1 . . . WLP0_nare kept high (e.g., Vdd) whenever the plate-line voltage of 0V or Vdd is applied, while the unselected storage element sees 0V.

While the various embodiments are illustrated with reference to an n-type transistor or switch, the embodiments are also applicable to a p-type transistor or a combination of n-type or p-type transistors. A person skilled in the art would appreciate that when a transistor of a different conductivity type is used than what is shown in FIG. 12, then driving logic for BL, PLs, WL, and/or WLPs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, . . . and $MN_{PLO\_n}$, are fabricated in the backend of the die. In one such embodiment, the capacitor Cfe is fabricated between the frontend and the backend of the die. In one example, capacitors Cfe are vertically stacked capacitors and horizontally folded. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In some embodiments, capacitors Cfe1 and Cfe2 are stacked and folded. These backed transistors or switches can be fabricated using any suitable technology such as IGZO (indium gallium zinc oxide).

Figure 13:
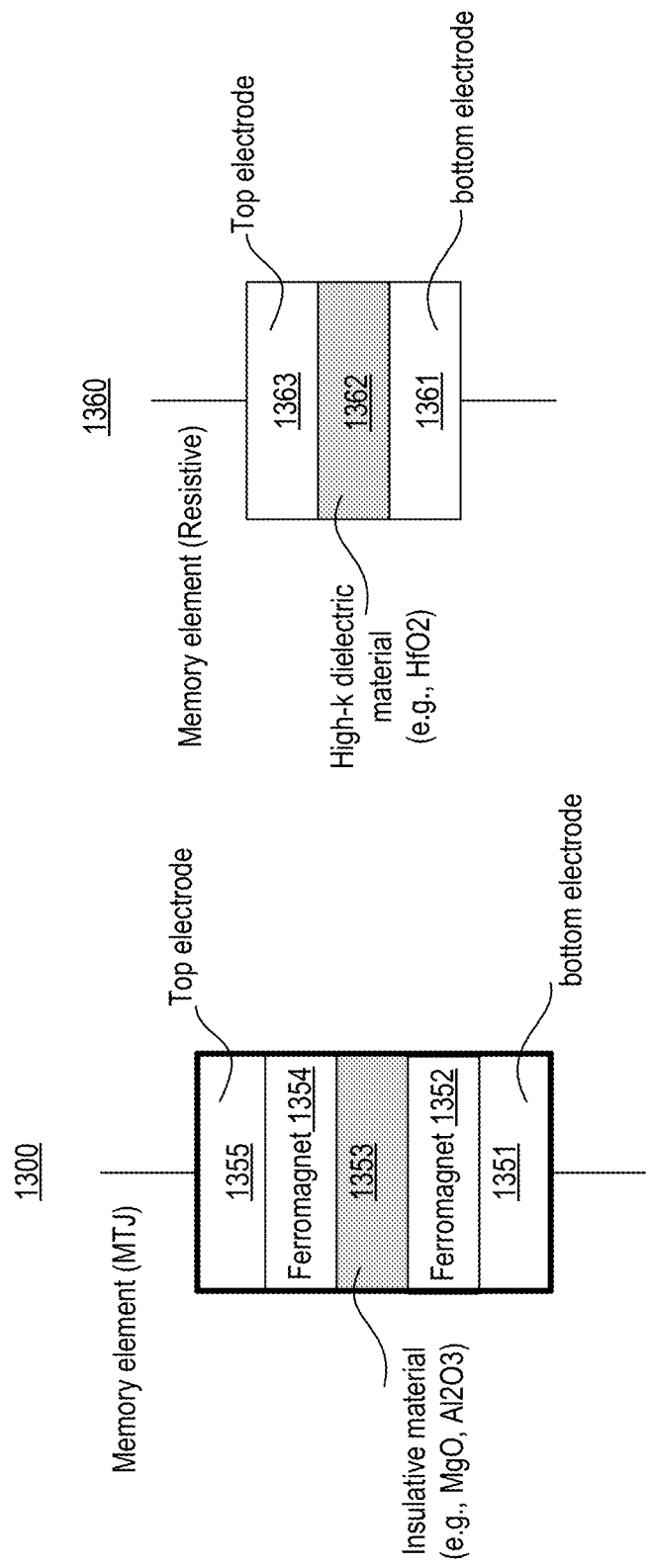
FIG. 13 illustrates memory elements (MEs) for use in memory bit-cells, and with buried word-line, in accordance with some embodiments.

FIG. 13 illustrates memory elements (MEs) 1300 and 1360, respectively, for use in memory bit-cells, in accordance with some embodiments. In some embodiments, planar memory element structures are resistive elements. In some embodiments, planar memory element structures are magnetic tunnel junctions (MTJs). In some embodiments, planar memory element structures are phase change memory (PCM) memories.

In some embodiments, memory element 1300 is a MTJ which comprises a bottom electrode 1351, free ferromagnetic layer 1352, insulative material 1353 (e.g., tunnel barrier materials such as MgO, Al2O3, SrTiO3), fixed ferromagnetic layer 1354, and top electrode 1355. In some embodiments, free ferromagnetic layer 1352 comprises one or more of CrO2, Heusler alloys, Fe, or CoFeB. In some embodiments, insulative material 1353 (also referred to as tunnel barrier) includes one of: MgO, AlOx (where x is a number or fraction), or SrTiO3. In some embodiments, fixed ferromagnetic layer 1354 includes one of CrO2, Heusler alloys, FeCo(001), or CoFeB. In some embodiments, an anti-ferromagnetic layer (not shown) is formed over fixed ferromagnetic layer 1354. In some embodiments, the anti-ferromagnetic (AFM) layer comprises Ru or Ir. In some embodiments, the AFM layer comprises a super lattice of Co and Pt coupled with Ru or Ir. In some embodiments, bottom electrode 1351 and top electrode 1355 includes one or more of: Al, Ti, Cu, Ag, Pt, TiN, TaN, Al doped ZnO, Ga-doped ZnO, or indium tin oxide (ITO). In some embodiments, bottom electrode 1351 and top electrode 1355 are symmetric. In some embodiments, bottom electrode 1351 and top electrode 1355 are asymmetric. In some embodiments, bottom electrode 1351 and top electrode 1355 may have the same materials as those discussed with reference to electrodes in FIG. 4B.

In some embodiments, memory element 1360 is a resistive memory (ReRAM) which comprises bottom electrode 1361, insulative material 1362, and top electrode 1363. In some embodiments, insulative material 1362 includes: HfOx, TiOx, TaOx, NiO, ZnOx, Zn2TiO4, KnOx, MgO, AlOx, ZrOx, CuxOy, SnOz, GeOx, LaOx, YOx, MoOx, or CoOx (where x and y are a number or a fraction). In some embodiments, insulative material 1362 for the ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In some embodiments, bottom electrode 1361 and top electrode 1363 includes one or more of: Al, Ti, Cu, Ag, Pt, TiN, TaN, Al doped ZnO, Ga-doped ZnO, or indium tin oxide (ITO). In some embodiments, bottom electrode 1361 and top electrode 1363 are symmetric. In some embodiments, bottom electrode 1361 and top electrode 1363 are asymmetric. In some embodiments, bottom electrode 1361 and top electrode 1363 may have the same materials as those discussed with reference to electrodes in FIG. 4B.

In ReRAM systems that use forming of filaments, an initial operation may begin by applying a voltage pulse with an increasing magnitude, between top electrode 1363 and bottom electrode 1361. The magnitude of the voltage pulse may be substantially greater than a voltage level utilized to cycle the ReRAM device during the regular course of programming. A high voltage pulse may be utilized to perform an intentional one-time breakdown process, known as forming. The forming process creates one or more conductive filaments that provide pathways for electron transport during device operation.

In some embodiments, memory element 1360 is a resistive memory such as a phase-change memory (PC-RAM). In some embodiments, phase-change memory comprises bottom electrode 1361, insulative material 1362, and top electrode 1363. In this case, insulative material 1362 is a phase-change material. In some embodiments, the phase-change material comprises phase-change chalcogenides. In some embodiments, the phase-change material includes one of: (GeTe)m(Sb2Te3)n, Ge2Sb2Te5, Ge2Sb2Te4, AgIn-SbTe, super lattices of GeTe, Sb2Te3, super lattices of TiTe2 and Sb2Te3, WSe2, WS2, or PtSe2 (where m and n are numbers or fractions). Other examples of the phase-change material includes binary transition metal oxides such as NiO or TiO2, perovskites such as Sr(Zr)TiO3 or PCMO, solid-state electrolytes such as GeS, GeSe, SiOx, or Cu2S, organic materials such as AlDCN, or layered materials such as hexagonal boron nitride.

In various embodiments, when the ME structures are not capacitors (as those described with reference to various embodiments herein), current based pulsing scheme(s) are used to drive (e.g., write) and for sensing (e.g., read). For example, plate-lines flow current to configure or read the ME structures. In some embodiments, the ME structures may be a mix of various types of ME structures (e.g., ferroelectric based capacitors, paraelectric based capacitors, MTJ, ReRAM, or PC-RAM). In some embodiments, all ME structures for an array are of the same type.

FIG. 14A illustrates a 1TnME bit-cell where plate-lines are parallel to the bit-line, in accordance with some embodiments. 1TnME bit-cell 1400 (which is a multi-element gain bit-cell) is the same as the multi-element FE gain bit-cell described herein, but with 16 memory elements and 16 associated plate-lines. In this case, the plate-lines are parallel to the bit-line.

FIG. 14B illustrates a 1TnME bit-cell where plate-lines are parallel to the word-line, in accordance with some embodiments. When ME devices are current-mode programmed (e.g., MTJ, ReRAM, PC-RAM), then having word-line parallel to the plate-line may use switches $MN_{PLO\_x}$ to enable column multiplexing from a memory programming and memory sensing perspective. In some embodiments, when the plate-line is parallel to the word-line, the switches may be removed. In that case, the internal nodes n0_1 through n0_16 are directly connected to respective plate-lines.

In some embodiments, the multi-element gain bit-cell does not have switches $MN_{PLO\_1}$ through $MN_{PLO\_16}$ as shown in FIG. 14A. In one such example, the internal nodes n0_1 through n0_16 are replaced with plate-lines. In 1TnME bit-cell 1420 (which is a multi-element gain bit-cell), the plate-lines are parallel to the bit-line and switches $MN_{PLO\_1}$ through $MN_{PLO\_16}$ are removed. This allows for efficient flow of current through the ME devices of the bit-cell.

Figure 15:
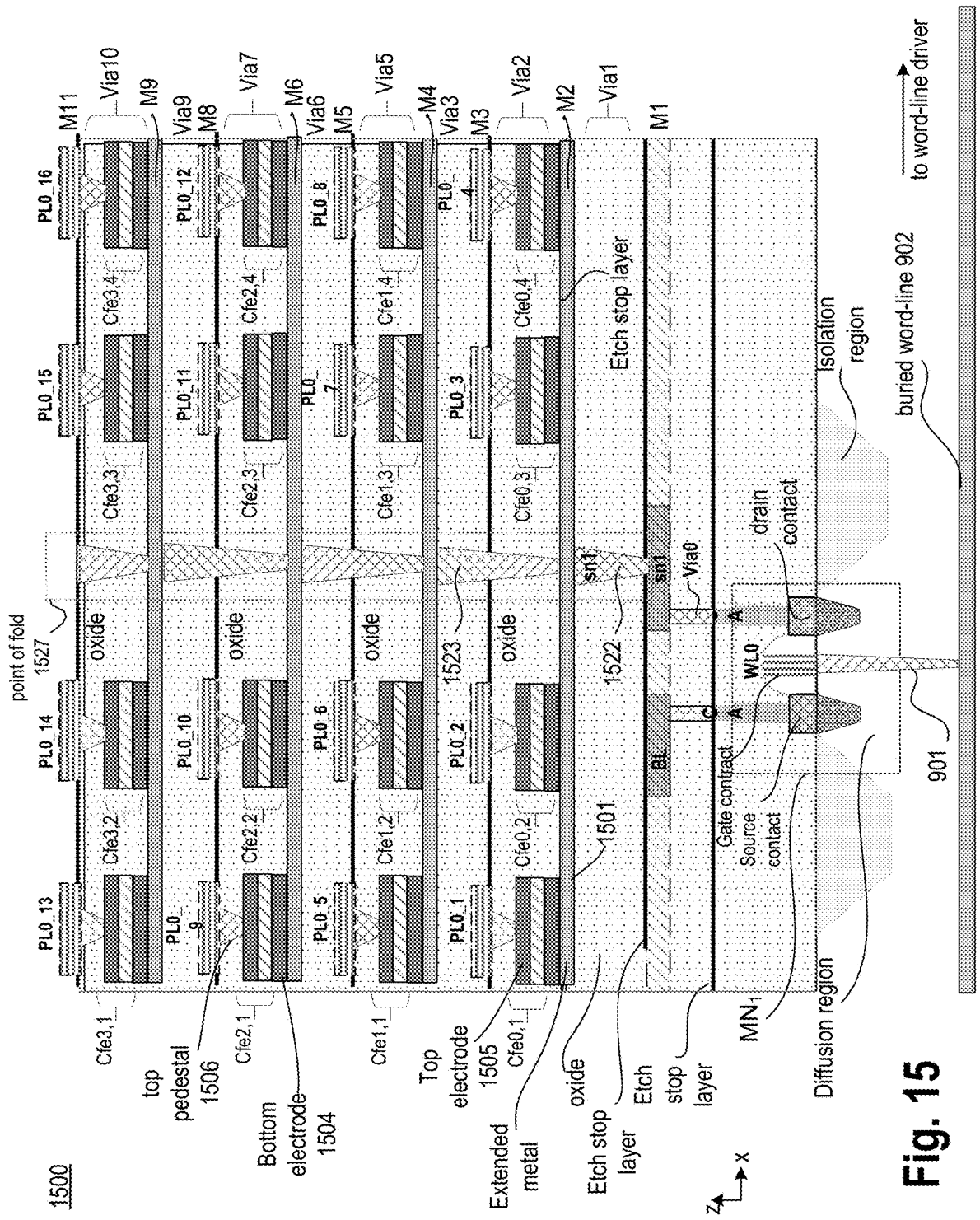
FIG. 15 illustrates a cross-section of a memory bit-cell with folded and stacked capacitors or memory elements, and with buried word-line, in accordance with some embodiments.

FIG. 15 illustrates a cross-section of a memory bit-cell 1500 with folded and stacked capacitors or memory elements, in accordance with some embodiments. In this example, the memory bit-cell comprises one transistor $MN_1$ having a gate terminal controllable by WL0. The source and drain terminals or contacts of the transistor are coupled to respective contacts (CA). Etch stop layer is used in the fabrication of vias (via0) to connect one of the source or drain contacts of the transistor to the storage node sn1 on metal-1 (M1) layer, and another one of the source or drain contacts of the transistor to BL on M1 layer. In some embodiments, another etch stop layer is formed over the M1 layer to fabricate vias (via1) to couple to respective M1 layers.

In this example, the 1TnC memory bit-cell has 16 capacitors. However, any number of capacitors may be used for the 1TnC memory bit-cell. An individual capacitor has a shared bottom electrode 1501 which is coupled to storage node sn1 1522 and top electrode 1505 which is coupled to a respective plate-line. In some embodiments, instead of or in addition to shared bottom electrode 1501, an individual capacitor may include a bottom electrode 1504. In some embodiments, top electrode 1505 is coupled to the plate-line via pedestal 1506. In the stack and fold configuration, the N number of capacitors can be divided into L number of stack layers such that there are N/L capacitors in each cap layer. In this example, 16 capacitors (Cfe0,1, Cfe0,2, Cfe0,3, Cfe0,4, Cfe1,1, Cfe1, 2, Cfe1,3, Cfe1,4, Cfe2,1, Cfe2,2, Cfe2,3, Cfe2,4, Cfe3,1, Cfe3,2, Cfe3,3, and Cfe3,4) are divided in four number of stacked layers such that there are 16/4 capacitors in each stacked layer. Each capacitor has a first terminal coupled to a common node sn1 1522, and a second terminal coupled to a respective plate-line. In various embodiments, common node sn1 1522 thus becomes a point of fold 1527.

In the various embodiments, the planar capacitors are illustrated with three layers-top electrode, dielectric, and bottom electrode. While capacitors can be formed like that, the illustrative capacitor can include any of the planar capacitor configurations discussed herein. For example, the planar capacitors can be any one of the capacitors of FIGS. 4A-B or memory elements described with reference to FIG. 13.

Referring to FIG. 15, in some embodiments, the capacitors are positioned symmetrically relative to point of fold 1527, common node sn1. In one example, an equal number of capacitors are positioned on either sides of the common node sn1 and in the stack. In some embodiments, the capacitors are not positioned symmetrically relative to the point of fold. For example, there may be more capacitors on one side of the storage node sn1 relative to another side. Further, each layer may also have a symmetric or non-symmetric arrangement of the capacitors. In some embodiments, the capacitors are spaced substantially at equal lateral (horizontal x-plane) distance L1. In some embodiments, the capacitors are separated by non-equal lateral distance.

In a stacked-only configuration, the capacitors would be vertically stacked resulting in a tall memory cell. In that case, depending on the process technology node, the number of capacitors may be limited by the number of metal layers available by the process technology node. In the stack and fold configuration, the capacitors are vertically stacked as well as horizontally placed by sharing a common electrode, which in turn couples to a shared node (e.g., storage node sn1). So, first terminals of the capacitors are coupled to the shared node sn1.

In some embodiments, in the first row, the second terminal of Cfe0,1 is coupled to plate-line PL0_1, the second terminal of Cfe0,2 is coupled to plate-line PL0_2, the second terminal of Cfe0,3 is coupled to plate-line PL0_3, and the second terminal of Cfe0,4 is coupled to plate-line PL0_4. In some embodiments, in the second row, the second terminal of Cfe1,1 is coupled to plate-line PL0_5, the second terminal of Cfe1,2 is coupled to plate-line PL0_6, the second terminal of Cfe1,3 is coupled to plate-line PL0_7, and the second terminal of Cfe1,4 is coupled to plate-line PL0_8. In some embodiments, in the third row, the second terminal of Cfe2,1 is coupled to plate-line PL0_9, the second terminal of Cfe2,2 is coupled to plate-line PL0_10, the second terminal of Cfe2,3 is coupled to plate-line PL0_11, and the second terminal of Cfe2,4 is coupled to plate-line PL0_12. In some embodiments, in the fourth row, the second terminal of Cfe3,1 is coupled to plate-line PL0_13, the second terminal of Cfe3,2 is coupled to plate-line PL0_14, the second terminal of Cfe3,3 is coupled to plate-line PL0_15, and the second terminal of Cfe3,4 is coupled to plate-line PL0_16.

In some embodiments, an individual capacitor structure includes shared bottom electrode 1501 which couples to the capacitors of that row and to the common node sn1 1522. In some embodiments, multiple vias are used for common node sn1 to connect the common node sn1 on M1 to shared bottom electrode 1501. In some examples, multiple vias are used for storage node sn1 to couple to shared bottom electrode 1501 to reduce reliability issues like electromigration. In some embodiments, a vertical tower of vias and metal layers are used to extend the storage node sn1 to higher levels along the vertical direction.

In some embodiments, shared bottom electrode 1501 (or the extended bottom electrode) can be a metal electrode or a first conductive oxide, or a combination of a second conductive oxide and a barrier or insulative material, in accordance with some embodiments. The barrier material or insulative material can be according to any one of the insulative materials discussed herein. In some embodiments, shared bottom electrode 1501 comprises a reflective inter-metallic material. By using a shared bottom electrode, fabrication steps for fabricating each capacitor are reduced. Further, the vertical height is also reduced for the memory bit-cell. In some embodiments, the shared bottom electrode 1501 is in direct contact with the ferroelectric material or the memory material. In some embodiments, shared bottom electrode 1501 is indirectly coupled to the ferroelectric material or the memory material.

In some embodiments, a metal layer is formed over top electrode of each capacitor to connect to a respective input. In some embodiments, a pedestal is formed between the top electrode and the metal layer connected to the respective input. For example, metal layer over a pedestal which is adjacent to the top electrode of capacitor Cfe0,1 is connected to plate-line PL0_1. Metal layer over a pedestal which is adjacent to the top electrode of capacitor Cfe1,1 is connected to plate-line PL0_5 and so on. In some embodiments, the pedestals have a barrier material on their side walls as discussed with reference to FIG. 4C.

Referring to FIG. 15, the metal layers coupled to the bottom electrodes of the capacitors are coupled to storage node sn1 through respective vias. In some embodiments, multiple vias connect the bottom extended electrode of each capacitor stack. These multiple vias are connected to the storage node sn1. The multiple vias, connected to the metal layer (e.g., M3) for sn1 as the storage node, connect to the extended bottom electrode of higher capacitors in the stack. In some embodiments, vias 1523 are misaligned. In some embodiments, vias 1523 are aligned. Here, the term "misaligned" generally refers to vias or pedestals that are not continuous in their vertical extension and have side branches as the vias couple to metal layers and other vias to extend vertically up. Conversely, the term "aligned" here generally refers to vias or pedestals that are continuous in their vertical extension. The term continuous here generally means that the via or pedestal extends without interruption. In some examples, the term continuous also refers to the extension of via or pedestal with nominal interruption (such as an intervening metal layer) but the subsequent via or pedestal on the metal layer is along the same vertical line of extension as the via below the metal line.

In some embodiments, metal-2 (M2) is deposited over vias (via1). Layer M2 is then polished. In some embodiments, capacitors can be moved further up in the stack, where the capacitor level processing is done between different layers. In some embodiments, oxide is deposited over the etch stop layer. Thereafter, dry, or wet etching is performed to form holes for pedestals. The holes are filled with metal, and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching take place to form the stack of layers for the planar capacitor. In some embodiments, the capacitors are formed in a backend of the die. In some embodiments, deposition of ILD is followed by surface polish.

In some embodiments, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to plate-lines and storage node sn1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, the process of depositing metal over the vias (via2), depositing ILD, etching holes to form pedestals for the next capacitors of the stack, forming the capacitors, and then forming vias that contact the M3 layer, are repeated. This process is repeated to form various capacitors in the stack.

In some embodiments, the top electrode of each capacitor is allowed to directly contact the metal above. For example, the pedestals that connect to the top electrodes are removed. In this embodiment, the height of the stacked capacitors is lowered, and the fabrication process is simplified because the extra steps for forming the pedestals are removed.

In some embodiments, WL0 coupled to the gate of transistor MN1 is connected to buried via 901. The connection may be direct on top of the metal gate of the gate of transistor MN1, in accordance with some embodiments. In some embodiments, buried via 901 is a through-silicon-via or a copper pillar which rises through a substrate region under transistor $MN_1$ and then takes a jog (e.g., an L-shaped jog) and connects to the gate of transistor MN1. As such, one end of buried via 901 is connected to the gate of the transistor MN1. The other end of buried via 901 rests on buried WL 902 which extends orthogonal to buried via 901. In various embodiments, buried WL 902 is connected to higher-level WL (e.g., WL0) though buried via 903. In various embodiments, buried via 903 is a through-silicon-via or a copper pillar which rises through the substrate, ILD (e.g., oxide) and other layers to connect to the higher-level WL. By using buried WL 902, connection to high-level WL 805 can be made without WL strapping cells.

Figure 16:
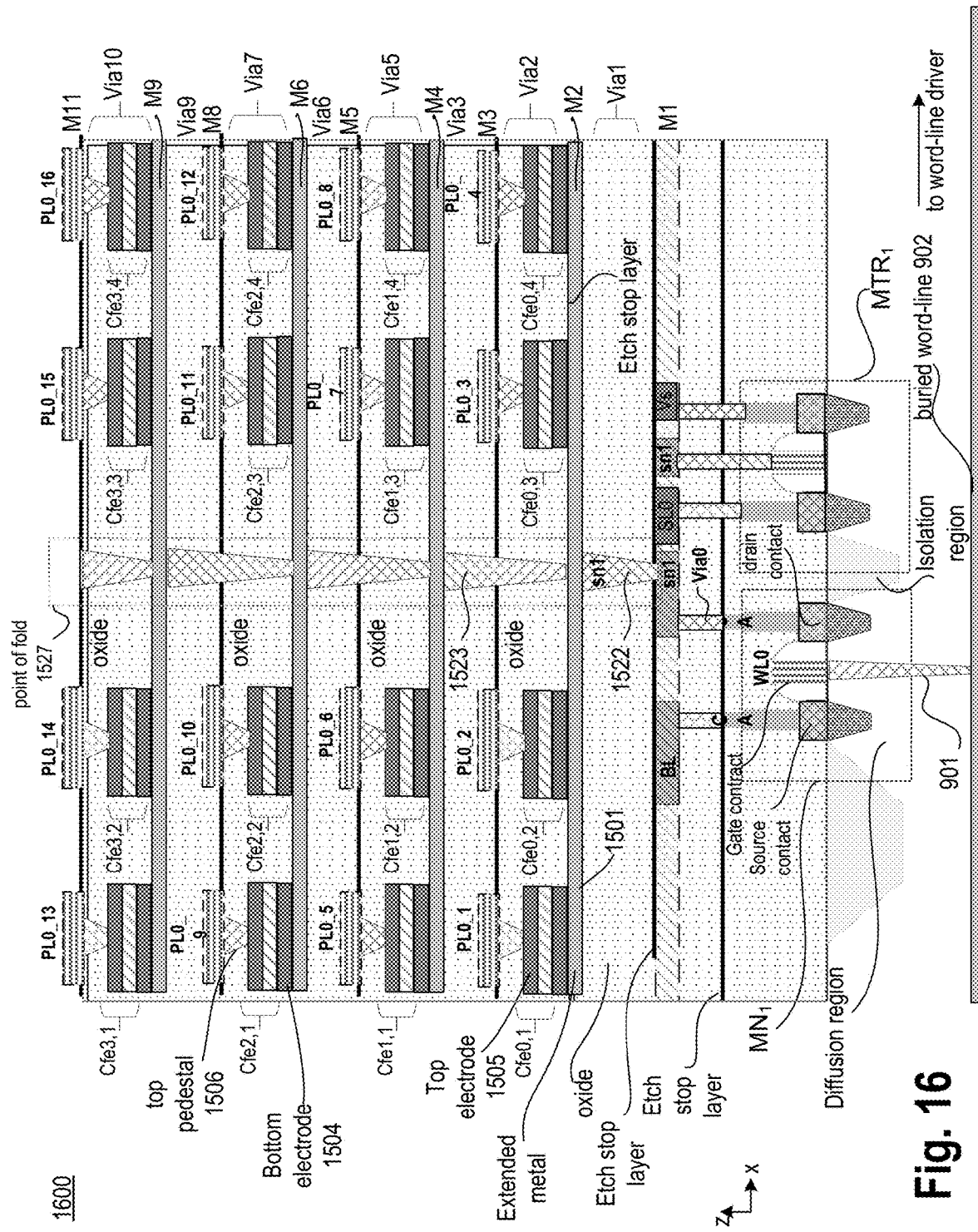
FIG. 16 illustrates a cross-section of a multi-element memory bit-cell with folded and stacked capacitors or memory elements and buried word-line, in accordance with some embodiments.

FIG. 16 illustrates a cross-section of a multi-element memory bit-cell 1600 with folded and stacked capacitors or memory elements and buried word-line, in accordance with some embodiments. FIG. 16 is similar to FIG. 15 but for an additional transistor MTR1 and its nodes to form a multi-element memory bit cell (e.g., one of those described with reference to FIGS. 11A-B and FIGS. 14A-B). Buried word-line can be used with any suitable memory architecture where the memory element (e.g., capacitor, resistive device, magnetic device, tunneling junction, etc.) are fabricated in the backend-of-line (BOEL) of a die, in accordance with some embodiments.

Figure 17:
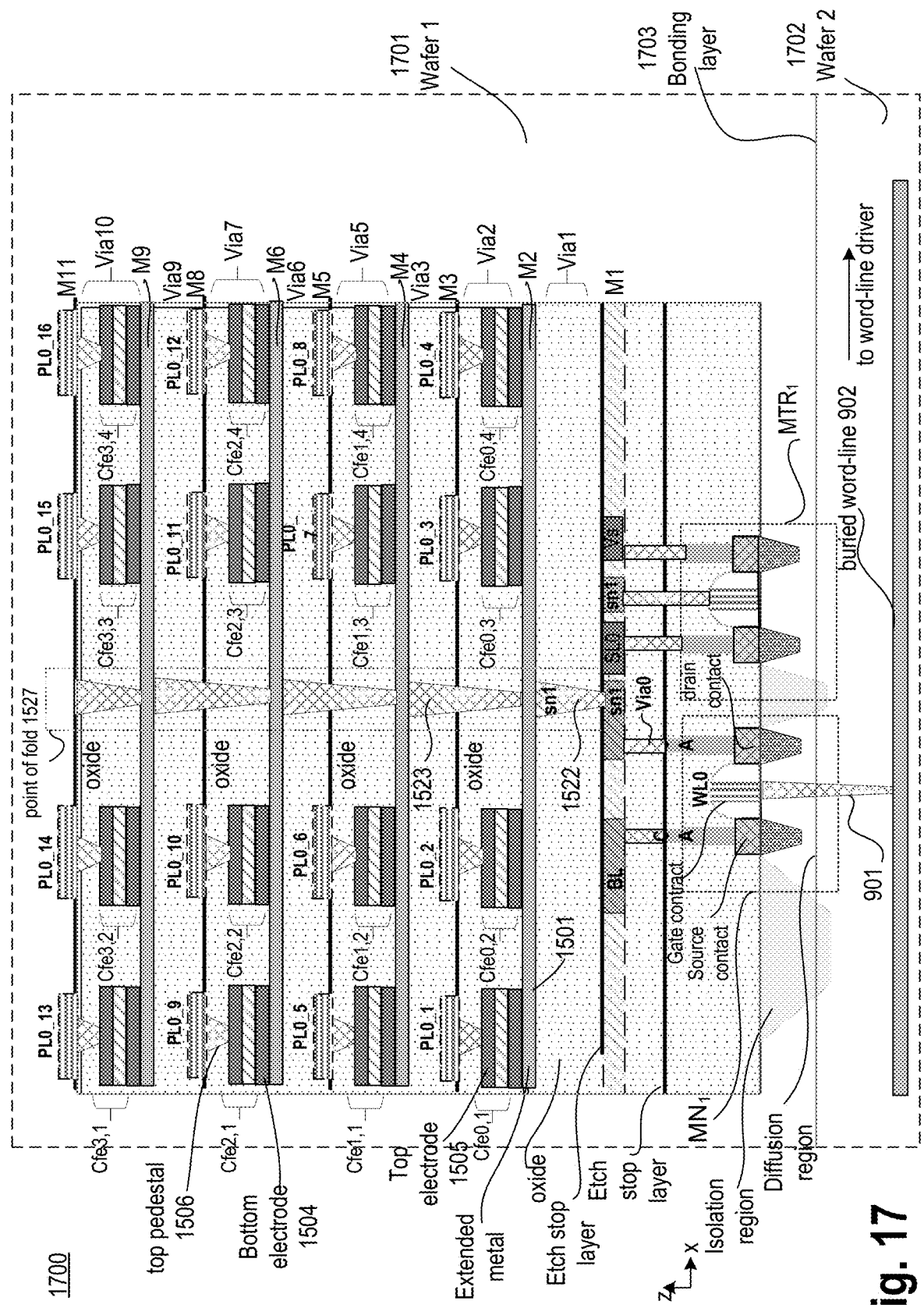
FIG. 17 illustrates a cross-section of a memory bit-cell with folded and stacked capacitors or memory elements and buried word-line formed in a wafer bonded to a wafer having an active transistor of the memory bit-cell, in accordance with some embodiments.

FIG. 17 illustrates a cross-section of a memory bit-cell 1700 with folded and stacked capacitors or memory elements and buried word-line formed in a wafer bonded to a wafer having an active transistor of the memory bit-cell, in accordance with some embodiments. In some embodiments, most of memory bit-cell 1700 is fabricated in a first wafer 1701. This includes the transistors (e.g., $MN_1$ and $MTR_1$), stacked and folded capacitors or memory elements and layers above them. In some embodiments, buried WL 902 is fabricated in a second wafer 1702. In some embodiments, first wafer 1701 and second wafer 1702 include portions of buried via 901 and buried WL 902 that are aligned to their respective portions when first wafer 1701 is coupled with second wafer 1702. In some embodiments, the die of first wafer 1701 is coupled to a die of second wafer 1702 through a bonding material 1703. In some embodiments, bonding material 1703 includes conductive material at places where the portions buried via 901 of the die of first wafer 1701 and the die of second wafer 1702 are aligned. As such, a complete conductive path is formed through both portions of the buried via 901. In some embodiments, bonding material 1703 includes conductive material at places where the portions of buried via 903 of the die of first wafer 1701 and the die of second wafer 1702 are aligned. As such, a complete conductive path is formed through both portions of buried via 903. Bonding material 1703 can be a low temperature (e.g., less than 190 Celsius) metal alloy bond, glass frit bond, anodic bond, Au—Au thermo-compression bond, silicon bond, or polymer bond.

Figure 18:
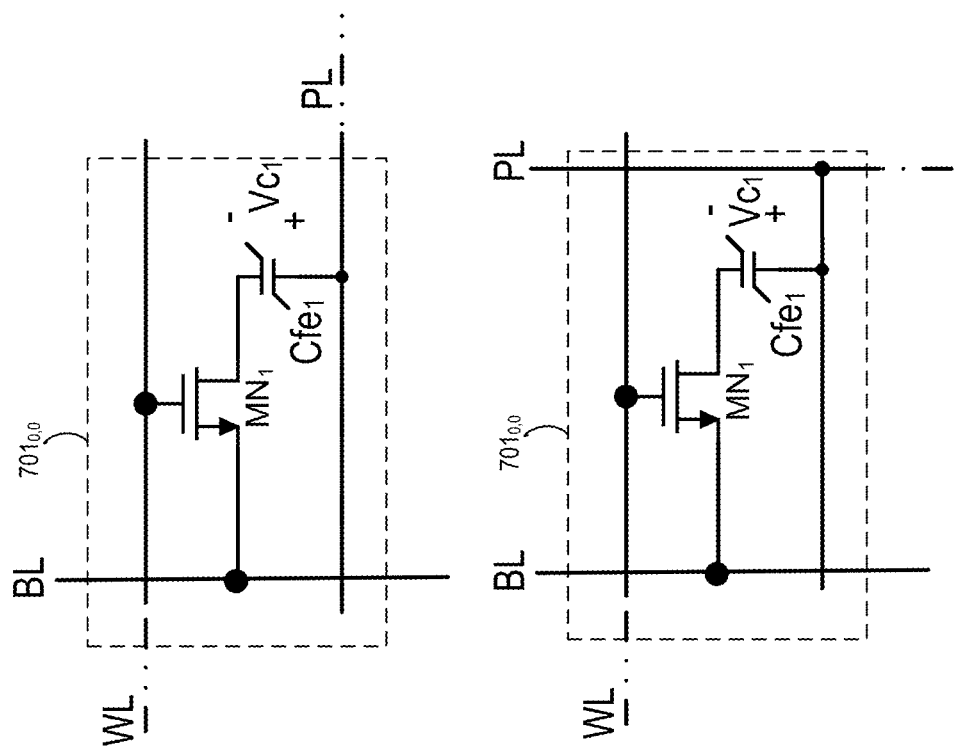
FIG. 18 illustrates a 1T1C bit-cell with buried word-line, in accordance with some embodiments.

While the embodiments are described with reference to 1TnC, 1TnME, or multi-element gain bit-cells, the embodiments are applicable to the simpler bit-cell cells such as 1T1C bit-cell. One such example is illustrated by FIG. 18. FIG. 18 illustrates a 1T1C bit-cell 1800 with buried word-line. In some embodiments, bit-cell $701_{0,0}$ comprises a word-line (WL), a plate-line (PL), a bit-line (BL), an access transistor $MN_1$, and FE capacitive structure Cfe. The gate of transistor $MN_1$ is coupled to a common WL. In various embodiments, one terminal of the FE capacitive structure $Cfe_1$ is coupled to a PL. The second terminal of the FE capacitive structure is coupled to the source or the drain terminal of the transistor $MN_1$. In various embodiments, BL is coupled to the source or drain terminal of first transistor $MN_1$. In some embodiments, the PL is parallel to the WL and orthogonal to the BL as illustrated by the bit-cell on the top. In some embodiments, the PL is parallel to the BL and orthogonal to the WL as illustrated by the bit-cell on the bottom. The ferroelectric material of capacitor Cfe can be replaced with other non-linear polar materials. In some embodiments, capacitor Cfe is replaced by a memory element (ME). The embodiments of FIGS. 15 and 17 that describe the various configurations of buried word-lines are also applicable to 1T1C bit-cell based memory arrays.

Figure 19:
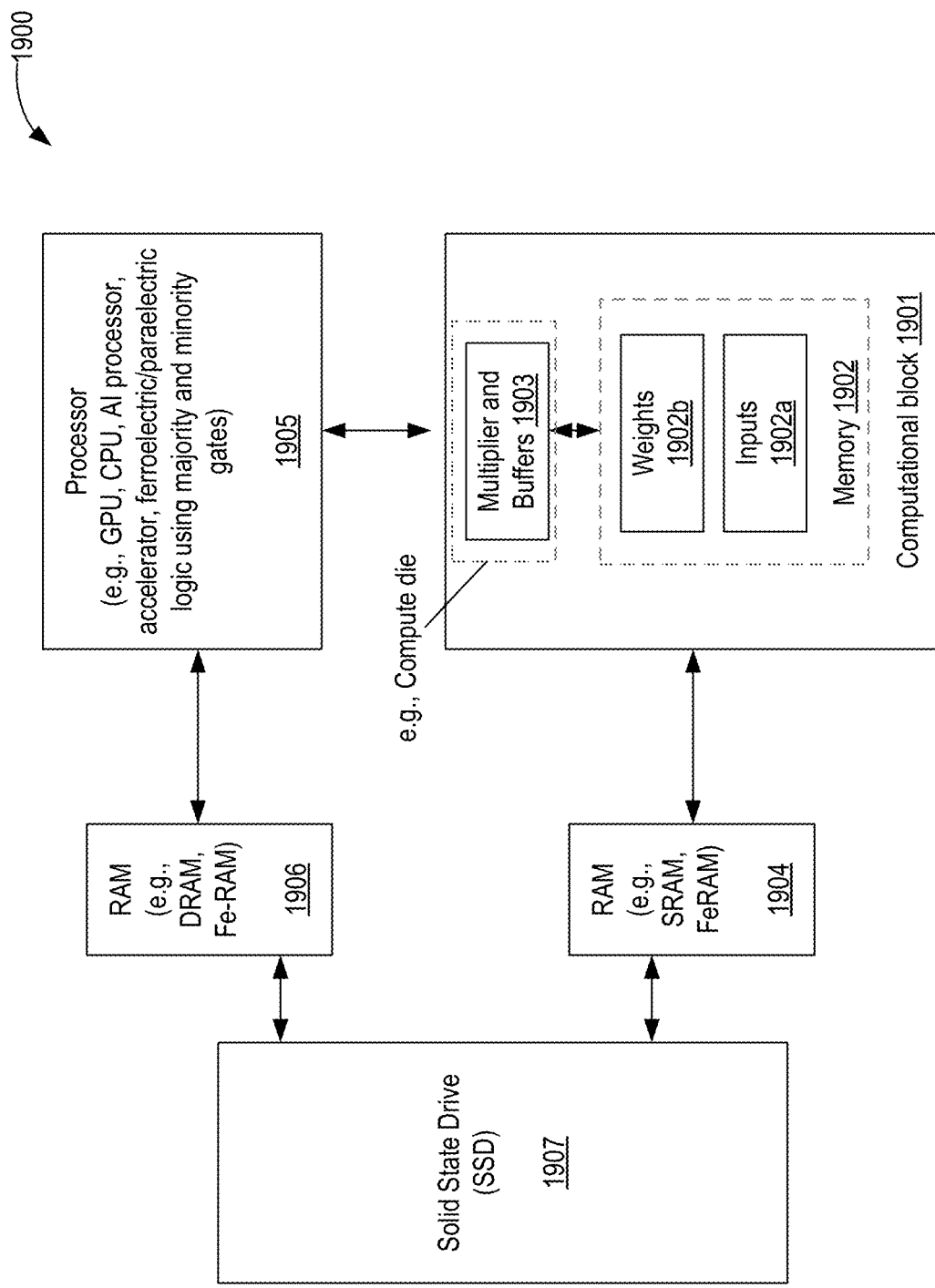
FIG. 19 illustrates a high-level architecture of an artificial intelligence (AI) machine comprising a compute die stacked over a memory die, where the memory die includes memory arrays, where the memory array has buried word-lines, in accordance with some embodiments.

FIG. 19 illustrates a high-level architecture of an artificial intelligence (AI) machine comprising a compute die stacked over a memory die, where the memory die includes memory arrays, where the memory array has buried word-lines, in accordance with some embodiments.

AI machine 1900 comprises computational block 1901 or processor having random-access memory (RAM) 1902 and multiplier and buffers 1903; random-access memory 1904 (e.g., static RAM (SRAM), ferroelectric or paraelectric RAM (FeRAM), ferroelectric or paraelectric static random-access memory (FeSRAM)), processor 1905, random-access memory 1906 (dynamic RAM (DRAM), FeRAM), and solid-state memory or drive (SSD) 1907. In some embodiments, some, or all components of AI machine 1900 are packaged in a single package forming a system-on-chip (SoC). The SoC can be configured as a logic-on-logic configuration, which can be in a 3D configuration or a 2.5D configuration.

In some embodiments, computational block 1901 is packaged in a single package and then coupled to processor 1905 and memories 1904, 1906, and 1907 on a printed circuit board (PCB). In some embodiments, computational block 1901 is configured as a logic-on-logic configuration, which can be in a 3D configuration or a 2.5D configuration. In some embodiments, computational block 1901 comprises a special purpose compute die or microprocessor which includes multiplier and buffers 1903. For example, multiplier and buffers 1903 (part of a compute die) is a compute chiplet that performs a function of an accelerator or inference. In some embodiments, RAM 1902 is DRAM which forms a special memory/cache for the special purpose compute die. The DRAM can be embedded DRAM (eDRAM) such as 1T1C (one transistor and one capacitor) based memories. In some embodiments, RAM 1902 is ferroelectric or paraelectric RAM (Fe-RAM).

In some embodiments, the compute die is specialized for applications such as Artificial Intelligence, graph processing, and algorithms for data processing. In some embodiments, the compute die further has logic computational blocks, for example, for multiplier and buffers 1903, a special data memory block (e.g., buffers) comprising DRAM, FeRAM, or a combination of them. In some embodiments, RAM 1902 has weights and inputs stored to improve the computational efficiency. The interconnects between processor 1905 (also referred to as special purpose processor), RAM 1904 and the compute die are optimized for high bandwidth and low latency. The architecture of FIG. 19 allows efficient packaging to lower the energy, power, or cost and provides for ultra-high bandwidth between RAM 1904 and the compute die of computational block 1901.

In some embodiments, RAM 1902 is partitioned to store input data 1902a (or data to be processed) and weight factors 1902b. In some embodiments, input data 1902a is stored in a separate memory (e.g., a separate memory die) and weight factors 1902b are stored in a separate memory (e.g., separate memory die).

In some embodiments, the computational logic or compute die or chiplet comprises matrix multiplier, adder, concatenation logic, multiplier and buffers 1903, and combinational logic. In various embodiments, the compute chiplet performs multiplication operation on input data 1902a and weight factors 1902b. In some embodiments, weight factors 1902b are fixed weights. For example, processor 1905 (e.g., a graphics processor unit (GPU)), field programmable grid array (FPGA) processor, application specific integrated circuit (ASIC) processor, digital signal processor (DSP), AI processor, central processing unit (CPU), or any other high-performance processor) computes the weights for a training model. Once the weights are computed, they are stored in RAM 1902. In various embodiments, the input data that is to be analyzed using a trained model is processed by computational block 1901 with weight factors 1902b (e.g., computed weight factors) to generate an output (e.g., a classification result).

In some embodiments, RAM 1904 is ferroelectric or paraelectric based SRAM. For example, a six transistor (6T) SRAM bit-cells having ferroelectric or paraelectric transistors are used to implement a non-volatile FeSRAM. In some embodiments, SSD 1907 comprises NAND flash cells. In some embodiments, SSD 1907 comprises NOR flash cells. In some embodiments, SSD 1907 comprises multi-threshold NAND flash cells.

In various embodiments, the non-volatility of FeRAM is used to introduce new features such as security, functional safety, and faster reboot time of AI machine 1900. The non-volatile FeRAM is a low power RAM that provides fast access to data and weights. RAM 1904 (e.g., FeRAM) can also serve as a fast storage for computational block 1901 (which can be an inference die or an accelerator), which typically has low capacity and fast access requirements.

In various embodiments, FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the nonlinear polar materials described herein.

Figure 20:
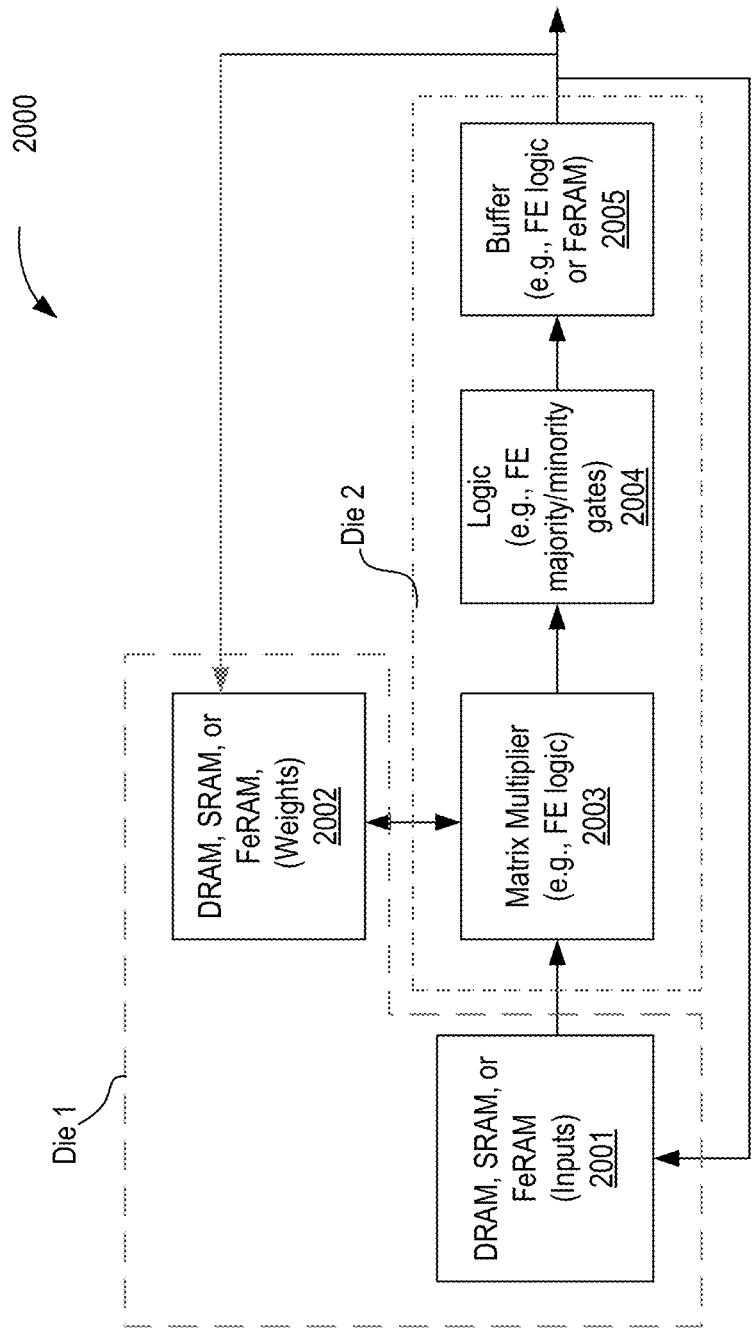
FIG. 20 illustrates an architecture of a computational block comprising a compute die stacked with a memory die, wherein the memory die includes memory arrays, where the memory arrays have buried word-lines, in accordance with some embodiments.

FIG. 20 illustrates an architecture of computational block 2000 comprising a compute die stacked with a memory die, wherein the memory die includes memory arrays, where the memory arrays have buried word-lines, in accordance with some embodiments. The architecture of FIG. 20 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first partition 2001 to store input data and a second partition 2002 to store weight factors. In some embodiments, the memory die is a single die that is partitioned such that first partition 2001 of the memory die is used to store input data and second partition 2002 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, first partition 2001 and second partition 2002 (which can be separate dies) include one or more of: DRAM, FE-SRAM, FE-DRAM, SRAM, and/or MRAM. In some embodiments, the input data stored in first partition 2001 is the data to be analyzed by a trained model with fixed weights stored in second partition 2002 or the second die (Die 2).

In some embodiments, the compute die comprises ferroelectric or paraelectric logic (e.g., majority, minority, and/or threshold gates) to implement matrix multiplier 2003, logic 2004, and temporary buffer 2005. Matrix multiplier 2003 performs multiplication operation on input data 'X' and weights 'W' to generate an output 'Y'. This output may be further processed by logic 2004. In some embodiments, logic 2004 performs a threshold operation, pooling and drop out operations, and/or concatenation operations to complete the Al logic primitive functions.

In some embodiments, the output of logic 2004 (e.g., processed output 'Y') is temporarily stored in temporary buffer 2005. In some embodiments, temporary buffer 2005 is memory such as one or more of: DRAM, Fe-SRAM, Fe-DRAM, MRAM, resistive RAM (Re-RAM) and/or SRAM. In some embodiments, temporary buffer 2005 is part of the memory die (e.g., Die 1). In some embodiments, temporary buffer 2005 performs the function of a re-timer. In some embodiments, the output of temporary buffer 2005 (e.g., processed output 'Y') is used to modify the weights in second partition 2002 or the second die (e.g., Die 2). In one such embodiment, computational block 2000 not only operates as an inference circuitry, but also as a training circuitry to train a model. In some embodiments, matrix multiplier 2003 includes an array of multiplier cells, wherein first partition 2001 (e.g., DRAM) and second partition 2002 (e.g., DRAM) include arrays of memory bit-cells, respectively, wherein each multiplier cell is coupled to a corresponding DRAM bit-cell of first partition 2001 and/or DRAM bit-cell of second partition 2002. In some embodiments, computational block 2000 comprises an interconnect fabric coupled to the array of multiplier cells such that each multiplier cell is coupled to the interconnect fabric.

Computational block 2000 provides reduced memory access for the compute die (e.g., die 2) by providing data locality for weights, inputs, and outputs. In one example, data from and to the AI computational blocks (e.g., matrix multiplier 2003) is locally processed within a same packaging unit. Computational block 2000 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 21:
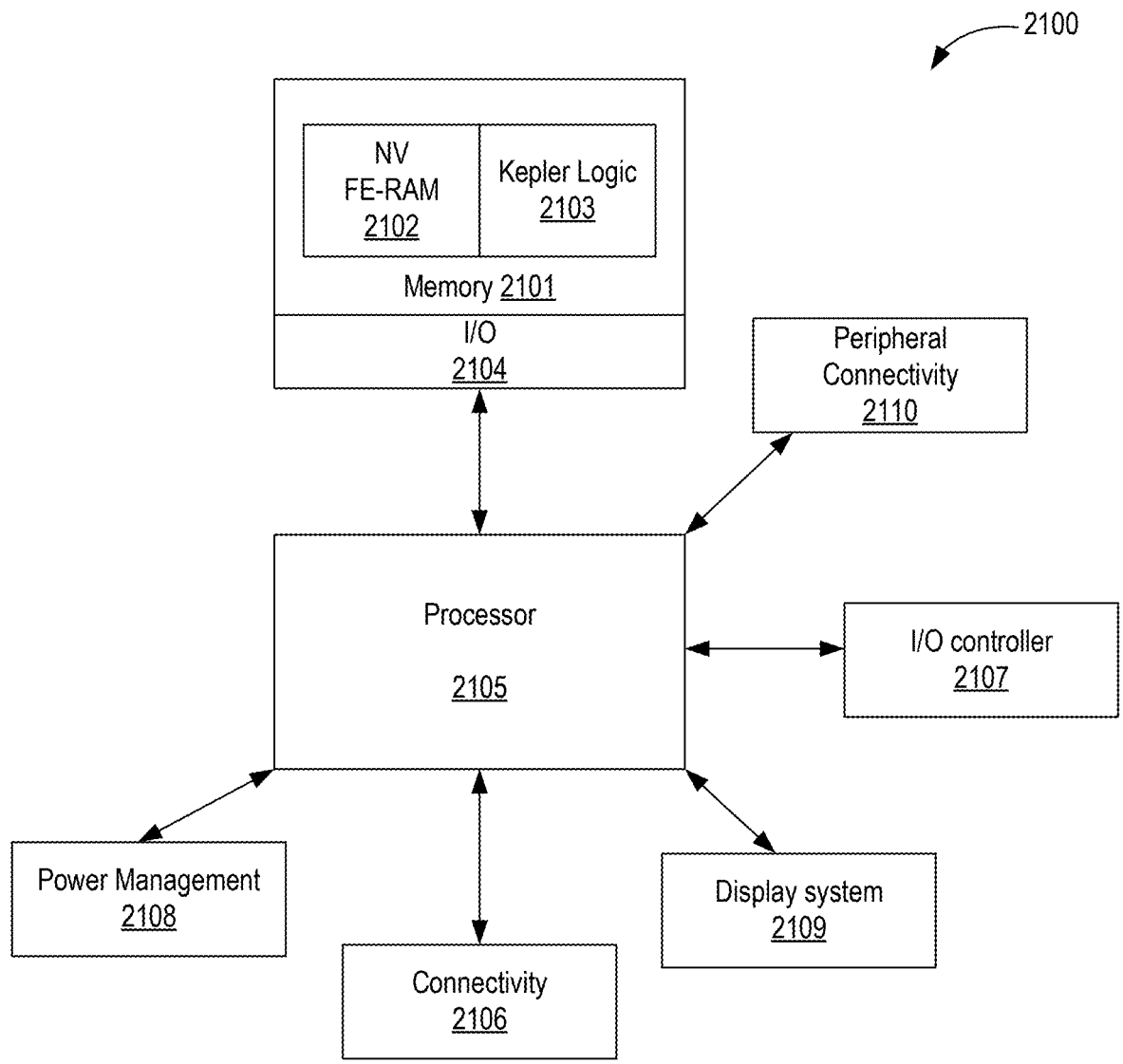
FIG. 21 illustrates a system-on-chip (SOC) that uses memory arrays, where the memory arrays have buried word-lines, in accordance with some embodiments.

FIG. 21 illustrates a system-on-chip (SOC) that uses memory arrays, where the memory arrays have buried word-lines, in accordance with some embodiments. SoC 2100 comprises memory 2101 having static random-access memory (SRAM) or FE based random-access memory FE-RAM, or any other suitable memory. The memory can be non-volatile (NV) or volatile memory. Memory 2101 may also comprise logic 2103 to control memory 2102. For example, write and read drivers are part of logic 2103. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 2104. The interface may be a double-data rate (DDR) compliant interface or any other suitable interface to communicate with a processor. Processor 2105 of SoC 2100 can be a single core or multiple core processor. Processor 2105 can be a general-purpose processor (CPU), a digital signal processor (DSP), or an Application Specific Integrated Circuit (ASIC) processor. In some embodiments, processor 2105 is an artificial intelligence (AI) processor (e.g., a dedicated AI processor, a graphics processor configured as an AI processor). In various embodiments, processor 2105 executes instructions that are stored in memory 2101.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the Al processor has reduced latency of computing the training model and using the training model, which reduces the power consumption of such AI processor systems.

Processor 2105 may be coupled to a number of other chiplets that can be on the same die as SoC 2100 or on separate dies. These chiplets include connectivity circuitry 2106, I/O controller 2107, power management 2108, and display system 2109, and connectivity circuitry 2106.

Connectivity circuitry 2106 represents hardware devices and software components for communicating with other devices. Connectivity circuitry 2106 may support various connectivity circuitries and standards. For example, connectivity circuitry 2106 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity circuitry 2106 may support non-cellular standards such as WiFi.

I/O controller 2107 represents hardware devices and software components related to interaction with a user. I/O controller 2107 is operable to manage hardware that is part of an audio subsystem and/or display subsystem. For example, input through a microphone or other audio device can provide input or commands for one or more applications or functions of SoC 2100. In some embodiments, I/O controller 2107 illustrates a connection point for additional devices that connect to SoC 2100 through which a user might interact with the system. For example, devices that can be attached to the SoC 2100 might include microphone devices, speaker or stereo systems, video systems or other display devices, keyboard or keypad devices, or other I/O devices for use with specific applications such as card readers or other devices.

Power management 2108 represents hardware or software that performs power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2108 may accordingly put such logic into low power state without the worry of losing data. Power management may select a power state according to Advanced Configuration and Power Interface (ACPI) specification for one or all components of SoC 2100.

Display system 2109 represents hardware (e.g., display devices) and software (e.g., drivers) components that provide a visual and/or tactile display for a user to interact with the processor 2105. In some embodiments, display system 2109 includes a touch screen (or touch pad) device that provides both output and input to a user. Display system 2109 may include a display interface, which includes the particular screen or hardware device used to provide a display to a user. In some embodiments, the display interface includes logic separate from processor 2105 to perform at least some processing related to the display.

Peripheral connectivity 2110 may represent hardware devices and/or software devices for connecting to peripheral devices such as printers, chargers, cameras, etc. In some embodiments, peripheral connectivity 2110 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 2100 includes a coherent cache or memory-side buffer chiplet (not shown) which include ferroelectric or paraelectric memory. The coherent cache or memory-side buffer chiplet can be coupled to processor 2105 and/or memory 2101 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Here, the term "stack and fold" generally refers to a configuration of devices that are stacked vertically (substantially directly above or with a horizontal offset) such that one terminal of the devices is shared to a common node, and further the capacitors are placed along both sides of the common node. The common node thus becomes a point of fold. In various embodiments, the devices here are capacitors. The embodiments are not limited to capacitors and are applicable to any devices with a common node. In some embodiments, N number of capacitors can be divided in L number of stack layers such that there are N/L capacitors in each stacked layer. The N/L capacitor's one terminal can be shorted together with an electrode (e.g., bottom electrode). In some embodiments, the electrode can be metal, a conducting oxide, or a combination of a conducting oxide and a barrier (or insulative material).

In some embodiments, the capacitors are stacked and folded, and also vertically offset relative to lower capacitors in the stack. The offset allows for routing metal electrodes coupled to the top electrodes of the capacitors through space created by the offset while reducing parasitic to the capacitor(s) underneath. As such, the various metal electrodes are parallel to one another with limited jogs, for example.

In some embodiments, the capacitors are staggered while sharing a same bottom electrode or shared metal layer. The capacitors are staggered by having offsets in the x-direction and a y-direction relative to one another. The offsets allow for routing metal electrodes coupled to the top electrodes of the capacitors through space created by the offset. As such, the various metal electrodes are parallel to one another with limited jogs, for example. The various embodiments here can be combined with other embodiments. Hence, all possible permutations of combinations are not shown, but are within the scope of this disclosure.

Here the term "staggered configuration" or "staggered" generally refers to placement of devices (e.g., capacitors) relative to one another such that the devices are offset from one another in a horizontal plane and/or a vertical plane. When devices are offset in a horizontal plane, the devices may be diagonally away from one another (e.g., having an x-offset and a y-offset in a x-y horizontal plane). When devices are offset in a vertical plane, the devices may be diagonally away from one another (e.g., having an x-offset and a z-offset in a x-z vertical plane). In some examples, the devices can be staggered both horizontally and vertically. In some examples, the devices are staggered horizontally. In some embodiments, the devices are staggered vertically.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method(s) of forming those structures or apparatuses, and method(s) of operation of these structures or apparatuses. Following examples are provided that illustrate the various embodiments. The examples can be combined with other examples. As such, various embodiments can be combined with other embodiments without changing the scope of the invention.

Example 1: An apparatus comprising: a plurality of bit-cells organized in a row or column, wherein an individual bit-cell of the plurality of bit-cells includes an access transistor and a plurality of capacitors; and a word-line positioned under the access transistor, wherein the access transistor is controllable by the word-line, wherein the plurality of capacitors is positioned above the access transistor.

Example 2: The apparatus of example 1, wherein the individual bit-cell has an individual boundary which substantially abuts a neighboring bit-cell in the row or column such that there is no dummy bit-cell between individual bit-cell and the neighboring bit-cell.

Example 3: The apparatus of example 1, wherein each of the plurality of bit-cells have no dummy bit-cell between individual bit-cells of the plurality of bit-cells.

Example 4: The apparatus of example 1, wherein the individual bit-cell has an individual boundary which substantially abuts a neighboring bit-cell in the row or column such that there is no gap area between individual bit-cell and the neighboring bit-cell to strap the word-line.

Example 5: The apparatus of example 1, wherein the word-line is routed from under the access transistor towards a word-line driver.

Example 6: The apparatus of example 1, wherein the word-line is a first word-line, wherein the apparatus comprises a via to couple the first word-line to a second word-line, wherein the second word-line is positioned on a layer over the access transistor.

Example 7: The apparatus of example 6, wherein the via is positioned in a strap cell.

Example 8: The apparatus of example 6, wherein the via is positioned in a boundary of the individual bit-cell.

Example 9: The apparatus of example 1, wherein: the access transistor includes a gate terminal coupled to the word-line, a source terminal coupled to an individual bit-line, and a drain terminal coupled to a storage node; and the plurality of capacitors has a first terminal coupled to the storage node, wherein a second terminal of an individual capacitor of the plurality of capacitors is coupled to an individual plate-line.

Example 10: The apparatus of example 9, wherein the plurality of capacitors are planar capacitors that are arranged in a stacked and folded configuration.

Example 11: The apparatus of example 1, wherein: the access transistor is a first transistor; the first transistor has a first gate terminal coupled to the word-line, a first source terminal couple to an individual bit-line, and a first drain terminal coupled to a storage node; the individual bit-cell comprises a second transistor coupled to the first transistor, wherein the second transistor includes a second gate terminal coupled to the storage node, a second source terminal couple to a sense line, and a second drain terminal coupled to a bias; and the plurality of capacitors has a first terminal coupled to the storage node, wherein a second terminal of an individual capacitor of the plurality of capacitors is coupled to an individual plate-line.

Example 12: The apparatus of example 11, wherein the plurality of capacitors are planar capacitors that are arranged in a stacked and folded configuration.

Example 13: The apparatus of example 11, wherein an individual capacitor of the plurality of capacitors includes a non-linear polar material.

Example 14: The apparatus of example 13, wherein the non-linear polar material includes one of: bismuth ferrite (BFO) with a first doping material, wherein the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides as Hf(1-x)ExOy, where E can be Al, Ca, Ce, Dy, Er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; an improper ferroelectric which includes one of: [PTO/STO]n or [LAO/STO]n, where 'n' is between 1 to 100; or SrTiO3, Ba(x)Sr(y)TiO3, HfZrO2, Hf—Si—O, La-substituted PbTiO3, or PMN-PT based relaxor ferroelectrics.

Example 15: The apparatus of example 14, wherein the non-linear polar material includes one of: ferroelectric material, paraelectric material, or non-linear dielectric.

Example 16: The apparatus of example 1, wherein the individual bit-cell is one of: a one-transistor with one-capacitor based bit-cell, a one-transistor with one-memory-element based bit-cell, a one-transistor with multiple capacitors based bit-cell, a one-transistor multiple multi-elements based bit-cell, multiple transistors with multiple capacitors based bit-cell, or multiple transistors with multiple memory-elements based bit-cell.

Example 17: An apparatus comprising: a plurality of bit-cells organized in a row or a column, wherein an individual boundary of an individual bit-cell of the plurality of bit-cells substantially abuts a neighboring boundary of another individual bit-cell of the plurality of bit-cells such that there is no dummy bit-cell between the plurality of bit-cells; and a word-line positioned under an active region of the individual bit-cell, wherein the word-line is coupled to the individual bit-cell.

Example 18: The apparatus of example 17, wherein the neighboring boundary includes a neighboring bit-cell, wherein the individual boundary substantially abuts the neighboring bit-cell in the row or the column such that there is no gap area between individual bit-cell and the neighboring bit-cell to strap the word-line.

Example 19: The apparatus of example 17, wherein the individual bit-cell comprises: an access transistor which includes a gate terminal coupled to the word-line, a source terminal coupled to an individual bit-line, and a drain terminal coupled to a storage node, wherein the word-line is routed under the access transistor; and a plurality of capacitors having a first terminal coupled to the storage node, wherein a second terminal of an individual capacitor of the plurality of capacitors is coupled to an individual plate-line.

Example 20: The apparatus of example 19, wherein the plurality of capacitors are planar capacitors that are arranged in a stacked and folded configuration.

Example 21: A system comprising: a memory to store instructions; a processor circuitry to execute instructions; and a communication interface to allow the processor circuitry to communicate with another device, wherein the memory includes: a plurality of bit-cells organized in a row or column, wherein an individual bit-cell of the plurality of bit-cells includes an access transistor and a plurality of capacitors; and a word-line positioned under the access transistor, wherein the access transistor is controllable by the word-line, wherein the plurality of capacitors is positioned above the access transistor.

Example 1a: An apparatus comprising: a first die comprising a plurality of bit-cells organized in a row or column, wherein an individual bit-cell of the plurality of bit-cells includes an access transistor and a plurality of capacitors; and a second die which is coupled to the first die, wherein the second die comprises a word-line positioned under the access transistor, wherein the access transistor is controllable by the word-line, wherein the plurality of capacitors is positioned above the access transistor.

Example 2a: The apparatus of example 1a, wherein the first die is coupled to the second die via a bonding material.

Example 3a: The apparatus of example 2a, wherein the bonding material includes conductive material for a via to couple the word-line positioned under the access transistor.

Example 4a: The apparatus of example 1a, wherein the individual bit-cell has an individual boundary which substantially abuts a neighboring bit-cell in the row or column such that there is no dummy bit-cell between individual bit-cell and the neighboring bit-cell.

Example 5a: The apparatus of example 1a, wherein each of the plurality of bit-cells have no dummy bit-cell between individual bit-cells of the plurality of bit-cells.

Example 6a: The apparatus of example 1a, wherein the individual bit-cell has an individual boundary which substantially abuts a neighboring bit-cell in the row or column such that there is no gap area between individual bit-cell and the neighboring bit-cell to strap the word-line.

Example 7a: The apparatus of example 1a, wherein the word-line is routed from under the access transistor towards a word-line driver, wherein the metal layer is in the first die.

Example 8a: The apparatus of example 1a, wherein the word-line is a first word-line, wherein the apparatus comprises a via to couple the first word-line to a second word-line, wherein the second word-line is positioned on a layer over the access transistor, wherein the second word-line is in the first die.

Example 9a: The apparatus of example 8a, wherein the via is positioned in a strap cell.

Example 10a: The apparatus of example 8a, wherein the via is positioned in a boundary of the individual bit-cell.

Example 11a: The apparatus of example 1a, wherein: the access transistor includes a gate terminal coupled to the word-line, a source terminal coupled to an individual bit-line, and a drain terminal coupled to a storage node; and the plurality of capacitors has a first terminal coupled to the storage node, wherein a second terminal of an individual capacitor of the plurality of capacitors is coupled to an individual plate-line.

Example 12a: The apparatus of example 11a, wherein the plurality of capacitors are planar capacitors that are arranged in a stacked and folded configuration.

Example 13a: The apparatus of example 1a, wherein: the access transistor is a first transistor; the first transistor has a first gate terminal coupled to the word-line, a first source terminal couple to an individual bit-line, and a first drain terminal coupled to a storage node; the individual bit-cell comprises a second transistor coupled to the first transistor, wherein the second transistor includes a second gate terminal coupled to the storage node, a second source terminal couple to a sense line, and a second drain terminal coupled to a bias; and the plurality of capacitors has a first terminal coupled to the storage node, wherein a second terminal of an individual capacitor of the plurality of capacitors is coupled to an individual plate-line.

Example 14a: The apparatus of example 13a, wherein the plurality of capacitors are planar capacitors that are arranged in a stacked and folded configuration.

Example 15a: The apparatus of example 13a, wherein an individual capacitor of the plurality of capacitors includes a non-linear polar material.

Example 16a: The apparatus of example 15a, wherein the non-linear polar material includes one of: ferroelectric material, paraelectric material, or non-linear dielectric.

Example 17a: An apparatus comprising: a first die comprising a plurality of bit-cells organized in a row or a column, wherein an individual boundary of an individual bit-cell of the plurality of bit-cells substantially abuts a neighboring boundary of another individual bit-cell of the plurality of bit-cells such that there is no dummy bit-cell between the plurality of bit-cells; and a second die coupled to the first die, wherein the second die includes a word-line positioned under an active region of the individual bit-cell, wherein the word-line is coupled to the individual bit-cell.

Example 18a: The apparatus of example 17a, wherein the neighboring boundary includes a neighboring bit-cell, wherein the individual boundary substantially abuts the neighboring bit-cell in the row or the column such that there is no gap area between individual bit-cell and the neighboring bit-cell to strap the word-line.

Example 19a: The apparatus of example 17a, wherein the individual bit-cell includes a plurality of capacitors that are planar capacitors which are arranged in a stacked and folded configuration.

Example 20a: A system comprising: a memory to store instructions; a processor circuitry to execute instructions; and a communication interface to allow the processor circuitry to communicate with another device, wherein the memory includes: a first die comprising a plurality of bit-cells organized in a row or column, wherein an individual bit-cell of the plurality of bit-cells includes an access transistor and a plurality of capacitors; and a second die which is coupled to the first die, wherein the second die comprises a word-line positioned under the access transistor, wherein the access transistor is controllable by the word-line, wherein the plurality of capacitors is positioned above the access transistor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a plurality of bit-cells organized in a row or column, wherein an individual bit-cell of the plurality of bit-cells includes an access transistor and a plurality of capacitors; and
    a word-line positioned under the access transistor, wherein the access transistor is controllable by the word-line, and wherein the plurality of capacitors is positioned above the access transistor.

2. The apparatus of claim 1, wherein the individual bit-cell has an individual boundary which substantially abuts a neighboring bit-cell in the row or column such that there is no dummy bit-cell between the individual bit-cell and the neighboring bit-cell.

3. The apparatus of claim 1, wherein each of the plurality of bit-cells have no dummy bit-cell between the individual bit-cells of the plurality of bit-cells.

4. The apparatus of claim 1, wherein the individual bit-cell has an individual boundary which substantially abuts a neighboring bit-cell in the row or column such that there is no gap area between the individual bit-cell and the neighboring bit-cell to strap the word-line.

5. The apparatus of claim 1, wherein the word-line is routed from under the access transistor towards a word-line driver.

6. The apparatus of claim 1, wherein the word-line is a first word-line, wherein the apparatus comprises a via to couple the first word-line to a second word-line, and wherein the second word-line is positioned on a layer over the access transistor.

7. The apparatus of claim 6, wherein the via is positioned in a strap cell.

8. The apparatus of claim 6, wherein the via is positioned in a boundary of the individual bit-cell.

9. The apparatus of claim 1, wherein:
    the access transistor includes a gate terminal coupled to the word-line, a source terminal coupled to an individual bit-line, and a drain terminal coupled to a storage node; and
    the plurality of capacitors has a first terminal coupled to the storage node, wherein a second terminal of an individual capacitor of the plurality of capacitors is coupled to an individual plate-line.

10. The apparatus of claim 9, wherein the plurality of capacitors are planar capacitors that are arranged in a stacked and folded configuration.

11. The apparatus of claim 1, wherein:
    the access transistor is a first transistor;
    the first transistor has a first gate terminal coupled to the word-line, a first source terminal couple to an individual bit-line, and a first drain terminal coupled to a storage node;
    the individual bit-cell comprises a second transistor coupled to the first transistor, wherein the second transistor includes a second gate terminal coupled to the storage node, a second source terminal couple to a sense line, and a second drain terminal coupled to a bias; and
    the plurality of capacitors has a first terminal coupled to the storage node, wherein a second terminal of an individual capacitor of the plurality of capacitors is coupled to an individual plate-line.

12. The apparatus of claim 11, wherein the plurality of capacitors are planar capacitors that are arranged in a stacked and folded configuration.

13. The apparatus of claim 11, wherein the individual capacitor of the plurality of capacitors includes a non-linear polar material.

14. The apparatus of claim 13, wherein the non-linear polar material includes one of:
    bismuth ferrite (BFO) with a first doping material, wherein the first doping material is one of: lanthanum or elements from lanthanide series of periodic table;
    lead zirconium titanate (PZT) or PZT with a second doping material, wherein the second doping material is one of La or Nb;
    a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
    a perovskite which includes one of: $BaTiO_3$, $PbTiO_3$, $KNbO_3$, or NaTaO3;
    a hexagonal ferroelectric which includes one of: $YMnO_3$ or $LuFeO_3$;
    hexagonal ferroelectrics of a type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
    hafnium (Hf), zirconium (Zr), aluminum (Al), silicon (Si), their oxides, or their alloyed oxides;
    hafnium oxides as $Hf_{(1-x)}E_xO_y$, where E includes one of Al, Ca, Ce, Dy, Er, Gd, Ge, La, Sc, Si, Sr, Sn, or Y, where x and y are first and second fractions respectively;
    $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where x and y are third and fourth fractions, respectively;
    y doped $HfO_2$, where y includes one of: Al, Ca, Ce, Dy, Er, Gd, Ge, La, Sc, Si, Sr, Sn, or Y;
    niobate type compounds $LiNbO_3$, $LiTaO_3$, lithium iron tantalum oxy fluoride, barium strontium niobate, sodium barium niobate, or potassium strontium niobate;
    an improper ferroelectric which includes one of: [PTO/STO]n or [LAO/STO]n, where 'n' is between 1 and 100; or
    $SrTiO_3$, $Ba_{(x)}Sr_{(y)}TiO_3$, $HfZrO_2$, Hf—Si—O, La-substituted PbTiO3, or PMN-PT based relaxor ferroelectrics.

15. The apparatus of claim 14, wherein the non-linear polar material includes one of: ferroelectric material, paraelectric material, or non-linear dielectric.

16. The apparatus of claim 1, wherein the individual bit-cell is one of: a one-transistor with one-capacitor based bit-cell, a one-transistor with one-memory-element based bit-cell, a one-transistor with multiple capacitors based bit-cell, a one-transistor multiple multi-elements based bit-cell, multiple transistors with multiple capacitors based bit-cell, or multiple transistors with multiple memory-elements based bit-cell.

17. An apparatus comprising:
a plurality of bit-cells organized in a row or a column, wherein an individual boundary of an individual bit-cell of the plurality of bit-cells substantially abuts a neighboring boundary of another individual bit-cell of the plurality of bit-cells such that there is no dummy bit-cell between the plurality of bit-cells; and
a word-line positioned under an active region and a gate of the individual bit-cell, wherein the word-line is coupled to the individual bit-cell.

18. The apparatus of claim 17, wherein the neighboring boundary includes a neighboring bit-cell, wherein the individual boundary substantially abuts the neighboring bit-cell in the row or the column such that there is no gap area between individual bit-cell and the neighboring bit-cell to strap the word-line.

19. The apparatus of claim 17, wherein the individual bit-cell comprises:
an access transistor which includes a gate terminal coupled to the word-line, a source terminal coupled to an individual bit-line, and a drain terminal coupled to a storage node, wherein the word-line is routed under the access transistor; and
a plurality of capacitors having a first terminal coupled to the storage node, wherein a second terminal of an individual capacitor of the plurality of capacitors is coupled to an individual plate-line.

20. The apparatus of claim 19, wherein the plurality of capacitors are planar capacitors that are arranged in a stacked and folded configuration.

21. A system comprising:
a memory to store instructions;
a processor circuitry to execute the instructions; and
a communication interface to allow the processor circuitry to communicate with another device, wherein the memory includes:
a plurality of bit-cells organized in a row or column, wherein an individual bit-cell of the plurality of bit-cells includes an access transistor and a plurality of capacitors; and
a word-line positioned under the access transistor, wherein the access transistor is controllable by the word-line, and wherein the plurality of capacitors is positioned above the access transistor.

* * * * *